United States Patent
Northcott et al.

(10) Patent No.: US 8,972,824 B1
(45) Date of Patent: Mar. 3, 2015

(54) SYSTEMS AND METHODS FOR TRANSPARENTLY VARYING ERROR CORRECTION CODE STRENGTH IN A FLASH DRIVE

(75) Inventors: Philip L. Northcott, Coquitlam (CA); Peter Dau Geiger, Granite Bay, CA (US); Jonathan Sadowsky, West Sacramento, CA (US)

(73) Assignee: PMC-Sierra, Inc., Sunnyvale, CA (US)

( * ) Notice: Subject to any disclaimer, the term of this patent is extended or adjusted under 35 U.S.C. 154(b) by 245 days.

(21) Appl. No.: 13/477,599

(22) Filed: May 22, 2012

(51) Int. Cl.
*G11C 29/42* (2006.01)
*G11C 29/54* (2006.01)

(52) U.S. Cl.
USPC .......................... 714/773; 714/718

(58) Field of Classification Search
CPC ............ G06F 11/1068; G06F 11/1076; G06F 11/1008; H03M 13/116; H03M 13/09; H03M 13/05; H04L 1/0045; G11B 20/18
USPC .................. 714/773, 764, 763, 758, 752, 746
See application file for complete search history.

(56) References Cited

U.S. PATENT DOCUMENTS

| | | | |
|---|---|---|---|
| 4,112,502 A | 9/1978 | Scheuneman | |
| 5,404,485 A | 4/1995 | Ban | |
| 5,592,497 A | 1/1997 | Lokhoff | |
| 5,942,004 A | 8/1999 | Cappelletti | |
| 5,956,743 A | 9/1999 | Bruce et al. | |
| 5,974,544 A | 10/1999 | Jeffries | |
| 6,023,781 A | 2/2000 | Hazama | |
| 6,279,133 B1 | 8/2001 | Vafai et al. | |
| 6,279,830 B1 | 8/2001 | Ishibashi | |
| 6,574,774 B1 | 6/2003 | Vasiliev | |
| 6,591,394 B2 | 7/2003 | Lee et al. | |
| 6,628,723 B1 | 9/2003 | Gerlach et al. | |
| 6,651,212 B1 * | 11/2003 | Katayama et al. | 714/763 |
| 6,675,318 B1 | 1/2004 | Lee | |
| 6,731,538 B2 | 5/2004 | Noda et al. | |
| 6,732,322 B1 | 5/2004 | Miyauchi et al. | |
| 6,732,325 B1 | 5/2004 | Tash et al. | |
| 6,751,766 B2 * | 6/2004 | Guterman et al. | 714/736 |
| 6,839,870 B2 | 1/2005 | Fanfelle | |
| 6,871,303 B2 | 3/2005 | Halter | |
| 6,895,543 B2 | 5/2005 | Hazama | |
| 7,061,804 B2 | 6/2006 | Chun et al. | |
| 7,184,356 B2 | 2/2007 | Noguchi et al. | |
| 7,389,465 B2 | 6/2008 | Radke et al. | |

(Continued)

FOREIGN PATENT DOCUMENTS

| | | |
|---|---|---|
| JP | 2000149592 | 5/2000 |
| KR | 100766042 | 10/2007 |

(Continued)

OTHER PUBLICATIONS

USPTO; Office Action dated Jul. 24, 2013, from related application U.S. Appl. No. 13/477,635 (filed May 22, 2012).

(Continued)

*Primary Examiner* — April Y Blair
*Assistant Examiner* — Dipakkumar Gandhi
(74) *Attorney, Agent, or Firm* — Knobbe Martens Olson & Bear LLP

(57) ABSTRACT

Apparatus and methods provide relatively low uncorrectable bit error rates, low write amplification, long life, fast and efficient retrieval, and efficient storage density such that a solid-state drive (SSD) can be implemented using relatively inexpensive MLC Flash for an enterprise storage application.

9 Claims, 16 Drawing Sheets

(56) References Cited

U.S. PATENT DOCUMENTS

| | | | |
|---|---|---|---|
| 7,415,651 B2 | 8/2008 | Argon | |
| 7,451,383 B2 | 11/2008 | Kim et al. | |
| 7,478,314 B1 | 1/2009 | Cheong et al. | |
| 7,643,342 B2 | 1/2010 | Litsyn et al. | |
| 7,739,576 B2* | 6/2010 | Radke | 714/758 |
| 7,783,955 B2 | 8/2010 | Murin | |
| 7,809,900 B2 | 10/2010 | Danilak | |
| 7,844,879 B2 | 11/2010 | Ramamoorthy et al. | |
| 7,860,200 B2 | 12/2010 | Furman et al. | |
| 7,904,619 B2 | 3/2011 | Danilak | |
| 7,904,672 B2 | 3/2011 | Danilak | |
| 7,904,780 B2 | 3/2011 | Brandman | |
| 7,944,748 B2 | 5/2011 | Eggleston et al. | |
| 7,962,831 B2 | 6/2011 | Park et al. | |
| 8,046,542 B2 | 10/2011 | Radke | |
| 8,051,358 B2 | 11/2011 | Radke | |
| 8,065,583 B2 | 11/2011 | Radke | |
| 8,090,980 B2 | 1/2012 | Danilak | |
| 8,145,855 B2 | 3/2012 | Wan et al. | |
| 8,335,951 B2 | 12/2012 | Becker et al. | |
| 8,347,138 B2 | 1/2013 | Moshayedi | |
| 8,392,791 B2 | 3/2013 | Saliba et al. | |
| 8,433,979 B2 | 4/2013 | Blaum et al. | |
| 8,495,465 B1 | 7/2013 | Anholt et al. | |
| 8,560,881 B2 | 10/2013 | Frost et al. | |
| 8,612,680 B1 | 12/2013 | Madnani et al. | |
| 8,621,318 B1 | 12/2013 | Micheloni et al. | |
| 2002/0120820 A1 | 8/2002 | Higuchi et al. | |
| 2002/0159285 A1 | 10/2002 | Morley et al. | |
| 2003/0088821 A1 | 5/2003 | Yokokawa et al. | |
| 2003/0112879 A1 | 6/2003 | Antia et al. | |
| 2003/0156454 A1 | 8/2003 | Wei et al. | |
| 2004/0268065 A1 | 12/2004 | Hilton et al. | |
| 2005/0114587 A1 | 5/2005 | Chou et al. | |
| 2006/0221752 A1 | 10/2006 | Fasoli et al. | |
| 2007/0061689 A1 | 3/2007 | Park et al. | |
| 2007/0124647 A1 | 5/2007 | Chen et al. | |
| 2007/0171714 A1 | 7/2007 | Wu et al. | |
| 2007/0171730 A1 | 7/2007 | Ramamoorthy et al. | |
| 2007/0233752 A1 | 10/2007 | Bangalore et al. | |
| 2007/0266295 A1 | 11/2007 | Conley | |
| 2007/0266296 A1 | 11/2007 | Conley | |
| 2007/0277066 A1 | 11/2007 | Gajapathy et al. | |
| 2008/0010582 A1 | 1/2008 | Nieto et al. | |
| 2008/0034272 A1 | 2/2008 | Wu et al. | |
| 2008/0137414 A1 | 6/2008 | Park et al. | |
| 2008/0163023 A1 | 7/2008 | Hong et al. | |
| 2008/0168319 A1 | 7/2008 | Lee et al. | |
| 2008/0172589 A1 | 7/2008 | Gallezot et al. | |
| 2008/0294960 A1 | 11/2008 | Sharon et al. | |
| 2008/0320361 A1 | 12/2008 | Fukuda et al. | |
| 2008/0320373 A1 | 12/2008 | Kim et al. | |
| 2009/0013233 A1 | 1/2009 | Radke | |
| 2009/0013234 A1 | 1/2009 | Radke | |
| 2009/0037627 A1 | 2/2009 | Rofougaran | |
| 2009/0070651 A1 | 3/2009 | Diggs et al. | |
| 2009/0100307 A1 | 4/2009 | Lee | |
| 2009/0132889 A1 | 5/2009 | Radke | |
| 2009/0164836 A1 | 6/2009 | Carmichael | |
| 2009/0182939 A1 | 7/2009 | Hluchyj et al. | |
| 2009/0327589 A1 | 12/2009 | Moshayedi | |
| 2009/0327840 A1 | 12/2009 | Moshayedi | |
| 2010/0008214 A1 | 1/2010 | Siaud et al. | |
| 2010/0023800 A1 | 1/2010 | Harari et al. | |
| 2010/0115376 A1 | 5/2010 | Shalvi et al. | |
| 2010/0199153 A1 | 8/2010 | Okamura et al. | |
| 2010/0281341 A1 | 11/2010 | Wu et al. | |
| 2010/0332894 A1 | 12/2010 | Bowers et al. | |
| 2010/0332922 A1 | 12/2010 | Chang et al. | |
| 2011/0019475 A1 | 1/2011 | Moshayedi | |
| 2011/0029716 A1 | 2/2011 | Moshayedi | |
| 2011/0038203 A1 | 2/2011 | Camp et al. | |
| 2011/0040926 A1* | 2/2011 | Frost et al. | 711/103 |
| 2011/0060969 A1 | 3/2011 | Ramamoorthy et al. | |
| 2011/0167199 A1 | 7/2011 | Danilak | |
| 2011/0167319 A1 | 7/2011 | Jeddeloh | |
| 2011/0213920 A1 | 9/2011 | Frost et al. | |
| 2012/0072680 A1* | 3/2012 | Kimura et al. | 711/154 |
| 2012/0089767 A1 | 4/2012 | Lee et al. | |
| 2012/0260146 A1 | 10/2012 | Lee et al. | |
| 2012/0311406 A1 | 12/2012 | Ratnam et al. | |
| 2013/0060565 A1 | 3/2013 | Nair et al. | |
| 2013/0073895 A1 | 3/2013 | Cohen | |
| 2013/0080862 A1 | 3/2013 | Bennett | |
| 2013/0151914 A1 | 6/2013 | Cadigan et al. | |
| 2013/0173955 A1 | 7/2013 | Hallak et al. | |
| 2013/0179754 A1 | 7/2013 | Cherubini et al. | |
| 2013/0246891 A1 | 9/2013 | Manning et al. | |

FOREIGN PATENT DOCUMENTS

| | | |
|---|---|---|
| WO | WO 2004062113 | 7/2004 |
| WO | WO 2006070668 | 7/2006 |
| WO | WO 2007084751 | 7/2007 |
| WO | WO 2012047500 A1 | 4/2012 |
| WO | WO 2012075200 A2 | 6/2012 |

OTHER PUBLICATIONS

USPTO; Office Action dated Jan. 2, 2014, from related application U.S. Appl. No. 13/477,600 (filed May 22, 2012).

USPTO; Office Action dated Dec. 31, 2013, from related application U.S. Appl. No. 13/477,598 (filed May 22, 2012).

USPTO; Office Action dated Jan. 15, 2014, from related application U.S. Appl. No. 13/477,568 (filed May 22, 2012).

USPTO; Office Action dated Jan. 21, 2014, from related application U.S. Appl. No. 13/477,633 (filed May 22, 2012).

Daneshgaran, et al.; "An extensive search for good punctured rate-k/(k+1) recursive convolutional codes for serially concatenated convolutional codes," Information Theory, IEEE Transactions on, vol. 50, No. 1, pp. 208-217, Jan. 2004.

Frenger, et al.; "Rate-compatible convolutional codes for multirate DS-CDMA systems," Communications, IEEE Transactions on, vol. 47, No. 6, pp. 828-836, Jun. 1999.

Intel Corporation; Understanding the Flash Translation Layer (FTL) Specification, Application Note AP-684; retrieved from the Internet <URL: http://staff.ustc.edu.cn/~jpq/paper/flash/2006-Intel%20TR-Understanding%20the%20flash%20translation%20layer%20%28-FTL%29%20specification.pdf>; Dec. 1998; retrieved Jan. 26, 2012; Intel Corporation.

Jim Handy; Does MLC Flash Belong in Enterprise SSDs; retrieved from the Internet <URL: http://www.infostor.com/index/articles/display/3214572139/articles/infostor/volume-14/issue-1/special-report/does-mlc_flash_belong.html>; Feb. 1, 2010; retrieved on Jan. 24, 2012.

Ohtsuki, T.; "Rate adaptive indoor infrared wireless communication systems using repeated and punctured convolutional codes," Communications, 1999. ICC '99. 1999 IEEE International Conference on, vol. 1, no., pp. 609-613 vol. 1, 1999.

Sandforce; Product Brief SF-1500 Enterprise SSD Processors; retrieved from the Internet <URL: http://www.sandforce.com/userfiles/file/downloads/LSI_SandForce_1500ENT_PB_120104.pdf>; 2012; retrieved Jan. 24, 2012; LSI Corporation; Milpitas, CA.

Sandforce; Product Brief SF-2500 & SF-2600 Enterprise SSD Processors; retrieved from the Internet <URL: http://www.sandforce.com/userfiles/file/downloads/LSI_SandForce_2500-2600ENT_PB_120104.pdf>; 2012; retrieved on Jan. 24, 2012; LSI Corporation; Milpitas, CA.

Sandforce; Raise Improves Total SSD Reliability; retrieved from the Internet <URL: http://sandforce.com/index.php?id=174&parentId=3>; 2012; retrieved on Jan. 24, 2012.

Sandforce; SandForce SSD Processors Transform Mainstream Data Storage; retrieved from the Internet <URL: http://www.sandforce.com/userfiles/file/downloads/SFI_Launch_PR_Final.pdf> Apr. 13, 2009; retrieved on Jan. 24, 2012; Saratoga, CA.

Zhou, et al.; "High rate turbo code using unevenly punctured convolutional constituent code,"Communications, 1999. APCC/OECC '99. Fifth Asia-Pacific Conference on . . . and Fourth Optoelectronics and Communications Conference, vol. 1, no., pp. 751-754 vol. 1, 1999.

(56) References Cited

OTHER PUBLICATIONS

STEC; Engineering MLC Flash-Based SSDs to Reduce Total Cost of Ownership in Enterprise SSD Deployments; retrieved from the Internet <URL: http://www.stec-inc.com/downloads/whitepapers/SAFE_WP.pdf>; 2011; STEC, Inc.; retrieved on Jan. 24, 2012.

STEC; STEC Secure Array of Flash Elements Technology Improves Reliability of Enterprise-Class SSDs; retrieved from the Internet <URL: http://www.stec-inc.com/downloads/whitepapers/SAFE_WP.pdf>; 2011; STEC, Inc.; retrieved on Jan. 24, 2012.

USPTO; Office Action dated May 7, 2014, from related U.S. Appl. No. 13/477,601 (filed May 22, 2012).

USPTO; Office Action dated May 27, 2014, from related U.S. Appl. No. 13/477,629 (filed May 22, 2012).

USPTO; Notice of Allowance dated Feb. 14, 2014, from related U.S. Appl. No. 13/477,595 (filed May 22, 2012).

USPTO; Notice of Allowance dated Mar. 4, 2014, from related U.S. Appl. No. 13/477,845 (filed May 22, 2012).

\* cited by examiner

SYSTEMS AND METHODS FOR TRANSPARENTLY VARYING ERROR CORRECTION CODE STRENGTH IN A FLASH DRIVE

CROSS-REFERENCE TO RELATED APPLICATION

Appendix A

Appendix A, which forms a part of this disclosure, is a list of commonly owned copending U.S. patent applications. Each one of the applications listed in Appendix A is hereby incorporated herein in its entirety by reference thereto.

BACKGROUND

1. Field of the Invention

Embodiments of the invention generally relate to electronics, and in particular, to flash drive memory controllers, such as to solid-state drive memory controllers.

2. Description of the Related Art

Flash memory is a form of non-volatile memory. A memory cell in flash memory can be a single-level cell (SLC), which encodes one bit of information per cell, or a multi-level cell (MLC), which encodes two or more bits of information per memory cell. Typically, a flash memory implementation using MLC is much cheaper than a flash memory implementation with SLC. Further, a flash memory device is arranged into pages and blocks. Data can be written to and read from flash memory in pages. A group of pages known as a block corresponds to the smallest erasable unit of flash memory.

Over time, programming and erasing flash memory causes a variety of defects that degrade the performance of the flash memory cell. In particular, MLC memory cells have much lower program/erase cycle lifetimes than SLC memory cells, which can be a problem in an enterprise application. This degradation, along with other noise effects, cause the signal-to-noise ratio of the memory cell to change over time. After the signal-to-noise ratio has fallen to a certain level, the flash memory device is typically no longer reliable. Manufacturers typically specify a number of program/erase cycles over which the properties of their flash devices are guaranteed.

As flash memory technologies become denser with decreasing process technology, the amount of charge stored on a floating gate of a memory cell tends to fall, crosstalk between cells tends to rise, insulation material between memory cells become thinner, and so on. Taken together, these effects tend to cause the signal-to-noise ratio of flash memory to decrease with each passing generation.

Flash memory devices require the use of a form of Error Correction Coding (ECC) to detect and correct the errors that inevitably occur. ECC, and in particular the ubiquitous Reed-Solomon or the Bose, Chaudhuri, and Hocquenghem (BCH) hard-decision codes, are widely used in electronics as a way of mitigating low signal-to-noise ratio in communications and storage media. With ECC, redundant information is stored or transmitted alongside the regular information bearing data, to permit an ECC decoder to deduce the originally transmitted or stored information even in the presence of errors.

A conventional approach to error management for MLC flash memories has been for the flash memory chip manufacturer to specify a particular strength of ECC code, typically a one-dimensional BCH code, capable of correcting a certain number of bits per certain size of sector, for example 24 bits per 1024 bytes. Examples of allocations of flash bytes in a typical flash page using vendor-specified BCH are shown in FIGS. 1A and 1B. FIG. 1A illustrates a standard layout for a page of flash memory. A region is provided for user data 101 or information data in the main area of the flash page, and a spare area 102 is provided to provide room for ECC parity and other data. In practice, the user data 103, metadata 104, such as data integrity feature (DIF) and Journaling Engine management data, and the manufacturer's recommended amount of ECC parity data 105 may be stored interleaved within the page as illustrated in FIG. 1B.

So long as the specified error correction is provided by the flash controller, the flash memory chip manufacturer guarantees a certain number of Program/Erase (P/E) cycles over which the flash memory chips will store and retain data, with no more errors than the ECC can correct, with a probability of uncorrectable errors occurring less than some acceptable risk for the end user. For example, consumer grade flash-based drives may tolerate a relatively high uncorrectable error rate. However, in an enterprise storage environment, a relatively low uncorrectable error rate is applicable, for example, $1 \times 10^{-16}$ (1E-16).

However, conventional approaches of applying ECC to flash memory can be inefficient at achieving relatively low uncorrectable error rates over the total service life and traffic loads that can be required in an enterprise storage environment, such as in a server.

SUMMARY

Disclosed techniques provide relatively low uncorrectable bit error rates for flash memory, low write amplification, long life, fast and efficient retrieval, and efficient storage density such that a solid-state drive (SSD) or flash drive can be implemented using relatively inexpensive MLC flash for an enterprise storage application.

In one embodiment, a three-dimensional turbo code, built out of three partially orthogonal ECC components is as follows. In a first dimension, a set of "primary" error correction codes, such as BCH codes, provides error correction for a flash page. In a second dimension, a set of "secondary" error correction codes, which are at least partly orthogonal to the primary codes, provides error correction for a "page stripe," which can be a group of pages that are associated by secondary error correction codes. A page stripe corresponds to a set of Ws flash pages (a page stripe of width Ws), wherein each page stripe includes one page on each of the Ws flash pages. Preferably, each flash page of a page stripe is from a different semiconductor die or different flash memory array. A value for the width Ws can vary in a very broad range. In one embodiment, the width Ws is 4, however, other applicable widths will be readily determined by one of ordinary skill in the art. For example, the value can be 2, 3, 5-8, or the like. In one embodiment, the Ws flash dice are arranged so that they can be efficiently accessed in parallel.

In a third dimension, a set of tertiary Reed-Solomon (RS) codes having codewords orthogonal to the codewords of both the primary code and secondary code, provides error correction for a "page grid," which can be a group of pages that are associated by tertiary error correction codes. A page grid corresponds to a set of Wg page stripes (a page grid of width Wg), wherein each page grid includes Wg page stripes with each page of the page grid preferably on different sets of flash dice or flash memory arrays, for a total of one flash page from each of the product of width Ws and width Wg flash dice. In one embodiment, the width Wg is 4, however, other applicable widths will be readily determined by one of ordinary skill in the art. For example, for the case in which each of the width Ws and the width Wg are 4, then there would be 16 flash pages in the page grid. The primary, secondary, and tertiary codes can be considered to be an outer code, a first inner code, and a second inner code, respectively.

In one embodiment, a journaling filing system or flash translation layer is used to reduce write amplification, thereby extending flash memory cell life. As or after the journaling file system receives data (information) for storage in flash memory cells, that data is used to calculate primary parity, secondary parity, and tertiary parity. For efficiency, the calculation of the parity bits is preferably performed in parallel with the writing of the data to the flash memory cells.

Data may be received by the journaling file system in a relatively large data stream. When stored, this data stream is allocated among a plurality of payloads of codewords. In the illustrated embodiment, an ECC encoder/decoder generates the parity bits for the primary parity, the secondary parity, and the tertiary parity. As discussed earlier, the terms primary, secondary, and tertiary refer to orthogonal dimensions over which block data is taken for calculation of ECC parity bits. In its simplest form, the block data can correspond to user data, that is, information, but as explained below, with other parity bits, can include parity bits of earlier calculated ECC.

In one embodiment, primary parity information is inserted into the stored data stream at the end of each primary codeword such that a primary codeword typically has, but does not need to have, contiguous symbols. In the illustrated embodiment, secondary parity is calculated over and inserted at the end of each page stripe (but before the tertiary parity). Generally, the secondary parity symbols are not contiguous with the secondary information symbols. A second primary parity that is calculated on the secondary parity bits is inserted at the end of the secondary parity. Tertiary parity is calculated over a page grid (groups of Wg page stripes), and is inserted into a reserved tertiary space at the end of the last page stripe. In this context, "last" means the last in time page stripe of the page grid to store data. The last page stripe can also be termed the tertiary page stripe. Generally, the tertiary parity symbols are not contiguous with the tertiary information symbols. Primary parity is calculated on the tertiary parity bits (PoTP) and inserted after the tertiary parity bits.

The result is that the flash memory is programmed as a set of page grids, with each piece of user data being protected by a three-dimensional grid of error correction codes. Each error correction code requires the addition of redundant data, which reduces the amount of user data that can be stored in the grid. The stronger the correction code, the more redundant data is required. The strength of the error correcting code can be selected on a per-page stripe basis. Preferably, the selected strength for the code can be the weakest one that is still certain to be able to correct the bit error rate anticipated on that page stripe.

When reading data, the data of interest is usually less than a page stripe. In accordance with one embodiment of the invention, the data of interest is read from the flash memory along with enough surrounding data to make up a set of complete primary codewords (a partial page read). If the primary decode process alone is sufficient to correct the data with high confidence, the operation is complete. If not, the entire page stripe containing the data of interest will be read and processed.

When decoding a page stripe, the primary and secondary codes can be used in an iterative fashion as necessary. If this is sufficient to correct the data with high confidence, the ECC decoding operation is complete and the data is released to the file system. If not, then the remaining three page stripes of the page grid are read.

When decoding a page grid, the primary and secondary parity of the Wg, for example, 4, page stripes are used to correct those page stripes to the extent practical, according to the principles of turbo decoding, which can include iterative decoding. After this is complete, the tertiary codewords over the page grid will be decoded iteratively with the primary and secondary, according to the principles of three-dimensional turbo decoding. If this is sufficient to correct the data with high confidence, the decoding operation is complete and the data is released to the file system. If not, then a final procedure can be attempted, which allows the algorithm to recover from the massive failure of one page in the grid. If that fails, then ECC decoding has failed, and a read response is sent indicating that the user data was uncorrectable.

One embodiment includes a method of selecting an error correction coding (ECC) scheme, wherein the method includes: determining a bit error rate associated with a region associated with a plurality of flash memory pages or integer fractions thereof; comparing the determined bit error rate to one or more predetermined thresholds corresponding to a set of predefined gears comprising at least a first gear and a second gear, wherein the predefined gears correspond to different predefined ECC schemes, wherein the first gear has a different data payload size and correction capability than the second gear; and selecting a gear from the set for the region based at least partly on the comparisons to the one or more predetermined thresholds; wherein determining, comparing, and selecting are performed by an integrated circuit. Determining, comparing, and selecting can be performed concurrently with at least one of flash initialization, read, or write operations for an end user. However, these determining, comparing, and selecting activities do not need to be done each time there is an initialization, read, or write operation.

One embodiment includes an apparatus, wherein the apparatus includes: a first circuit configured to determine a bit error rate associated with a region associated with a plurality of flash memory pages or integer fractions thereof and to compare the determined bit error rate to one or more predetermined thresholds corresponding to a set of predefined gears comprising at least a first gear and a second gear, wherein the predefined gears correspond to different error correction coding (ECC) schemes, wherein the first gear has a different data payload size and correction capability than the second gear; and a second circuit configured to select a gear from the set for the region based at least partly on the comparisons to the one or more predetermined thresholds.

One embodiment includes an apparatus for selecting an error correction coding (ECC) scheme, wherein the apparatus includes: a means for determining a bit error rate associated with a region associated with a plurality of flash memory pages or integer fractions thereof; a means for comparing the determined bit error rate to one or more predetermined thresholds corresponding to a set of predefined gears comprising at least a first gear and a second gear, wherein the predefined gears correspond to different predefined ECC schemes, wherein the first gear has a different data payload size and correction capability than the second gear; and a means for selecting a gear from the set for the region based at least partly on the comparisons to the one or more predetermined thresholds.

One embodiment includes an method of selecting among gears, wherein different gears correspond to different error correction coding (ECC) schemes for regions of a flash drive, wherein the method includes: performing a memory test to determine raw bit error rates among the regions of the flash drive; retiring regions having a raw bit error rate (RBER) above a selected threshold; and for remaining regions, allocating one or more regions to one of at least a first gear or a second gear based at least partly on the RBER for the region, wherein the first gear and the second gear vary by data payload size and correction capability; wherein the memory test, retiring regions, and allocating are performed by an integrated circuit; wherein the memory test, retiring regions, and allocating are performed concurrently with initialization operations for an end user.

One embodiment includes an apparatus, wherein the apparatus includes: a first circuit configured to run a memory test to determine raw bit error rates among regions of a flash drive; and a second circuit configured to: retire regions having a raw bit error rate (RBER) above a selected threshold; and allocate one or more remaining regions to one of at least a first gear or a second gear based at least partly on the RBER for the region, wherein the first gear and the second gear vary by data payload size and correction capability, wherein different gears correspond to different error correction coding (ECC) schemes for regions of the flash drive; wherein the first circuit is configured to run the memory test concurrently with initialization operations for an end user.

One embodiment includes an apparatus for selecting among gears, wherein different gears correspond to different error correction coding (ECC) schemes for regions of a flash drive, wherein the apparatus includes: a means for performing a memory test to determine raw bit error rates among the regions of the flash drive, wherein the memory test performing means is configured to run the memory test concurrently with initialization operations for an end user; a means for retiring regions having a raw bit error rate (RBER) above a selected threshold; and a means for allocating one or more remaining regions to one of at least a first gear or a second gear based at least partly on the RBER for the region, wherein the first gear and the second gear vary by data payload size and correction capability.

One embodiment includes a method of managing one or more gears, wherein different gears correspond to different error correction code (ECC) schemes, wherein the method includes: receiving a request for user data stored in flash memory devices, wherein the user data can be in stored in a scrambled from or in an unscrambled form; retrieving one or more codewords containing the requested user data from a region of the flash memory devices, wherein the region is associated with a first gear; correcting the one or more codewords to detect and correct errors with the first gear; and deciding whether or not to select a different gear for the region or retiring the region based on at least one of an analysis of an approximate raw bit error rate (RBER) of the region or a number of decoding iterations used to correct the requested user data, wherein the different gear has greater error correction capacity than the first gear; wherein at least correcting and deciding are performed by an integrated circuit.

One embodiment includes an apparatus, wherein the apparatus includes: a first circuit configured to: receive a request for user data stored in flash memory devices, wherein the user data can be in stored in a scrambled from or in an unscrambled form; and retrieve one or more codewords containing the requested user data from a region of the flash memory devices, wherein the region is associated with a first gear, wherein different gears correspond to different error correction code (ECC) schemes; and a second circuit configured to correct the one or more codewords to detect and correct errors with the first gear; wherein the first circuit is configured to decide whether or not to select a different gear for the region or retire the region based on at least one of an analysis of an approximate raw bit error rate (RBER) of the region or a number of decoding iterations used to correct the requested user data, wherein the different gear has greater error correction capacity than the first gear.

One embodiment includes an apparatus of managing one or more gears, wherein different gears correspond to different error correction code (ECC) schemes, wherein the apparatus includes: a means for receiving a request for user data stored in flash memory devices, wherein the user data can be in stored in a scrambled from or in an unscrambled form; a means for retrieving one or more codewords containing the requested user data from a region of the flash memory devices, wherein the region is associated with a first gear; a means for correcting the one or more codewords to detect and correct errors with the first gear; and a means for deciding whether or not to select a different gear for the region or retiring the region based on at least one of an analysis of an approximate raw bit error rate (RBER) of the region or a number of decoding iterations used to correct the requested user data, wherein the different gear has greater error correction capacity than the first gear.

One embodiment includes a method of programming data to a plurality of flash memory devices, wherein the method includes: receiving data to be programmed; arranging the received data for distribution among a group of pages such that sequentially received data is to be programmed among the group of pages, wherein the group of pages comprises two or more flash memory pages or two or more integer fractions of flash memory pages; error correction encoding data to be stored within a particular page or integer fraction to generate primary parity symbols for primary codewords; generating information portions of secondary codewords by selecting portions of primary codewords, wherein secondary codewords are at least partially orthogonal to primary codewords; error correction encoding the information portions of the secondary codewords to generate secondary parity symbols for the secondary codewords; arranging the secondary parity data for distribution among the group of pages such that the secondary parity data is to be programmed among the group of pages; and programming the group of pages with the arranged received data, the primary parity data, and the arranged secondary parity data; wherein at least error correction encoding data, generating information portions, and error correction encoding the information portions are performed by an integrated circuit; wherein at least error correction encoding data, generating information portions, and error correction encoding the information portions are performed concurrently with write operations for an end user.

One embodiment includes an apparatus, wherein the method includes: a first circuit configured to: receive data to be programmed; and arrange the received data for distribution among a group of pages such that sequentially received data is to be programmed among the group of pages, wherein the group of pages comprises two or more flash memory pages or two or more integer fractions of flash memory pages; a second circuit configured to error correction encode data to be stored within a particular page or integer fraction to generate primary parity symbols for primary codewords; the first circuit further configured to select portions of primary codewords to generate information portions of secondary codewords, wherein secondary codewords are at least partially orthogonal to primary codewords; the second circuit further configured to error correction encode the information portions of the secondary codewords to generate secondary parity symbols for the secondary codewords; the first circuit further configured to arrange the secondary parity data for distribution among the group of pages such that the secondary parity data is to be programmed among the group of pages; and the first circuit further configured to program the group of pages with the arranged received data, the primary parity data, and the arranged secondary parity data; wherein the first circuit and the second circuit are configured to error correction encode data, to generate information portions, and to error correction encode the information portions concurrently with write operations for an end user.

One embodiment includes an apparatus for programming data to a plurality of flash memory devices, wherein the apparatus includes: a means for receiving data to be programmed; a means for arranging the received data for distribution among a group of pages such that sequentially received data is to be programmed among the group of pages, wherein the group of pages comprises two or more flash memory pages or two or more integer fractions of flash memory pages; a means for error correction encoding data to be stored within a particular page or integer fraction to generate primary parity symbols for primary codewords; a means for generating information portions of secondary codewords by selecting portions of primary codewords, wherein secondary codewords are at least partially orthogonal to primary codewords; the encoding means further configured to error correction encode the information portions of the secondary codewords to generate secondary parity symbols for the secondary codewords; the arranging means further configured to arrange the secondary parity data for distribution among the group of pages such that the secondary parity data is to be programmed among the group of pages; and a means for programming the group of pages with the arranged received data, the primary parity data, and the arranged secondary parity data; wherein the arranging means and the error correction means are configured to operate concurrently with write operations for an end user.

One embodiment includes a method of decoding data with low latency, wherein the method includes: receiving a request for data stored in at least one of a plurality of flash memory devices; identifying a page stripe that includes the requested data, wherein the page stripe comprises a grouping of one or more equally-sized flash pages or integer fractions of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; determining a portion of the page stripe that contains an integer number of a first set of primary codewords containing the requested data and associated primary parity symbols such that retrieval and decoding of the requested data is performed with a first amount of latency; retrieving from flash memory the first set of primary codewords containing the requested data; performing error correction on the first set of primary codewords to determine if the raw requested data contains errors and if the errors, if any, are correctable, to generate first corrected requested data; releasing the first corrected requested data based at least partly on a determination that the first corrected requested data has been decoded with a likelihood of error below a predetermined acceptable uncorrectable bit error rate (aUBER) when the first corrected requested data cannot be considered to be error free to within the aUBER, performing the following: reading the page stripe containing the requested data such that a second set of primary codewords is retrieved, wherein reading of page stripe is performed with a second latency longer than the first latency; performing error correction on the second set of primary codewords of the page stripe to generate an updated page stripe; interleaving data from the updated page stripe to arrange secondary codewords; performing error correction on the secondary codewords to generate corrected secondary codewords, wherein execution of error correction on the secondary codewords is not performed in parallel with execution of error correction on the primary codewords; de-interleaving the corrected secondary codewords to generate a further updated page stripe having an updated second set of primary codewords; performing error correction on at least a portion of the updated second set of primary codewords to generate updated corrected requested data; and releasing the second corrected requested data based at least partly on a determination that the likelihood of the requested data containing an error is less than a predetermined acceptable failure rate; wherein at least performing error correction is performed by an integrated circuit; wherein at least performing error correction is performed concurrently with a read operation for an end user.

One embodiment includes an apparatus, wherein the apparatus includes: a first circuit configured to receive a request for data stored in at least one of a plurality of flash memory devices; the first circuit configured to identify a page stripe that includes the requested data, wherein the page stripe comprises a grouping of one or more equally-sized flash pages or integer fractions of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; the first circuit configured to determine a portion of the page stripe that contains an integer number of a first set of primary codewords containing the requested data and associated primary parity symbols such that retrieval and decoding of the requested data is performed with a first amount of latency; the first circuit configured to retrieve from flash memory the first set of primary codewords containing the requested data; a second circuit configured to perform error correction on the first set of primary codewords to determine if the raw requested data contains errors and if the errors, if any, are correctable, to generate first corrected requested data; the first circuit configured to release the first corrected requested data based at least partly on a determination that the first corrected requested data has been decoded with a likelihood of error below a predetermined acceptable uncorrectable bit error rate (aUBER), and when the first corrected requested data cannot be considered to be error free to within the aUBER: the first circuit is configured to read the page stripe containing the requested data such that a second set of primary codewords is retrieved, wherein reading of page stripe is performed with a second latency longer than the first latency; the second circuit is configured to perform error correction on the second set of primary codewords of the page stripe to generate an updated page stripe; the first circuit is configured to interleave data from the updated page stripe to arrange secondary codewords; the second circuit is configured to perform error correction on the secondary codewords to generate corrected secondary codewords, wherein execution of error correction on the secondary codewords is not performed in parallel with execution of error correction on the primary codewords; the first circuit is configured to de-interleave the corrected secondary codewords to generate a further updated page stripe having an updated second set of primary codewords; the second circuit is configured to perform error correction on at least a portion of the updated second set of primary codewords to generate updated corrected requested data; and the first circuit is configured to release the second corrected requested data based at least partly on a determination that the likelihood of the requested data containing an error is less than a predetermined acceptable failure rate; wherein the second circuit is configured to perform error correction concurrently with a read operation for an end user.

One embodiment includes an apparatus for decoding data with low latency, wherein the apparatus includes: a means for receiving a request for data stored in at least one of a plurality of flash memory devices; a means for identifying a page stripe that includes the requested data, wherein the page stripe comprises a grouping of one or more equally-sized flash pages or integer fractions of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; a means for determining a portion of the page stripe that contains an integer number of a first set of primary codewords containing the requested data and associated primary parity symbols such that retrieval and decoding of the requested data is performed with a first amount of latency; a means for retrieving from flash memory the first set of primary codewords containing the requested data; a means for performing error correction on the first set of primary codewords to determine if the raw requested data contains errors and if the errors, if any, are correctable, to generate first corrected requested data; a means for interleaving; a means for de-interleaving; a means for releasing the first corrected requested data based at least partly on a determination that the first corrected requested data has been decoded with a likelihood of error below a predetermined acceptable uncorrectable bit error rate (aUBER) when the first corrected requested data cannot be considered to be error free to within the aUBER: the retrieving means is configured to read the page stripe containing the requested data such that a second set of primary codewords is retrieved, wherein reading of page stripe is performed with a second latency longer than the first latency; the error correction means is configured to perform error correction on the second set of primary codewords of the page stripe to generate an updated page stripe; the interleaving means is configured to interleave data from the updated page stripe to arrange secondary codewords; the error correction means configured to perform error correction on the secondary codewords to generate corrected secondary codewords, wherein execution of error correction on the secondary codewords is not performed in parallel with execution of error correction on the primary codewords; the de-interleaving means is configured to de-interleave the corrected secondary codewords to generate a further updated page stripe having an updated second set of primary codewords; the error correction means configured to perform error correction on at least a portion of the updated second set of primary codewords to generate updated corrected requested data; and the releasing means configured to release the second corrected requested data based at least partly on a determination that the likelihood of the requested data containing an error is less than a predetermined acceptable failure rate; wherein at least performing error correction is performed concurrently with a read operation for an end user.

One embodiment includes a method of reading data, wherein the method includes: receiving a request for data stored in at least one of a plurality of flash memory devices; identifying a page stripe that includes at least a portion of the requested data, wherein the page stripe comprises a grouping of one or more equally-sized flash pages or integer fractions of pages of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; retrieving contents of the page stripe in raw form; performing error correction on the primary codewords of the page stripe to generate an updated page stripe containing corrected requested data; determining whether or not at least the corrected requested data contains error; releasing the corrected requested data based at least partly on a determination that the likelihood of the requested data containing an error is less than a predetermined acceptable failure rate; when the first corrected requested data is not released, performing the following: interleaving data from the updated page stripe to arrange secondary codewords; performing error correction decoding on the secondary codewords to generate updated secondary codewords, wherein execution of error correction on the secondary codewords is not performed in parallel with execution of error correction on the primary codewords; de-interleaving the corrected secondary codewords to generate a further updated page stripe having an updated primary codewords; performing error correction on at least a portion of the updated primary codewords to generate updated corrected requested data; and releasing the updated corrected requested data based at least partly on the determination that the likelihood of the requested data containing an error is less than a predetermined acceptable failure rate; wherein at least performing error correction is performed by an integrated circuit; wherein at least performing error correction is performed concurrently with a read operation for an end user.

One embodiment includes an apparatus, wherein the apparatus includes: a first circuit configured to receive a request for data stored in at least one of a plurality of flash memory devices; the first circuit configured to identify a page stripe that includes at least a portion of the requested data, wherein the page stripe comprises a grouping of one or more equally-sized flash pages or integer fractions of pages of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; the first circuit configured to retrieve contents of the page stripe in raw form; a second circuit configured to perform error correction on the primary codewords of the page stripe to generate an updated page stripe containing corrected requested data; the first circuit configured to determine whether or not at least the corrected requested data contains error; the first circuit configured to release the corrected requested data based at least partly on a determination that the likelihood of the requested data containing an error is less than a predetermined acceptable failure rate; when the first corrected requested data is not released: the first circuit is configured to interleave data from the updated page stripe to arrange secondary codewords; the second circuit is configured to perform error correction decoding on the secondary codewords to generate updated secondary codewords, wherein execution of error correction on the secondary codewords is not performed in parallel with execution of error correction on the primary codewords; the first circuit is configured to de-interleave the corrected secondary codewords to generate a further updated page stripe having an updated primary codewords; the second circuit is configured to perform error correction on at least a portion of the updated primary codewords to generate updated corrected requested data; and the first circuit is configured to release the updated corrected requested data based at least partly on the determination that the likelihood of the requested data containing an error is less than a predetermined acceptable failure rate;

wherein the second circuit is configured to perform error correction concurrently with a read operation for an end user.

One embodiment includes an apparatus for reading data, wherein the apparatus includes: a means for receiving a request for data stored in at least one of a plurality of flash memory devices; a means for identifying a page stripe that includes at least a portion of the requested data, wherein the page stripe comprises a grouping of one or more equally-sized flash pages or integer fractions of pages of flash pages, wherein each page or each integer fraction of the page stripe contains primary parity symbols for error correction of data stored within the page or integer fraction, and wherein the pages or integer fractions of the page stripe contain secondary parity symbols for error correction of data stored throughout the page stripe; a means for retrieving contents of the page stripe in raw form; a means for performing error correction on the primary codewords of the page stripe to generate an updated page stripe containing corrected requested data; a means for determining whether or not at least the corrected requested data contains error; a means for interleaving; a means for de-interleaving; a means for releasing the corrected requested data based at least partly on a determination that the likelihood of the requested data containing an error is less than a predetermined acceptable failure rate; when the first corrected requested data is not released: the interleaving means is configured to interleave data from the updated page stripe to arrange secondary codewords; the error correction means is configured to perform error correction decoding on the secondary codewords to generate updated secondary codewords, wherein execution of error correction on the secondary codewords is not performed in parallel with execution of error correction on the primary codewords; the de-interleaving means is configured to de-interleave the corrected secondary codewords to generate a further updated page stripe having an updated primary codewords; the error correction means is configured to perform error correction on at least a portion of the updated primary codewords to generate updated corrected requested data; and the releasing means is configured to release the updated corrected requested data based at least partly on the determination that the likelihood of the requested data containing an error is less than a predetermined acceptable failure rate; wherein the error correction means is configured to perform error correction concurrently with a read operation for an end user.

One embodiment includes a method of storing data to an array of flash memory devices, wherein the method includes: maintaining one or more lists of page stripes indicating at least which page stripes are available to be programmed, the one or more lists of page stripes associating, for an available page stripe, the following: one or more physical addresses of pages or integer fractions of pages for the page stripe; and a gear setting for the page stripe, the gear setting indicating an error correction scheme and corresponding payload size assigned to the page stripe; maintaining one or more lists associating at least virtual addresses with physical addresses for data stored within the array of flash memory devices, wherein a virtual address is associated with at least one physical address; receiving an allocation block, a virtual address identifying the allocation block, and a request for storage of the allocation block into the array of flash memory devices; determining, based at least partly on the gear assigned to a current page stripe and an amount of data, if any, already assigned to the current page stripe, an extent to which the allocation block can be stored within an available payload of the current page stripe, wherein the current page stripe corresponds to a page stripe selected from the one or more lists of page stripes that are available to be programmed; assigning at least a first subset of the allocation block to the payload of the selected page stripe; storing an association of the virtual address with (a) the physical address of the current page stripe, and with (b) a starting location of the allocation block within the current page stripe; when enough data has been collected to consider the payload of the current page stripe as full: performing or having error correction encoding performed for the data of the payload in accordance with the gear setting associated with the current page stripe; programming the current page stripe to the array; associating the current page stripe with programmed page stripes; selecting a next page stripe from the one or more lists of available page stripes for subsequent programming; if the allocation block had not been fully assigned to the payload of the current page stripe: assigning a remainder of the allocation block to a payload of the next page stripe; and storing an additional association of the virtual address with the physical address of the next page stripe; wherein the method is performed by an integrated circuit.

One embodiment includes an apparatus, wherein the apparatus includes: a first circuit configured to maintain one or more lists of page stripes indicating at least which page stripes are available to be programmed, the one or more lists of page stripes associating, for an available page stripe, the following: one or more physical addresses of pages or integer fractions of pages for the page stripe; and a gear setting for the page stripe, the gear setting indicating an error correction scheme and corresponding payload size assigned to the page stripe; the first circuit further configured to maintain one or more lists associating at least virtual addresses with physical addresses for data stored within an array of flash memory devices, wherein a virtual address is associated with at least one physical address; the first circuit further configured to receive an allocation block, a virtual address identifying the allocation block, and a request for storage of the allocation block into the array of flash memory devices; the first circuit further configured to determine, based at least partly on the gear assigned to a current page stripe and an amount of data, if any, already assigned to the current page stripe, an extent to which the allocation block can be stored within an available payload of the current page stripe, wherein the current page stripe corresponds to a page stripe selected from the one or more lists of page stripes available for programming; the first circuit further configured to assign at least a first subset of the allocation block to the payload of the selected page stripe; the first circuit further configured to store an association of the virtual address with (a) the physical address of the current page stripe, and with (b) a starting location of the allocation block within the current page stripe; when enough data has been collected to consider the payload of the current page stripe as full: a second circuit is configured to perform error correction encoding performed for the data of the payload in accordance with the gear setting associated with the current page stripe; the first circuit is configured to program the current page stripe to the array; the first circuit is configured to associate the current page stripe with programmed page stripes; the first circuit is configured to select a next page stripe from the one or more lists of available page stripes for subsequent programming; if the allocation block had not been fully assigned to the payload of the current page stripe: the first circuit is configured to assign a remainder of the allocation block to a payload of the next page stripe; and the first circuit is configured to store an additional association of the virtual address with the physical address of the next page stripe.

One embodiment includes an apparatus for storing data to an array of flash memory devices, wherein the apparatus includes: a means for maintaining one or more lists of page stripes indicating at least which page stripes are available to be programmed, the one or more lists of page stripes associating, for an available page stripe, the following: one or more physical addresses of pages or integer fractions of pages for the page stripe; and a gear setting for the page stripe, the gear setting indicating an error correction scheme and corresponding payload size assigned to the page stripe; the maintaining means further maintaining one or more lists associating at least virtual addresses with physical addresses for data stored within the array of flash memory devices, wherein a virtual address is associated with at least one physical address; a means for receiving an allocation block, a virtual address identifying the allocation block, and a request for storage of the allocation block into the array of flash memory devices; a means for determining, based at least partly on the gear assigned to a current page stripe and an amount of data, if any, already assigned to the current page stripe, an extent to which the allocation block can be stored within an available payload of the current page stripe, wherein the current page stripe corresponds to a page stripe selected from the one or more lists of page stripes that are available to be programmed; a means for assigning at least a first subset of the allocation block to the payload of the selected page stripe; a means for storing an association of the virtual address with (a) the physical address of the current page stripe, and with (b) a starting location of the allocation block within the current page stripe; when enough data has been collected to consider the payload of the current page stripe as full: a means for performing or having error correction encoding performed for the data of the payload in accordance with the gear setting associated with the current page stripe; a means for programming the current page stripe to the array; a means for associating the current page stripe with programmed page stripes; a means for selecting a next page stripe from the one or more lists of available page stripes for subsequent programming; if the allocation block had not been fully assigned to the payload of the current page stripe: the assigning means further assigning a remainder of the allocation block to a payload of the next page stripe; and the association storing means further storing an additional association of the virtual address with the physical address of the next page stripe.

One embodiment includes a method of reading data from an array of flash memory devices, wherein the method includes: receiving a request for data stored in the flash array, the requested data being identified by a virtual address; looking up the following, which are associated with the virtual address: a physical address or addresses of one or more page stripes; a starting location for the data within the first page stripe of the one or more page stripes of the flash array; and one or more gear settings for the one or more page stripes, wherein the gear settings are indicative of a strength of error correction assigned to a page stripe of the one or more page stripes; requesting one or more portions of the payload of the one or more page stripes associated with the virtual address, and providing the one or more gear settings of the one or more page stripes along with the request; receiving, from an ECC decoder, corrected retrieved portions of the one or more page stripes, and an indication of whether each portion was successfully corrected; and if all portions of the requested data were successfully corrected by the ECC decoder, reassembling the corrected portions into the requested data and returning the same; wherein the method is performed by an integrated circuit.

One embodiment includes an apparatus, wherein the apparatus includes: a first circuit configured to receive a request for data stored in a flash array, the requested data being identified by a virtual address; a second circuit configured to look up the following, which are associated with the virtual address: a physical address or addresses of one or more page stripes; a starting location for the data within the first page stripe of the one or more page stripes of the flash array; and one or more gear settings for the one or more page stripes, wherein the gear settings are indicative of a strength of error correction assigned to a page stripe of the one or more page stripes; the second circuit further configured to request one or more portions of the payload of the one or more page stripes associated with the virtual address, and providing the one or more gear settings of the one or more page stripes along with the request; the second circuit further configured to receive, from an ECC decoder, corrected retrieved portions of the one or more page stripes, and an indication of whether each portion was successfully corrected; and if all portions of the requested data were successfully corrected by the ECC decoder, the second circuit is further configured to reassemble the corrected portions into the requested data and return the same.

One embodiment includes an apparatus for reading data from an array of flash memory devices, wherein the apparatus includes: a means for receiving a request for data stored in a flash array, the requested data being identified by a virtual address; a means for looking up the following, which are associated with the virtual address: a physical address or addresses of one or more page stripes; a starting location for the data within the first page stripe of the one or more page stripes of the flash array; and one or more gear settings for the one or more page stripes, wherein the gear settings are indicative of a strength of error correction assigned to a page stripe of the one or more page stripes; a means for requesting one or more portions of the payload of the one or more page stripes associated with the virtual address; a means for providing the one or more gear settings of the one or more page stripes along with the request; a means for receiving, from an ECC decoder, corrected retrieved portions of the one or more page stripes, and an indication of whether each portion was successfully corrected; and a means for reassembling; wherein if all portions of the requested data were successfully corrected by the ECC decoder, the reassembling means further reassembling the corrected portions into the requested data and returning the same.

One embodiment includes a method of reclaiming flash blocks of a flash array, wherein the method includes: selecting a block grid for reclamation, wherein block grids contain complete page grids; for valid data stored in the block grid, reading, performing error correction, and journaling into available page stripes of the flash array, wherein valid data includes valid allocation blocks, wherein an ECC decoder used for performing error correction generates an indication as to whether or not correction for at least the valid data from the flash array has met criteria indicating that a different gear to be selected; erasing the blocks of the block grid; updating gear settings for the page stripes of the block grid based at least partly on corresponding indications from the ECC decoder; and making the page stripes of the block grid available for writing; wherein at least selecting and making are performed by an integrated circuit.

One embodiment includes an apparatus, wherein the apparatus includes: a first circuit configured to select a block grid for reclamation, wherein block grids contain complete page grids; an ECC decoder; for valid data stored in the block grid, the first circuit is further configured to read, the ECC decoder is configured to perform error correction, and the first circuit is further configured to journal into available page stripes of a flash array, wherein valid data includes valid allocation blocks, wherein the ECC decoder generates an indication as to whether or not correction for at least the valid data from the flash array has met criteria indicating that a different gear to be selected; the first circuit further configured to erase the blocks of the block grid; the first circuit further configured to update gear settings for the page stripes of the block grid based at least partly on corresponding indications from the ECC decoder; and the first circuit further configured to make the page stripes of the block grid available for writing.

One embodiment includes an apparatus for reclaiming flash blocks of a flash array, wherein the apparatus includes: a means for selecting a block grid for reclamation, wherein block grids contain complete page grids; a means for reading; a means for ECC decoding; a means for journaling; for valid data stored in the block grid, the reading means further reading, the ECC decoding means further performing error correction, and the journaling means further journaling into available page stripes of the flash array, wherein valid data includes valid allocation blocks, wherein the ECC decoding means is configured to generate an indication as to whether or not correction for at least the valid data from the flash array has met criteria indicating that a different gear to be selected; a means for erasing the blocks of the block grid; a means for updating gear settings for the page stripes of the block grid based at least partly on corresponding indications from the ECC decoder; and a means for making the page stripes of the block grid available for writing.

One embodiment includes a method of programming data to a plurality of flash memory devices, wherein the method includes: associating two or more flash memory pages or integer fractions of flash memory pages from one or more integrated circuits or planes with a page stripe, wherein a page is associated with a set of primary ECC codewords, and a page stripe can optionally be associated with a set of secondary and primary over secondary parity (PoSP) ECC codewords; associating two or more flash memory stripes from different integrated circuits or planes with a page grid, wherein the page grid is associated with a group of tertiary ECC codewords, wherein the tertiary ECC is usable as an erasure code, and wherein a last page stripe of the page grid has a reduced payload capacity; receiving data to be programmed; error correction encoding the received data to be stored within each page stripe to generate at least primary ECC codewords for the pages or integer fractions of the page stripe; calculating tertiary ECC parity across the page grid in a sequence such that a tertiary ECC codeword includes a number of symbols residing on every page no greater than the erasure capability of the tertiary ECC codeword; arranging the tertiary parity data such that the tertiary parity data is broken up and spread for programming across a last page stripe; and programming the pages of the page grid; wherein at least performing error correction encoding is performed in an integrated circuit.

One embodiment includes an apparatus, wherein the apparatus includes: a first circuit configured to associate two or more flash memory pages or integer fractions of flash memory pages from one or more integrated circuits or planes with a page stripe, wherein a page is associated with a set of primary ECC codewords, and a page stripe can optionally be associated with a set of secondary and primary over secondary parity (PoSP) ECC codewords; the first circuit is further configured to associate two or more flash memory stripes from different integrated circuits or planes with a page grid, wherein the page grid is associated with a group of tertiary ECC codewords, wherein the tertiary ECC is usable as an erasure code, and wherein a last page stripe of the page grid has a reduced payload capacity; the first circuit is further configured to receive data to be programmed; a second circuit configured to error correction encode the received data to be stored within each page stripe to generate at least primary ECC codewords for the pages or integer fractions of the page stripe; the second circuit is further configured to calculate tertiary ECC parity across the page grid in a sequence such that a tertiary ECC codeword includes a number of symbols residing on every page no greater than the erasure capability of the tertiary ECC codeword; and the first circuit is further configured to arrange the tertiary parity data such that the tertiary parity data is broken up and spread for programming across a last page stripe; and the first circuit is further configured to program the pages of the page grid such that data is programmed to a plurality of flash memory devices.

One embodiment includes an apparatus for programming data to a plurality of flash memory devices, wherein the apparatus includes: a means for associating two or more flash memory pages or integer fractions of flash memory pages from one or more integrated circuits or planes with a page stripe, wherein a page is associated with a set of primary ECC codewords, and a page stripe can optionally be associated with a set of secondary and primary over secondary parity (PoSP) ECC codewords; a means for associating two or more flash memory stripes from different integrated circuits or planes with a page grid, wherein the page grid is associated with a group of tertiary ECC codewords, wherein the tertiary ECC is usable as an erasure code, and wherein a last page stripe of the page grid has a reduced payload capacity; a means for receiving data to be programmed; a means for error correction encoding the received data to be stored within each page stripe to generate at least primary ECC codewords for the pages or integer fractions of the page stripe; a means for calculating tertiary ECC parity across the page grid in a sequence such that a tertiary ECC codeword includes a number of symbols residing on every page no greater than the erasure capability of the tertiary ECC codeword; a means for arranging the tertiary parity data such that the tertiary parity data is broken up and spread for programming across the last page stripe; and a means for programming the pages of the page grid.

One embodiment includes a method of recovering data from a failed page of flash memory, wherein the method includes: reading contents of flash pages of a page grid containing the failed page, wherein tertiary parity symbols are distributed among the pages of a last page stripe of the page grid, wherein each of the pages of the page grid have ECC codewords stored therein; (a) performing error correction on each page stripe of the page grid according to the gear with which the page stripe was encoded; (b) arranging the data of the page grid to form tertiary codewords; (c) marking symbols of the tertiary codewords that are associated with the failed page as erasures; (d) performing error correction decoding using mixed error and erasure decoding on the tertiary codewords to update the tertiary codewords; (e) arranging the updated tertiary codewords to generate corrected versions of the page stripes; (f) performing error correction on page stripes of the page grid according to the gear with which each page stripe was encoded; performing one or more iterations of (b) through (f) until a stopping criterion is reached or a determination that the recovered data has been recovered without error; and releasing the recovered data to the requester based at least partly on the determination that the recovered data has been recovered without error; wherein at least (a) is performed in an integrated circuit.

One embodiment includes an apparatus, wherein the apparatus includes: a first circuit configured to read contents of flash pages of a page grid containing a failed page of flash memory, wherein tertiary parity symbols are distributed among the pages of a last page stripe of the page grid, wherein each of the pages of the page grid have ECC codewords stored therein; a second circuit configured to (a) perform error correction on each page stripe of the page grid according to the gear with which the page stripe was encoded; the first circuit configured to (b) arrange the data of the page grid to form tertiary codewords; the first circuit configured to (c) mark symbols of the tertiary codewords that are associated with the failed page as erasures; the second circuit configured to (d) perform error correction decoding with mixed error and erasure decoding on the tertiary codewords to update the tertiary codewords; the first circuit configured to (e) arrange the updated tertiary codewords to generate corrected versions of the page stripes; the second circuit configured to (f) perform error correction on page stripes of the page grid according to the gear with which each page stripe was encoded; wherein the first circuit and the second circuit are configured to iterate performance of (b) through (f) until a stopping criterion is reached or a determination that the recovered data has been recovered without error; and the first circuit configured to release the recovered data to the requester based at least partly on the determination that the recovered data has been recovered without error.

One embodiment includes an apparatus for recovering data from a failed page of flash memory, wherein the apparatus includes: a means for reading contents of flash pages of a page grid containing the failed page, wherein tertiary parity symbols are distributed among the pages of a last page stripe of the page grid, wherein each of the pages of the page grid have ECC codewords stored therein; a means for recovering data, the recovering data means further: (a) performing error correction on each page stripe of the page grid according to the gear with which the page stripe was encoded; (b) arranging the data of the page grid to form tertiary codewords; (c) marking symbols of the tertiary codewords that are associated with the failed page as erasures; (d) performing error correction decoding using mixed error and erasure decoding on the tertiary codewords to update the tertiary codewords; (e) arranging the updated tertiary codewords to generate corrected versions of the page stripes; (f) performing error correction on page stripes of the page grid according to the gear with which each page stripe was encoded; wherein the recovering data means further performing one or more iterations of (b) through (f) above until a stopping criterion is reached or a determination that the recovered data has been recovered without error; and a means for releasing the recovered data to the requester based at least partly on the determination that the recovered data has been recovered without error.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Figures 1A, 1B:
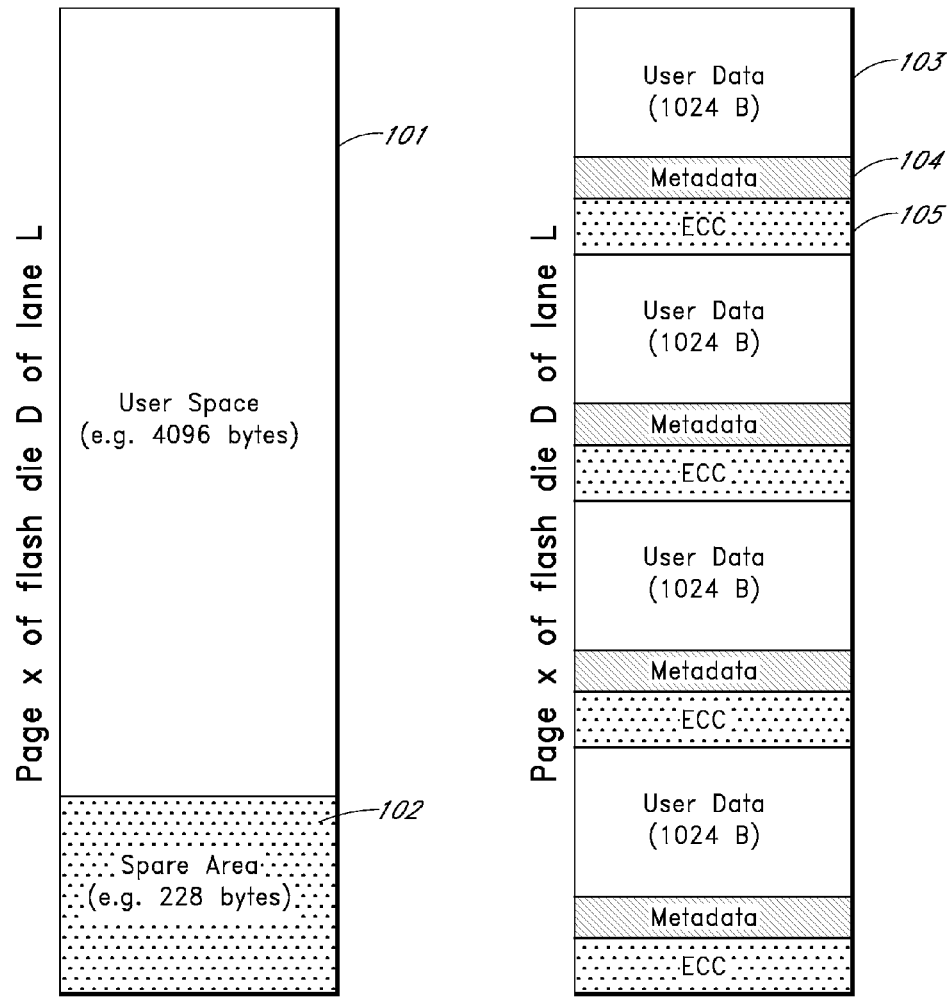
FIGS. 1A and 1B illustrate a conventional flash page arrangement.

Although particular embodiments are described herein, other embodiments of the invention, including embodiments that do not provide all of the benefits and features set forth herein, will be apparent to those of ordinary skill in the art. For example, one embodiment of the invention corresponds to an SSD memory controller or a flash drive controller with one or more of the following features: (1) translation of logical or virtual addresses and real addresses via a journaling file system or flash translation layer to reduce the number of program/erase cycles to the memory cells (see FIG. 12); (2) selection of a strength of error correction coding based on a raw bit error rate (see FIG. 11); (3) provision of one or more additional error correction codes so that lower latency reads for small numbers of errors are possible as well additional error correction for larger numbers of errors (see FIGS. 8 and 9); and/or (4) rebuilding of an entire failed page from redundant data (see FIG. 10). Each of these features will be described in more detail in the following.

Embodiments of the invention advantageously provide relatively low uncorrectable bit error rates for flash memory, low write amplification, long life, fast and efficient retrieval, and efficient storage density such that a solid-state drive (SSD) can be implemented using relatively inexpensive MLC flash for an enterprise storage application. MLC flash can be half or less the price of the SLC flash per bit of storage. Thus, the relatively low price of a sophisticated SSD controller can result in a substantial cost savings to an SSD implemented with MLC versus an SSD implemented with SLC. In addition, while described generally in connection with solid-state drives, the principles and advantages disclosed herein are applicable to other flash drives.

The techniques disclosed herein can be implemented by software/firmware instructions executed by a processor, by dedicated hardware, or by a combination of software/firmware and hardware. Instructions for the software/firmware can be stored in a tangible, non-transitory computer-readable medium.

DEFINITIONS

The following definitions may be helpful in understanding the specification.

xEy: x times 10 raised to the y-th power, that is $x(10^y)$. Thus 2.1E6 is 2,100,000, and 5E-3 is 0.005.

RBER: Raw Bit Error Rate. RBER refers to the number of differences (errors) between the data written to a region of flash, and the data read from the flash, divided by the total number of bits in that region.

UBER: Uncorrected Bit Error Rate. This refers to the number of differences (errors) between a set of data blocks sent to a flash file system, and the contents of those data blocks when read back from the flash file system, divided by the total number of bits in the data block(s).

ECC: Error Correction Coding is a class of techniques in which redundant information (parity) is added to information (information bits) in such a way that if errors are subsequently introduced, the original information bits can be recovered. ECC can also stand for error correction code, corresponding to the parity symbols themselves. An ECC has a correction capability, which represents its ability to correct errors. In the simplest form, this may be a certain number of bits T per ECC codeword length N, but in complex codes the correction capability can be hard to represent succinctly, and is often expressed in statistical terms, such as the RBER (for random errors) that can be reduced to a desired UBER.

Metadata: Information stored by the file system for the purpose of managing the storage and retrieval of user information from the storage array. This information may include the mapping of user allocation blocks to physical locations, as well as information about the flash array itself. Metadata is a broad term to describe information that is stored in flash, but is not user data, ECC parity, or unused space.

Codeword: a set of K information symbols, plus P parity symbols calculated from the information symbols by a predetermined formula. In the case of BCH codes, a symbol is 1 bit; in the case of RS codes it is m bits, where m is the order of the code. The information bits can correspond to a portion of user data 401 (FIG. 4), 501a-501d (FIG. 5), 701a-701d (FIG. 7) or to metadata, which will be considered user data herein. However, for extra redundancy, a portion of the parity of an earlier-in-time ECC code, such as the Primary ECC 702 can be part of the "block of data" for a subsequent ECC, such as a secondary ECC block code 703. The information block and the parity ECC of a codeword do not need to be stored adjacent to one another.

Page Stripe: A grouping of one or more equally-sized flash pages (or integer fractions of pages, such as ½ a page) which can be read more-or-less simultaneously, and which can be managed as a single region for the purpose of journaling. A page stripe has a unique gear setting at any given time, and has a payload capacity which is an integer number of journaling cells. A page stripe should be made up of pages on different flash planes or, preferably, different dies. For both latency and reliability purposes, it is preferable to use pages residing on different dice and attached to different data buses. In one embodiment, a page stripe comprises 4320 bytes on each of four pages, the four pages being on separate dice attached to separate ONFI buses.

Page Grid: A grouping of associated page stripes (or pages when page stripes are not used), wherein tertiary error protection exists to protect the pages of the page grid. The tertiary error correction is preferably an erasure code such as RS or LDPC, capable of rebuilding data lost when a page of the page grid becomes unreadable.

Block Stripe: A set of flash blocks from one or more dies in a flash array that contains a set of complete page stripes.

Block Grid: A set of flash blocks from one or more dies in a flash array that contains a set of complete page grids.

Flash die: A monolithic piece of semiconductor material containing flash memory and control circuitry. A flash package typically contains between one and eight flash dies. Flash dies are often referred to as logical units (LUNs).

Gear: In the context of this disclosure, a "gear" is a set of parameter(s) specifying an error correction coding scheme, including one or more of the payload capacity, the type and parameters of each component code, the interleaving scheme, and parameters used for determining whether the gear is appropriate for a particular situation. For example, the "Gear 1" sections of Tables III, IV, and V, plus the Threshold G1, collectively define Gear 1.

Block: Depending on context, a "block" can refer to: the smallest erasable unit within a flash memory, can refer to an amount of data over which an error correction code is calculated, can refer to a block within a flowchart or process, or can refer to an addressable unit of input/output (and corresponding to a particular virtual address or logical block address or LBA) of a data storage device, such as a hard disk, which is emulated by a solid-state drive or a flash drive. It will be apparent to one of ordinary skill in the art which is intended based on context.

Journaling Cell: The minimum unit of data for which the journaling engine or flash translation layer has a logical-to-physical mapping. In one embodiment, a journaling cell is 536 bytes, comprising 512 user data bytes, 8 bytes of data integrity field (DIF), 8 bytes of data integrity extension (DIX), and 8 bytes of journaling engine metadata.

High confidence: the probability of the opposite result is less than a predetermined acceptable error probability, such as, 1E-16.

Problems Recognized by Applicant

A conventional approach to error management for MLC-based SSD can exhibit a number of weaknesses. In one example of a conventional approach, the SSD controller is revised for each brand and technology generation of flash, in order to support the specified ECC. In another example, ECC codes being specified by the vendors tend to be ones that are easy to implement, but which have performance far below the theoretical maximum defined by the Shannon limit.

In another example, one conventional approach applies the same degree of error correction to all parts of the flash memory. However, flash memory is available in a NOR type and in a NAND type, with the NAND type having more storage density and thus lower costs. An SSD is typically implemented with the NAND type. Experimental results show that some areas of a NAND flash, particularly the upper pages of an MLC flash, and memory cells residing farthest from the sense amplifiers can exhibit many times the error rates of other areas. In another example, a conventional approach applies the same degree of error correction to the flash memory throughout its lifespan. Experimental results show that the error rate of a flash memory typically increases with increased number of program/erase cycles.

Journaling File Systems or Flash Translation Layer

Flash memory based storage systems can suffer from write amplification. In flash memory, the minimum erasable block size, typically 1 MB or more, is much larger than on hard disks using platters. A file system, which is typically part of an operating system of a host, exchanges data with a data storage device in different kinds of blocks, which should not be confused with storage blocks or erase blocks, which correspond to the minimum erasable unit in a flash device. Data is transferred to and from a host and a block device, such as a hard disk drive or other storage device, in units of data termed allocation blocks herein. These allocation blocks can correspond to "disk sectors" in a hard disk drive. Each of these allocation blocks has a virtual address. A flash translation layer is used so that a flash drive can emulate a hard disk drive by transferring data to and from the host in allocation blocks as expected by the file system. An example of a flash translation layer is described in U.S. Pat. No. 5,404,485 to Amir Ban, the disclosure of which is incorporated by reference in its entirety herein.

An allocation block is a sequence of words, such as bits or bytes or multiples thereof, of a certain block size, and is the minimum unit of data that is transferred to or from a host and a data storage device, such as a flash drive or a hard disk drive. While the allocation block size can vary among data storage devices, the allocation block size is always fixed for a particular data storage device. Examples of an allocation block size that have been used in the past include 512, 520, 528, 4096, and 4224 bytes. However, other allocation block sizes are possible. The data storage device can communicate its allocation block size and number of available allocation blocks to the host in response to low-level commands from the host.

The number of address bits can vary in a very wide range. For example, the ATA-1 standard has 28-bit addresses and the ATA-6 standard has 48-bit addresses. Typically, an interface standard requires that the virtual address start at 0 and be contiguous up to the last allocation block available on the drive.

To modify a piece of data in flash memory, an entire storage block of the flash memory containing the data is read, the entire storage block erased, and then some or all of the data can be modified and written back. If the flash memory is mapped into a conventional file system without a flash translation layer, in which the physical address of data on the flash memory is determined by the apparent address or logical block address in the user file system, this disadvantage can lead to relatively large amounts of reading or writing when files are being altered, which slows down write operations. Other problems also arise. For instance, if a few files are regularly updated, one part of the flash memory may wear out long before others. Even when wear leveling is utilized, such erase and programming operations can drastically shorten the life of a solid-state drive or flash drive.

Write amplification describes a ratio between user data written, for example, one 512 byte disk sector, and the total amount of data that is actually written to the flash memory. For example, when an entire block, for example, 256 pages of 8 sectors each, is rewritten to alter one sector, then the write amplification is 2048. Block sizes and write amplification can vary from the example shown. However, this very large value for write amplification means that writes to the SSD will take a relatively long time, and due to the write amplification, wear out the drive quite relatively quickly, which makes physically addressed SSDs impractical for any job that involves modifying small amounts of data on a regular basis.

To solve these and other problems, a journaling file system or flash translation layer (FTL) can be used, in which data to be written is stored to the flash in essentially the order it arrives, and a mapping table between the "apparent address" or virtual address and the "actual physical address" is maintained by the flash controller. The foregoing is a simplified description, but should serve to help understand the principles and advantages of certain embodiments of the invention.

Under a journaling file system, write amplification factors approaching of $1/(2u-u^2)$ can be achieved, in which u is the proportion of the drive that is not currently full of data. Maintaining write amplification at a relatively low value throughout the life of a device can help achieve high throughput, good flash life expectancy, and low thermal dissipation.

Error Correction Coding

One way of improving the performance of an ECC solution is to expand the size of the error correction block (information portion of a codeword) over which the ECC is applied. Two-dimensional "Turbo Product Codes", with iterative decode are a way of creating very large block codes while maintaining a reasonable circuit size and power.

However, if the information portion of a turbo code block is substantially larger than a typical user data request, the resulting solution will suffer from high latency and wasted throughput. This occurs because in order to decode even a small portion of a codeword, the entire codeword must still be read from flash storage. The latency goes up because the ECC decode operation cannot be completed until the entire block is read. Also, this additional data access can lower throughput for the SSD.

The illustrated embodiment replaces a conventional 1-dimensional BCH ECC code with a 3-dimensional turbo code formed from block ECC codes. Alternatively, 2 dimensions can be used and other forms of block codes can be used. In one embodiment, the 2 or 3 dimensions (for primary, secondary, and/or tertiary ECC) are each orthogonal to each other such that a codeword of one dimension shares at most one symbol with a codeword of another dimension. In another embodiment, the primary and secondary codewords are either disjoint or at least partially orthogonal to each other. Table I summarizes primary, secondary, and tertiary error correction characteristics according to one embodiment of the invention.

TABLE I

| Type of Error Correction | Data Protection |
| --- | --- |
| Primary | within a page or integer fraction of a page |
| Secondary | within a page stripe |
| Tertiary | within a page grid |

Orthogonality refers to the way in which one set of codewords and another set of codewords relate. In particular, given a codeword from a first set and a codeword from a second set, orthogonality refers to the number of symbols at which the codewords intersect. Two codeword sets are exactly orthogonal if they intersect at exactly one symbol. To the extent that 2 codewords intersect at more than one symbol, they are only partially orthogonal. When two codewords do not share any symbols, they are disjoint. Symbol sets are orthogonal if all members from a first set are orthogonal or disjoint with respect to a second set. Note that a symbol for a BCH code is a bit, while for an RS code a symbol is m bits, where m is the order of the code.

A high degree of orthogonality reduces the chances that a small pattern of errors is uncorrectable by the ECC scheme. In one embodiment, the orthogonality of the primary, secondary, and tertiary dimensions are implemented by selecting data for each primary, secondary, and tertiary codeword based on a predetermined interleave pattern.

For example, in the illustrated embodiment, the block data portion of the primary codewords can be taken sequentially as is common practice for ECC on flash pages. The block data portion of the secondary codewords can be taken by, for example, taking a bit of data, then skipping an amount of data at least equal to the block data size of a primary codeword to take the next bit of data for the block data portion of the secondary codeword, and so on, until the block data portion of the secondary codeword is filled. The skipping of data can be implemented by utilizing an appropriately sized skip factor in interleaving. The subsequent secondary codeword can retain the pattern with a one bit shift to capture new data, and so on. Similarly, the block data portion for the tertiary codewords uses another pattern, preferably one with even larger amounts of spacing between selections of bits than for the secondary codewords because for efficiency, it is desirable to access fewer pages of data for the decoding of secondary codewords than it would be to access tertiary codewords.

As will be explained later, decoding of the foregoing structure can be quite efficient. For the usual case in which the data is relatively uncorrupted, primary ECC decoding alone can confirm good data or correct the correctable errors such that data can usually be retrieved with relatively low latency. However, additional error correction is available to be invoked as needed, giving the best of low latency and more robust error correction.

One embodiment of invention avoids wasted-throughput and latency problems by choosing the primary ECC such that it can be decoded with only part of the total page stripe available. Most of the time, only the primary codewords containing the user-requested data need to be fetched, and the user data can be released after only a primary decoding operation. Only when the primary decoding operation is unable to perform the correction with high certainty does a higher latency decode operation need to be invoked. The primary ECC and its decode algorithm should be carefully chosen so that, even in the presence of relatively high bit error rate, the primary ECC can correct the errors present with a relatively high probability, for example, in one embodiment, at least 99% of the time, and almost never performs a "false decode." Other values are applicable, such as, but not limited to, at least 95% of the time or at least 90% of the time. Typically, it will be desirable to keep an expected amount of latency relatively low. The average amount of latency can be estimated by summing (a) the length of time that it takes to read the data and perform primary decoding; (b) the probability that the data is not released after primary decoding times the length of time that it takes to read a full page stripe and perform the primary/secondary iterative decoding operation; and (c) the probability that the data is not released after primary or primary/secondary decoding times the length of time that it takes to read a full page grid and perform tertiary/secondary/primary iterative decoding operation.

A false decode occurs when the primary ECC decoding process deduces that it has properly corrected the data, when in fact it has added errors. If a false decode occurs without detection, incorrect data would be released, which is an occurrence that should be kept to a very low level. For example, the false decode rate should be less than 1E-16.

The desired rate of false decodes can be guaranteed by choosing a primary quick-release threshold $Qp \leq Tp$, such that Eq. 1 is satisfied.

$$\left(\frac{2Tp}{Np}\right) \cdot \left(\frac{1}{Tp!}\right) \cdot \prod_{i=1}^{Tp-Qp-1} \left(\frac{Tp-i+1}{Np}\right) < aUBER \qquad \text{Eq. 1}$$

Figure 13:
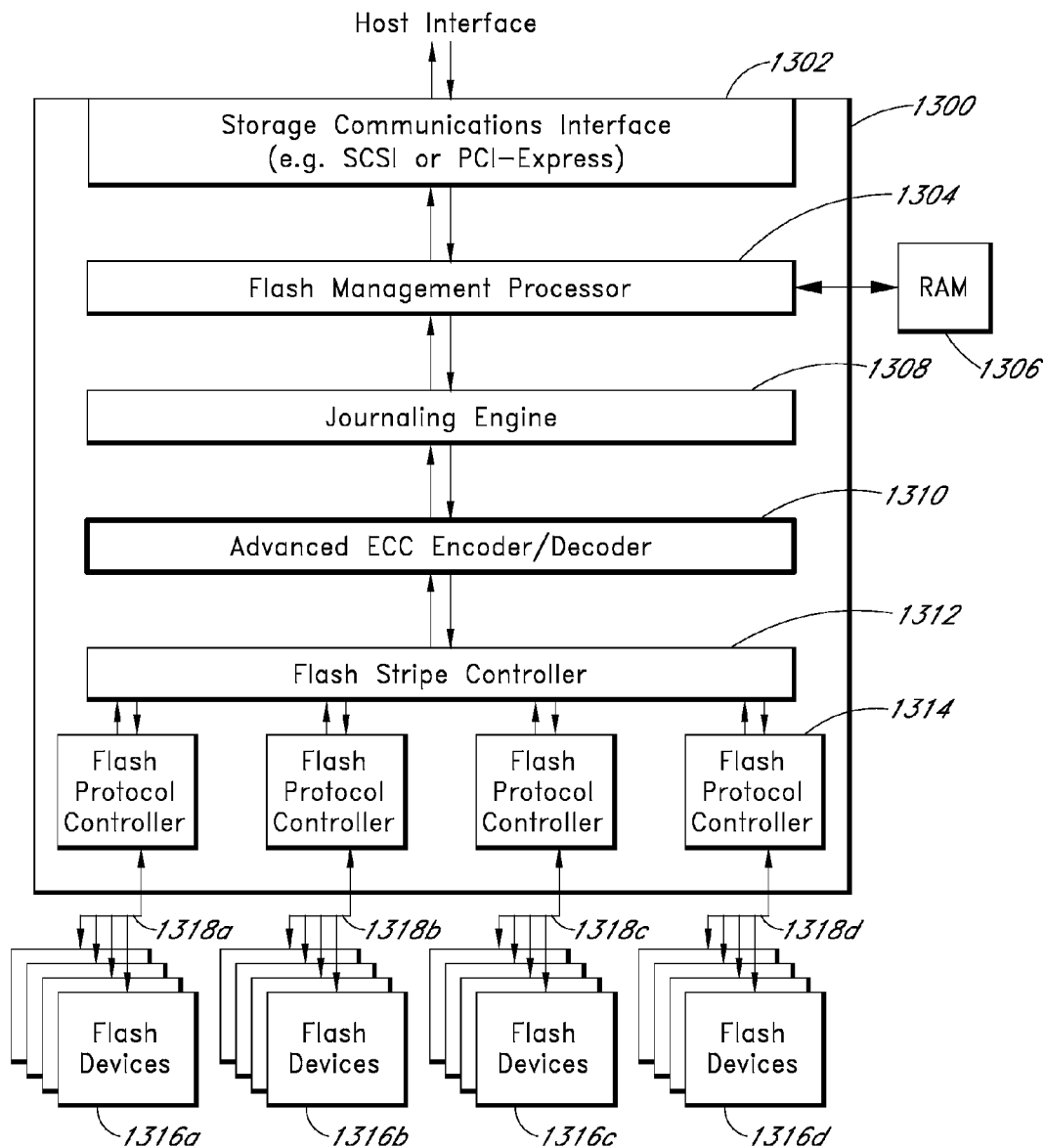
FIG. 13 illustrates an example of a block diagram for a solid-state drive controller according to an embodiment of the invention.

In Eq. 1, the "!" indicates factorial, aUBER corresponds to a predetermined acceptable uncorrected bit error rate, Tp corresponds to the correction capability of the primary ECC, and Np corresponds to the size of a primary codeword. The expression of Eq. 1 is solved for the value of Qp. The calculations described in Eq. 1 can be performed during a design stage, during production test or the like, and the value obtained for the parameter Qp can be stored or programmed into an SSD controller 1300 (FIG. 13). The quick-release parameter Qp can vary based on gear selection.

If ECC correction is performed, Qp or fewer bits are corrected, the data may be immediately released. If more than Qp bits are corrected, or the codeword is uncorrectable, then the result of the error correction is not certain. In this case, a page stripe should be fetched, and an iterative decoding operation using secondary codewords performed. The decoding operation of a page stripe can takes a great deal longer time than the primary decoding operation, but so long as the likelihood of requiring a page stripe decode can be kept sufficiently low (e.g. 1% or less), the impact on the average latency and throughput is advantageously relatively small.

The desired low likelihood of full stripe decodes can be achieved by choosing a maximum operating raw bit error rate G such that the safe correction capability (Qp) is sufficient to correct the targeted Bit Error Rate at least 99% of the time, as calculated by Eq. 2.

$$P_{corrected} \approx \sum_{i=0}^{Qp} \binom{N}{i} G^i \geq 0.99 \qquad \text{Eq. 2}$$

Figure 2:
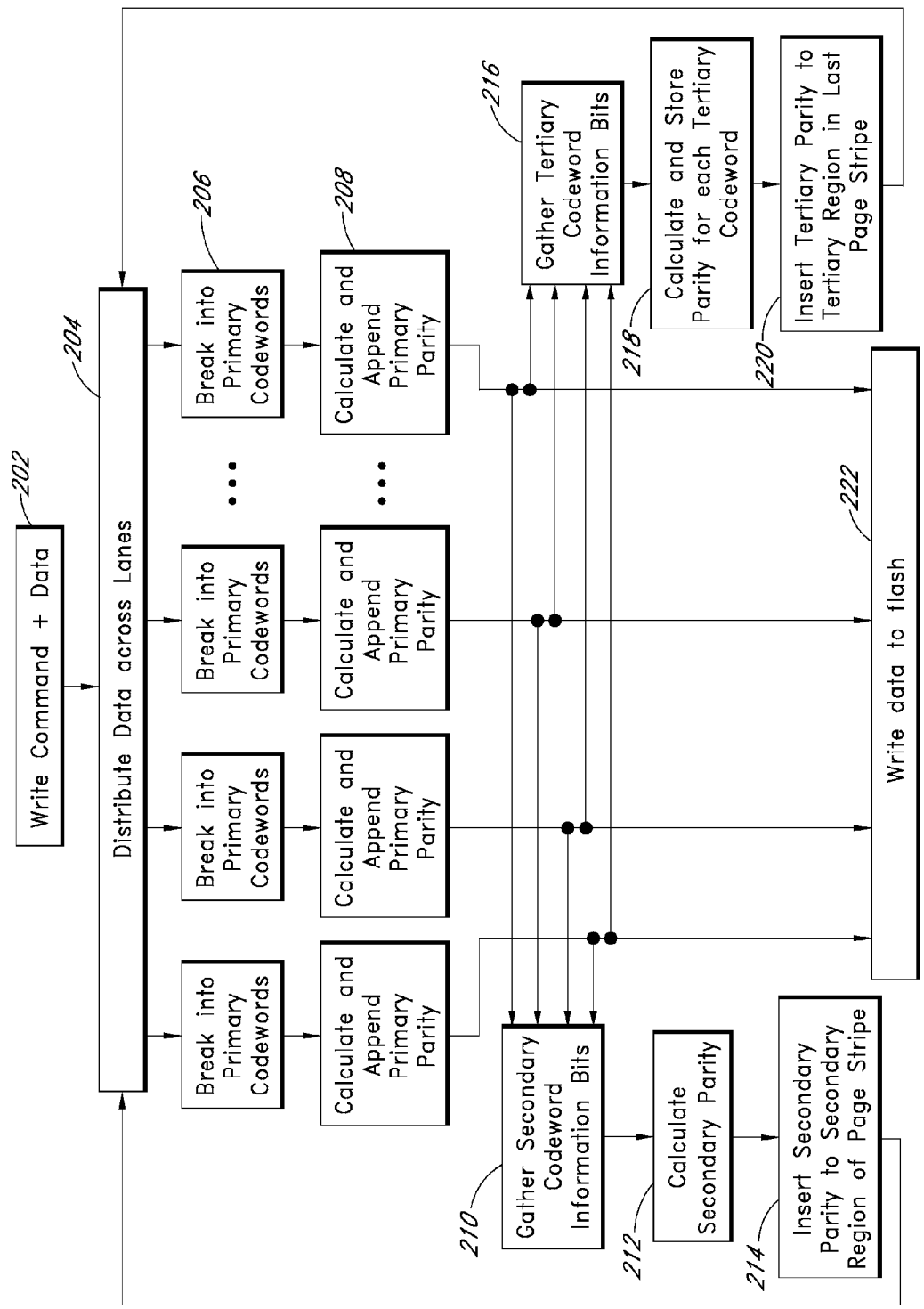
FIG. 2 illustrates a flash programming process according to an embodiment of the invention.

FIG. 2 illustrates a flash programming process, which includes error correction encoding, according to an embodiment of the invention. The process can be implemented by software or firmware executed by a processor, by hardware, or by a combination of both software or firmware and hardware. For example, the process can be performed by a flash drive controller, which will be described later in connection with FIG. 13. It will be appreciated by the skilled practitioner that the illustrated process can be modified in a variety of ways. For example, in one embodiment, various stages can be implemented in a pipelined fashion and/or performed in parallel. For example, in another embodiment, various portions of the illustrated process can be combined, can be rearranged in an alternate sequence, can be removed, or the like. At the start of the process, it is assumed that, when variable, a particular strength of ECC has been selected for the various ECC encoders.

The process begins in a stage 202 in which the process receives a write command and the data (information) to be written. The write command and the data can be received from a journaling engine. As will be explained later, data can also correspond to error correction code from earlier-in-time encoding. The process advances from the stage 202 to a stage 204. The amount of data for each page stripe can be pre-arranged based on the type and strength of the ECC currently selected for the page stripe.

In the stage 204, the process distributes the data among the n lanes of the SSD to which the data will ultimately be written. The lanes can be parallel data buses to which the flash devices of the SSD are connected. In one embodiment, each lane is an 8 bit wide open NAND flash interface (ONFI) bus or a TOGGLE bus. The distribution of data can be done a variety of ways. For example, bit interleaving can be used to distribute the data. In another example, a first received byte can be allocated to a first lane, a second received byte to a second lane, a third received byte to a third lane, a fourth received byte to a fourth lane, a fifth received byte back to the first lane, and so on, to distribute the data among the lanes in a manner similar to a card dealer dealing cards to players. The distribution of the data can be by, for example, splitting a 32-bit data bus into four separate 8-bit buses, one to each of four engines implementing the stages 206. In another embodiment, sequentially received data can be used to fill one entire page (or integer fraction) of a page stripe, and then continue on to fill the next page (or integer fraction) of the page stripe, and so forth. The process advances from the stage 204 to the stages 206. Stage 206 and stage 208 are performed for each lane.

In the stages 206, for a particular lane, the process can be considered to break up the data for the lane into block data sized portions for codewords of that lane. For example, start of block and end-of-information-block markers can be added, and data flow paused until the parity insertion in the stage 208 is complete. The process advances from the stages 206 to stages 208.

Figure 4:
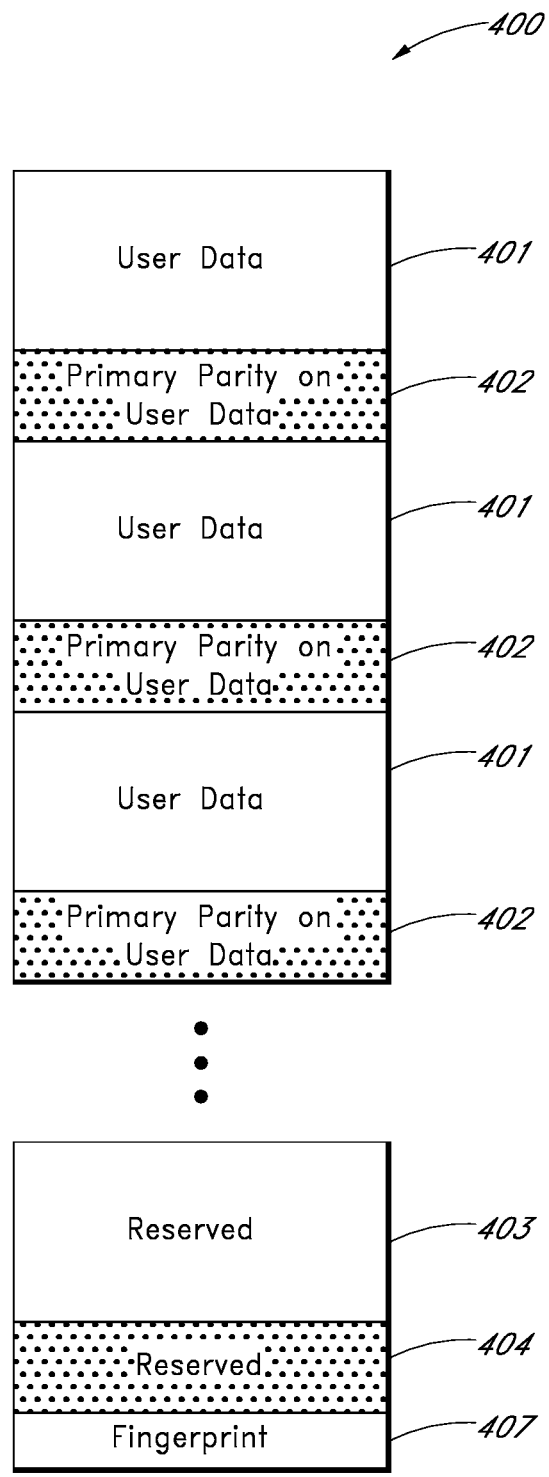
FIG. 4 illustrates an example of storage of user data in a flash page according to an embodiment of the invention.

In the stages 208, the process calculates the ECC parity (the Primary Parity) corresponding to the information portion of the codeword, and inserts said parity into the stream. The resulting data stream is illustrated in FIG. 4. A skilled practitioner will recognize that the illustrated process can be modified in a number of ways, including the use of shortened codes, non-systematic codes, and the like. The process can perform the stages 206, 208 in a pipelined fashion, or in a large batch.

Outputs of the stages 208 are provided to the stage 210 for secondary processing, to the stage 216 for tertiary processing, and to the stage 222 for writing to the flash. It should be noted that data can be written sequentially to the data or cache register of a flash device, so long as the previously written data is not being changed. Alternately, a complete page stripe of data can be accumulated in a data buffer in the controller prior to any write commands being issued. In addition, when writing relatively large amounts of data, it can be desirable to perform write operations in parallel. For example, a flash memory die can have multiple planes that can be written at the same time. Thus, there can be multiple areas of memory set aside for buffers for page stripes and for tertiary parity calculation.

In the stage 210, data from the stages 208 is observed. Each bit is assigned to one of a set of secondary codewords, in accordance with the principles of turbo coding. In a preferred implementation, in which there are Cs secondary codewords for a particular gear, data from each primary codeword is assigned on a round-robin, bitwise basis to the secondary codewords, such that each secondary codeword has a substantially equal number of bits (plus or minus 1) from each primary codeword. The rearranged bits are passed to the stage 212. After the user data and primary parity on user data has been processed, the stage 210 is complete for the page stripe. Secondary parity, tertiary parity, PoSP and PoTP, as will be described later, can be used in the stage 210.

In the stage 212, the assembled bits are treated as the information bits of a secondary ECC code. In one embodiment, the secondary ECC code is a BCH code. In the stage 212, the ECC parity bits corresponding to the information bits of the assembled secondary codewords are calculated. In one embodiment, the operation of the stage 212 is as follows. A scratchpad memory of sufficient size for the parity of all the secondary codewords of a stripe is provided. This memory is set to zero when a page stripe encode is initiated upon entry to the stage 202. Whenever new information bits are assigned to a secondary codeword in the stage 210, then the current value of the scratchpad for that codeword is read and loaded as the state of a linear feedback shift register (LFSR). The new data is shifted into the LFSR, and the revised state written back to scratchpad memory. These LFSR operations can be performed in a single cycle or multiple cycles. After all the secondary codewords for the page stripe have been fully calculated, the process proceeds to the stage 214.

In the stage 214, the secondary parity is read from the scratchpad memory, and formed into a data stream. The secondary parity is passed back to the stage 204, where the secondary parity is treated as if it were user data. In the stage 206, the secondary parity is broken up into sections forming the information bits of primary codewords (which can be of different lengths than the ones used for user data) and in the stage 208, primary parity (termed "primary on secondary parity or PoSP") is calculated over these secondary parity bits. The amount of primary parity calculated over the secondary parity can be different than for the user data. The output of the stage 208 is provided to the stage 216 for tertiary processing, and to the stage 222 for writing to the flash memory.

For the stage 210, in one embodiment, each primary codeword should be covered roughly equally by the applicable secondary codewords, and likewise the information bits of each secondary codeword should contain as even a distribution of bits from primary codewords as practical. This can be achieved by, for example, ensuring that the number of secondary codewords Cs in a page stripe is prime relative to the size (total length) of each primary codeword Np, or by rotating the order of bit assignments to secondary codewords by one position every Cs bits, every Cs times n bits, wherein n is one or more. In one embodiment, the rotation is performed by one position every Cs bytes, that is, with n equal to 8.

The states from the stage 216 through the stage 220 apply to tertiary processing, which operates across a span of two or more page stripes, such as four page stripes. In the stage 210, the stream of primary codewords from the stage 208, including bits originating from both the stage 202 and the stage 214, are observed. Each bit is assigned to a tertiary codeword. In one embodiment, in which each grid contains Wt tertiary codewords based on a Reed-Solomon error correction code defined over Galois field gf($2^{Mt}$) for a particular gear, data from each primary codeword is grouped into symbols of size $2^{Mt}$, and assigned on a symbol-wise round-robin basis to the tertiary codewords, such that each tertiary codeword has a substantially equal number of bytes (plus or minus 1) from each primary codeword, and a roughly equal number of bytes covered by each secondary codeword. The rearranged bits are passed to the stage 218. Padding of implied zeroes may be used to reach an integer number of symbols, according to the known techniques of shortening RS codewords by partial symbols.

In the stage 218, the assembled bits are treated as the information bits of a tertiary ECC code. In a preferred implementation, the tertiary ECC code is an RS code. In the stage 218, the ECC parity bits corresponding to the information bits of the assembled secondary codewords are calculated. In one embodiment, the operation of the stage 212 is as follows. A scratchpad memory of sufficient size for the parity of the tertiary codewords of the page stripes of one or more grids is provided. The scratchpad memory for each page grid 600 (FIG. 6) is set to zero when the first page stripe encode of the grid is started (stage 202 for that page stripe). Whenever new information bits are assigned to a tertiary codeword in the stage 216, the current value of the scratchpad for that codeword is read and loaded as the state of a Reed-Solomon encoding LFSR. The new data is shifted into the LFSR, and the revised state written back to scratchpad memory. These LFSR operations can be done in a single cycle or in multiple cycles. After the tertiary codewords for the page grid have been fully calculated, the process proceeds to the stage 220.

In the stage 220, the tertiary parity is read from the scratchpad memory, and formed into a data stream. The tertiary parity is passed back to the stage 204, in which the tertiary parity is treated as if it were user data. In the stage 206, the tertiary parity is broken up into sections forming the information bits of the primary codewords (which may be of different lengths than the ones used for user data) and in the stage 208, ECC parity (termed "primary on tertiary parity" or PoTP) is calculated over these tertiary parity bits. The amount of primary parity calculated over the tertiary parity may be different than for the user data. The output of the stage 208 is provided to the stage 222 for writing to the flash memory, but not to the stage 210 or the stage 216.

In the operation of the stage 210, each flash page should be covered roughly equally by the corresponding tertiary codewords, and each primary codeword should be covered roughly equally by the tertiary codewords, and likewise the information bits of each tertiary codeword should reflect as even a distribution of bits from the primary codewords as practical. This can be achieved by, for example, ensuring that the number Wt of tertiary codewords in a page grid is prime relative to the size (total length) Np of a primary codeword, or by rotating the order of bit assignments to tertiary codewords by one position every Wt symbols, each tertiary codeword symbol having a size of Mt bits.

In one example in which the tertiary symbol size Mt is 8 bits or one byte, tertiary codeword size Nt is 250 bytes, block data size Kt is 226 Bytes, and each tertiary codeword can correct up to 12 symbol errors, up to 24 erasures, or some mix thereof such that the number of erasures plus twice the number of symbol errors is equal to 24. In one embodiment, the strength of the tertiary ECC is the same for all gears.

Figure 3:
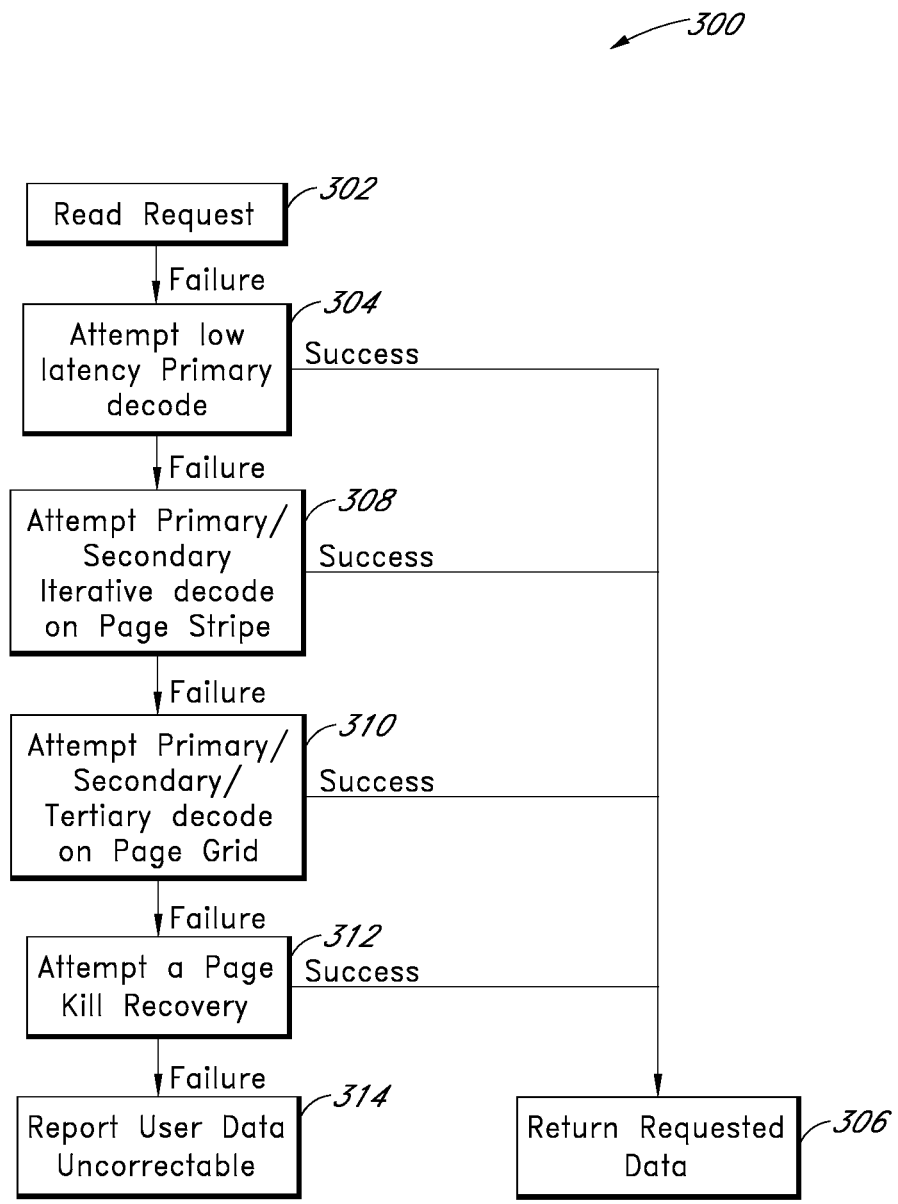
FIG. 3 illustrates an overview of a decoding process.

FIG. 3 illustrates an overview of a decoding process for decoding of information encoded by the process described earlier in connection with FIG. 2. The decoding process can be implemented by software or firmware executed by a processor, by hardware, or by a combination of both software or firmware and hardware. For example, the decoding process can also be performed by a solid-state drive controller, which will be described later in connection with FIG. 13.

FIG. 3 provides a high level overview of one embodiment of a process of retrieving and recovering data from the flash memory. It will be appreciated by the skilled practitioner that the illustrated process can be modified in a variety of ways. For example, in another embodiment, various portions of the illustrated process can be combined, can be rearranged in an alternate sequence, can be removed, or the like. In the stage 302, the process receives a request to read certain data from the flash memory. In the stage 304, an attempt is made to recover the data with minimal latency. The stage 304 will be described in greater detail later in connection with a partial page stripe decoding portion 304 of the process of FIG. 8, with stages 802-804. If that fails, a second attempt to recover data is made with a stage 308, using additional data stored in the flash memory, and additional error correction processing. The stage 308 will be described later in greater detail later in connection with a page stripe decoding portion 308 of the process of FIG. 8. If the stage 308 fails, then a third attempt is made with a stage 310, using still further add additional data previously stored in the flash memory, and further additional processing. The stage 310 will be described greater detail later in connection with the page grid decoding portion 310 of the process of FIG. 8. If the stage 310 fails, it can be because one particular page, block, or die in the flash array has failed entirely. Thus, a fourth attempt is made with a stage 312, using special recovery techniques that will be described in greater detail later in connection with FIG. 10.

Figure 10:
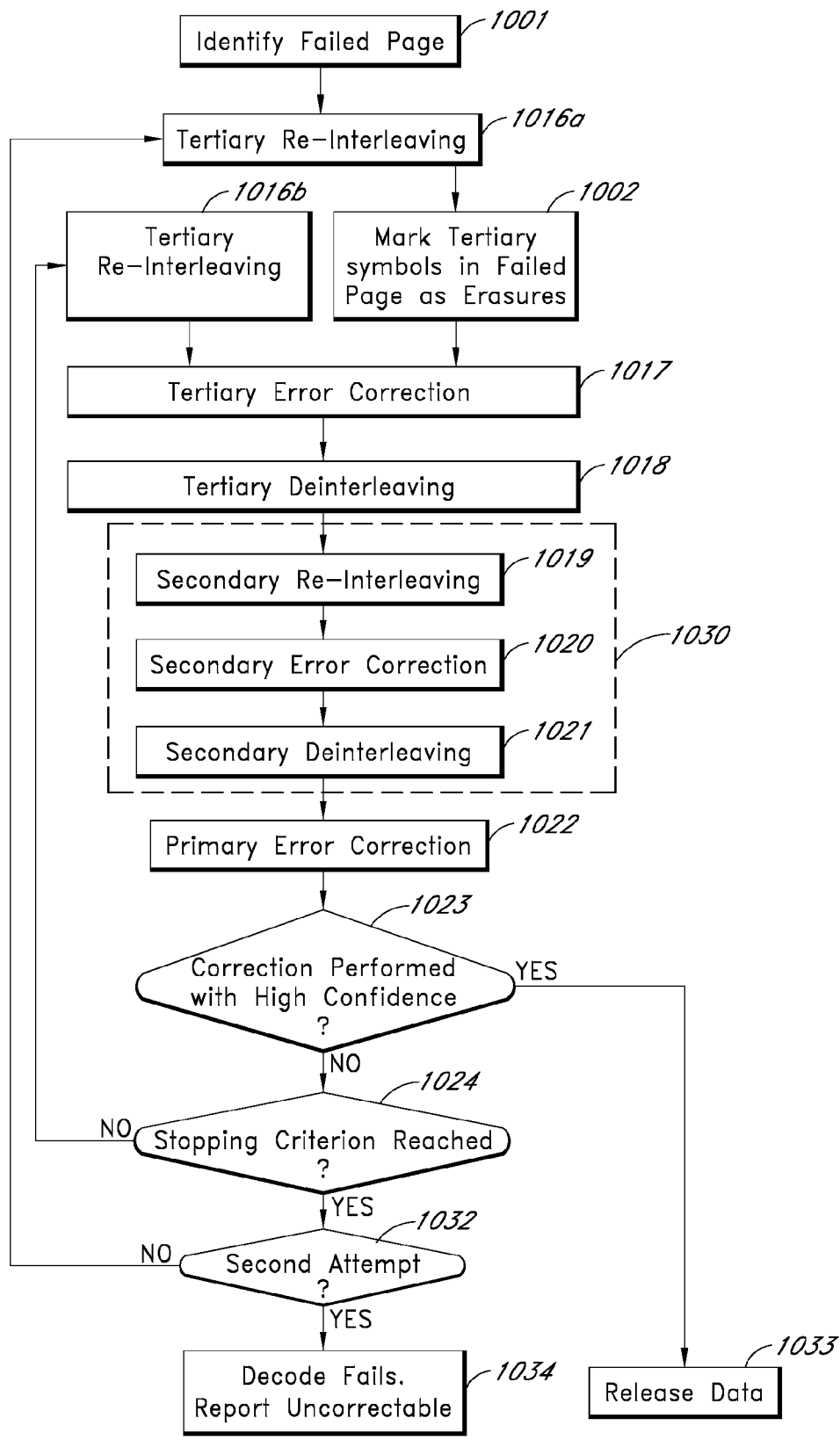
FIG. 10 illustrates an example of a process for recovery of a failed page.

If the recovery process of the stage 312 fails, then the user data is uncorrectable, and a report to that effect is made in the stage 314 and in a stage 1034 (FIG. 10). If any of the stages 304, 308, 310, 312 is successful, the requested data is returned to the journaling engine in a stage 306, along with various status information. The stage 306 is represented in more detail by the stages 805, 830, 832 (FIG. 8) and the stage 1034 (FIG. 10).

FIG. 4 illustrates an arrangement for user data stored in a flash page having the same size as that of FIGS. 1A and 1B along with primary ECC data. An arrangement of secondary ECC and tertiary ECC will be described later in connection with FIGS. 5 and 7. Rather than storing the user data in relatively large portions such as shown in the user space 101 (FIG. 1A) and the user data 103 (FIG. 1B) illustrating 4096 byte portions and 1024 byte portions, respectively, the illustrated embodiment preferably stores the user data in much smaller portions. In one embodiment, the user data 401 (information) to be stored to a flash page 400 is divided into portions of a length Kp convenient to or efficient for the primary BCH. In an alternative embodiment, the user data 401 is divided into a portion having a length corresponding to a multiple of Kp payload symbols. After each Kp payload symbols, a number of BCH parity bits Pp are added 402, for a total of Np parity symbols. The values of Kp and Pp are different for each ECC gear, and can be selected for the desired correction capability, balanced with ease of implementation. ECC gearing will be discussed in greater detail later in connection with FIG. 11. Example values for Kp and Pp are illustrated in Table III. The block data for the primary data includes user data and sometimes metadata. The block data size Kp is not required to have a simple arithmetic relationship to the size of the block used by the file system.

After the information bits for that page and their primary parity are added, a region 403 is reserved for the storage of secondary parity, which in the illustrated embodiment, is calculated over a page stripe, which will be described later in connection with FIGS. 5 and 7. A region 404 is also reserved for primary parity on secondary parity (PoSP), that is, ECC parity information for the data to be stored in the region 403.

Preferably, space is also reserved for a fingerprint 407 or check code, which can be derived or determined from the physical address of the flash page. The fingerprint 407 can be used to verify whether or not an address fault has occurred, that is, determine whether or not the retrieved data came from the correctly addressed memory space. In one embodiment, the fingerprint 407 is derivable from a physical location, such as address, of the page 400. Anything can be used for the fingerprint 407 so long as it identifies the page 400 uniquely, at least for a particular lane. Two pages on different lanes can use the same fingerprint 407 because they are physically separated and there is no risk of retrieving data across physically distinct lanes. Many different techniques can be used. In one embodiment, a hash code generated from the physical address or at least a portion of the physical address is used. The hash code preferably has a relatively large hamming distance such that one or more errors can be tolerated. The hash code can be based on a BCH calculation, on CRCs or the like. Alternatively, the address itself and corresponding ECCs can be used, but there is no need to store the actual address itself and it would thus be a relatively inefficient use of memory space. The use of the address by itself without corresponding ECC could be used, but an address line failure can result in a change of just one address bit, which in the data could be subject to a random bit error and then be erroneously reported as correct. All that is needed is a unique identifier such that the page can be identified in some repeatable manner such that the SSD controller can compare the fingerprint 407 retrieved from flash memory to an expected value for the fingerprint.

Figure 5:
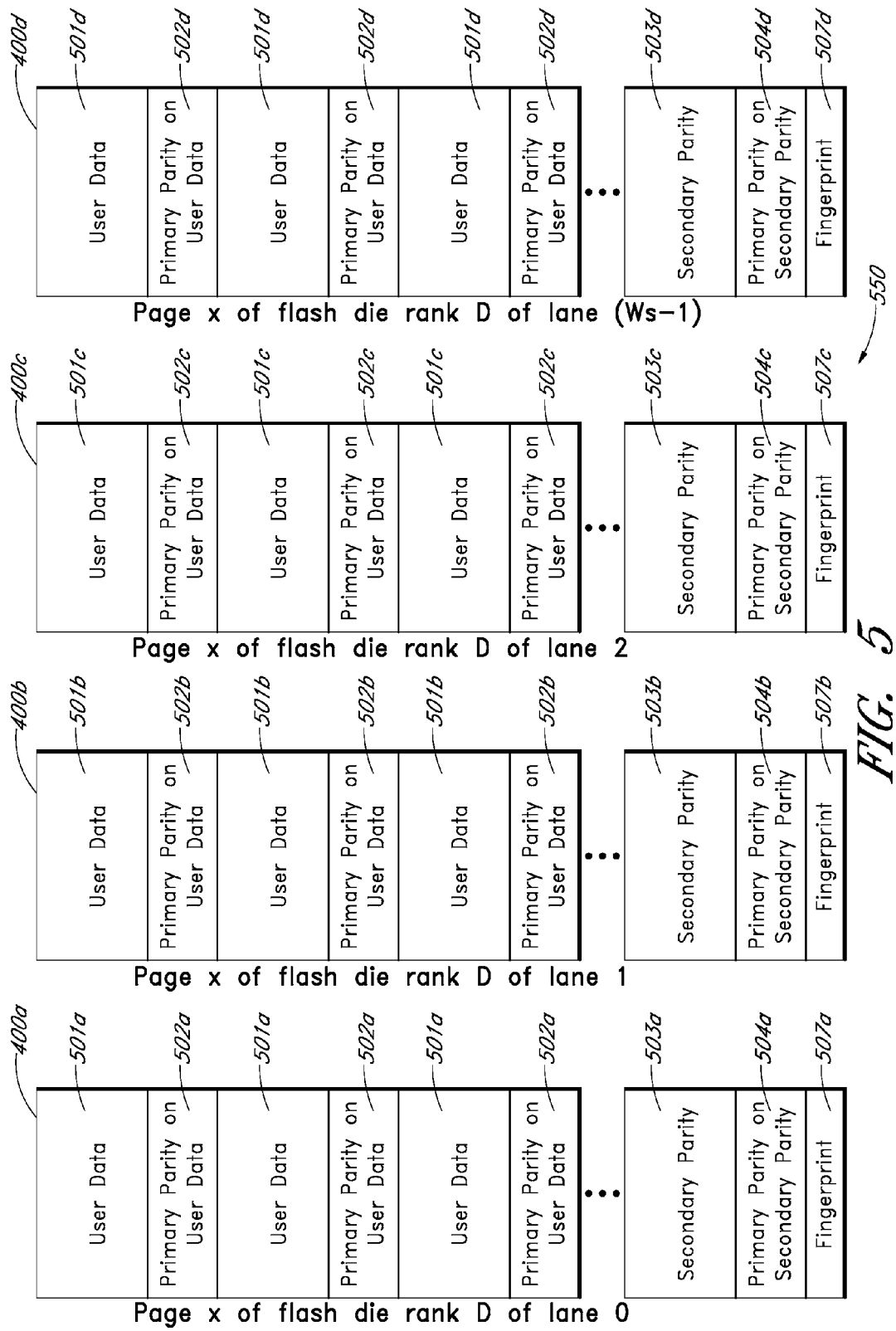
FIG. 5 illustrates an example of an arrangement for flash page stripe other than the last page stripe according to an embodiment of the invention.

FIG. 5 illustrates an example of an arrangement for a first type of flash page stripe 550 according to an embodiment of the invention. An example of an arrangement for a second type of flash page stripe 640 used for the last page stripe will be described in greater detail later in connection with FIG. 7. The stripe width Ws of the flash page stripe 550 can be within a broad range of numbers of one or more, but for efficiency should match the number of lanes. In the illustrated embodiment, four flash pages 400a-400d each in its own lane are used such that the stripe width Ws is 4 with lanes 0 to 3. Other values for the stripe width Ws will be readily determined by one of ordinary skill in the art.

In the illustrated embodiment, the flash pages 400a-400d of the page stripe 550 share the same address, but belong to different flash lanes, such as to different bits of a data bus. Each of the flash pages 400a-400d can be as described earlier for the flash page 400 of FIG. 4. In addition, note the following. In the illustrated embodiment, user data 501a-501d (information) can be distributed among the four flash pages 400a-400d on a byte interleaved round-robin basis as described earlier in connection with the distribution of data among 4 lanes in the stage 204 of FIG. 2. In one embodiment, the user data 501a-501d is scrambled before being stored and unscrambled after it has been decoded as will be described in greater detail later in connection with a decision block 804 of FIG. 8. Of course, as more and more data is stored, it will eventually become necessary to write data to different pages of the lanes. Primary parity 502a-502d is added on each flash page 400a-400d as described earlier in connection with the stage 208 of FIG. 2.

As each bit (whether information bit or parity bit) is written to a user data portion 501a-501d or to a primary parity portion 502a-502d of the page stripe 550, the bit is also used in the calculation of one of the Cs secondary ECC codewords, preferably on an individual bit interleaved basis for robustness. The secondary ECC codewords can be maintained in scratchpad memory, such as a register or RAM, while the secondary ECC codewords are being computed. The secondary parity calculation for a particular codeword of the Cs secondary codewords is updated as new bits are covered by the particular codeword. After the incoming user data (information) and primary parity bits have been processed by the secondary ECC encoding process, the secondary parity calculation can be finalized, and the secondary parity can be written to the secondary parity portion 503a-503d of the flash page stripe 550. In one embodiment, the secondary parity is stored on the flash page stripe 550 on a bit-interleaved manner across the entire flash page stripe 550.

Primary parity is calculated over the secondary parity bits written to each flash page, that is, over the data stored in the portions 503a-503d, and stored in the PoSP portions 504a-504d. A fingerprint 507a-507d for each flash page 400a-400d is preferably added to determine whether or not the retrieved data came from a read of the correct memory address as described earlier in connection with the fingerprint 407 for FIG. 2 for further robustness. The same fingerprint 507a-507d can be reused across the pages 400a-400d of a particular page stripe 550 provided that the pages 400a-400d are each in separate lanes because each lane is physically a different set of conductive lines, and thus, unique identification of data is preserved.

Figure 6:
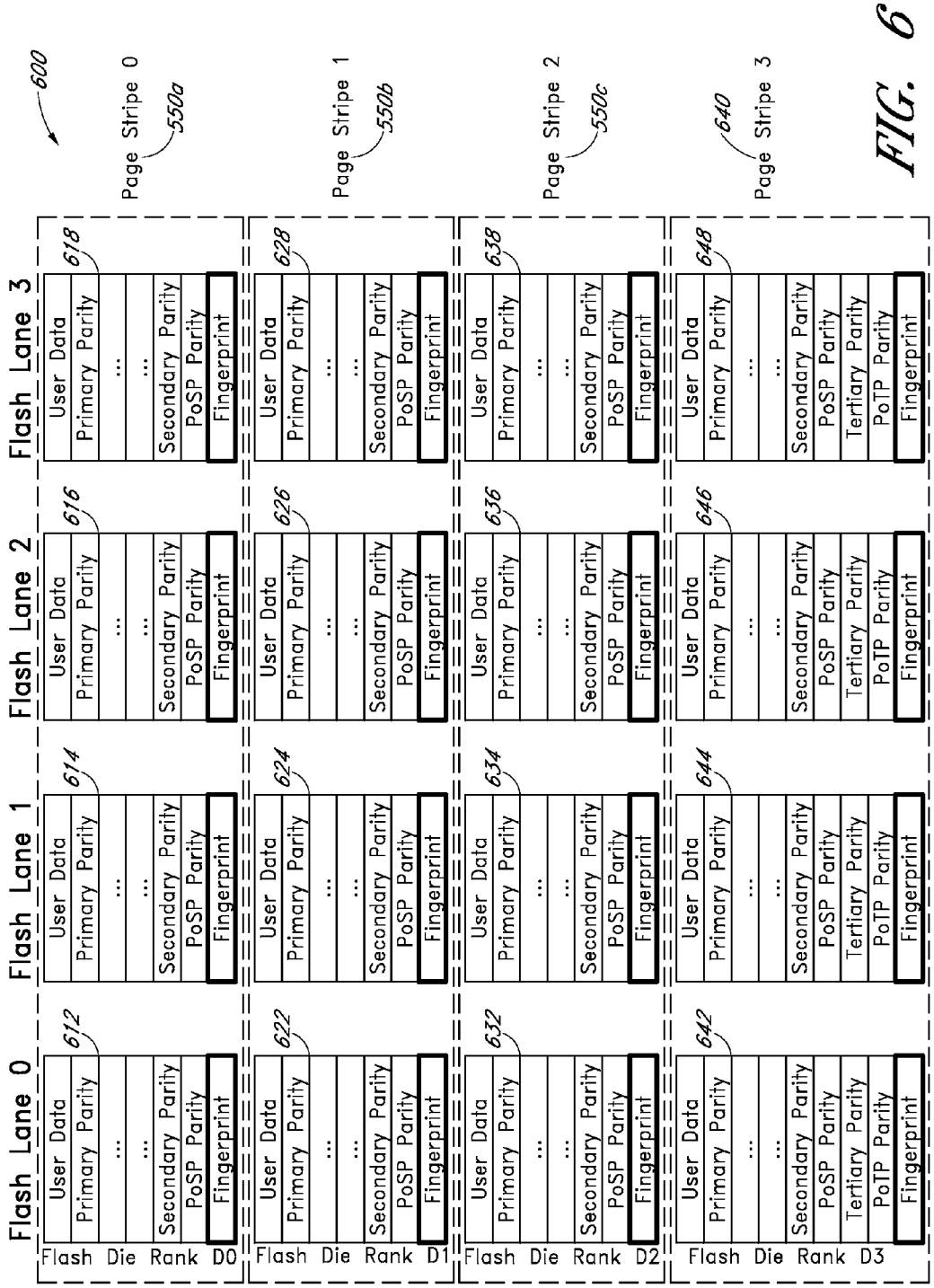
FIG. 6 illustrates an example of a flash page grid arrangement according to an embodiment of the invention.

FIG. 6 illustrates a page grid 600. The address space of the flash memory is divided into many page grids 600. Preferably, a page grid 600 includes an associated set of pages, each from a different flash memory die. However, it will be understood that the principles and advantages described herein will be applicable to systems in which a page grid uses more than one page each or less than one page each from each flash memory die. For example, it can be advantageous to build grids from multiple partial pages, each from a separate die, or to build grids from multiple pages on separate planes of the same die, or both. In addition, while the illustrated page grid 600 has a "square" arrangement with 4 pages across (from 4 lanes) and 4 pages down (from 4 page stripes), the page grid 600 does not have to be square, nor is it required that the page stripes making up the page grid 600 be encoded with the same gear.

The pages of the page grid 600 are already associated in a page stripe. In the illustrated embodiment, a page grid 600 is made up of four page stripes 550a, 550b, 550c, 640 having a rank of 4 each, thus the page grid 600 has 16 pages 612, 614, 616, 618, 622, 624, 626, 628, 632, 634, 636, 638, 642, 644, 646, 648 from 16 different die. Of these page stripes 550a, 550b, 550c, 640, the first three page stripes 550a, 550b, 550c are of the first type of flash page stripe 550 described earlier in connection with FIG. 5, and the last page stripe 640 is of the second type of flash page stripe 640 that will be described later in connection with FIG. 7. The number of lanes and the amount of rank can vary in a very broad range and do not have to be the same. For example, 4 lanes and a rank of 8 will also work. A relatively larger number of lanes will typically have more throughput, but can be more complicated to implement with wider data buses and so forth. Thus, the selection of the number of lanes to have and the deepness of rank is subject to an engineering tradeoff.

In the illustrated embodiment, data fills the page grid 600 as follows. Initially, data to be written is written to the first page stripe 550a. When the first page stripe 550a is filled with data, then data is written to the second page stripe 550b. When the second page stripe 550b is filled, then data is written to the third page stripe 550c. When the third page stripe 550c is filled, then data is written to the last page stripe 640 of the page grid 600. When the last page stripe 640 is filled, then subsequent data is stored to a different page grid. In addition, within each page stripe, data is distributed among the pages of the page stripe in a round-robin manner. For example, with respect to the first page stripe 550a, a symbol of data is stored in the first page 612, then the next symbol of data is stored in the second page 614, then the next symbol of data is stored in the third page 616, then the next symbol of data is stored in the fourth page, then the next symbol of data is stored in the first page 612, and so on until the first page stripe 550a is filled. In the illustrated embodiment, the symbol size used for storage in the pages corresponds to a byte or 8 bits, but other sized symbols can be used.

The data within each page 612, 614, 616, 618, 622, 624, 626, 628, 632, 634, 636, 638, 642, 644, 646, 648 in the page grid 600 is covered by its own set of primary parity data 402 (FIG. 4), 502a-502c (FIG. 5). The data within a page stripe 550a, 550b, 550c, 640 is also protected by a secondary parity 503a-503d (FIG. 5), which in turn is protected within the individual pages by the PoSP 504a-504d. The pages 642, 644, 646, 648 of the last page stripe 640 of the page grid 600 also carry the tertiary parity 705a-705d and the primary over tertiary parity (PoTP) 706a-706d bits as will be described in greater detail later in connection with FIG. 7. The tertiary parity bits 705a-705d protect the page grid 600 as a whole and are stored in the last page stripe 640.

In one embodiment of the invention, the allocation of bits from allocation blocks to codewords is as follows. For the purposes of this calculation, the bits of a page stripe are numbered starting from 0, such that the first bit of the first byte of lane 0 is bit 0; the last bit of the first byte of lane 3 is bit 31; the first bit of the second byte of lane 0 is bit Ws*8, and so on. The endianness of the bits, for example, byte order, is not important, so long as consistency is maintained. For the purposes of these equations, "div" represents integer division rounding down, and "mod" represents the modulo operator. For example, 11 div 4 equals 2, and 11 mod 4 equals 3. In the illustrated embodiment, the page stripe width Ws is 4.

In the illustrated embodiment, user data from an allocation block is allocated on a bytewise basis to one of Ws primary codewords at a time, that is, one primary codeword per lane). The size or length of each primary codeword is represented by Np. After each primary codeword has (Np div 8) bytes, the next set of Ws codewords are used. Mathematically, the primary codeword P to which bit x is allocated can be as expressed in Eq. 3.

$$P(x)=4(x \text{ div } \{Np \cdot Ws\})+(x \text{ div } 8) \text{mod } Ws \qquad \text{Eq. 3}$$

Data is also allocated on a bytewise basis to one of Cs secondary codewords, where Cs corresponds to the number of secondary codewords for the page stripe. Every Cs bytes, a 1-lane rotation is applied to the secondary codewords, to avoid the same secondary codeword falling in the same lane. Mathematically, the secondary codeword to which bit x is allocated can be as expressed in Eq. 4.

$$S(x)=s'(x)-[s'(x) \text{mod } Ws]+[\{s'(x)-i(x)\} \text{ mod } Ws] \qquad \text{Eq. 4}$$

The variables s'(x) and i(x) can be solved as expressed in Eq. 5 and Eq. 6, respectively.

$$s'(x)=(x \text{ div } 8) \text{mod } Cs \qquad \text{Eq. 5}$$

$$i(x)=(x \text{ div } 8) \text{div } Cs \qquad \text{Eq. 6}$$

Data is also allocated on a bytewise basis to one of Ct tertiary codewords. Every Ct bytes, a 1-lane rotation is applied to the tertiary codewords, to avoid the same tertiary codeword falling in the same lane. Mathematically, the tertiary codeword to which bit x is allocated can be as expressed in Eq. 7.

$$T(x)=[t'(x) \text{mod } Ws]+[\{t'(x)-i(x)\} \text{ mod } Ws] \qquad \text{Eq. 7}$$

The variables t'(x) and i(x) can be solved as expressed in Eq. 8 and Eq. 9, respectively.

$$t'(x)=(x \text{ div } 8) \text{mod } Ct \qquad \text{Eq. 8}$$

$$i(x)=(x \text{ div } 8) \text{div } Ct \qquad \text{Eq. 9}$$

Primary ECC on the secondary parity (PoSP) and primary ECC on the tertiary parity (PoTP) can follow the same rules as the primary, but the values of the codeword length N, the number of information bits in a codeword K, the number of codewords C per page stripe, and the correction capability of the ECC or FEC T can be adjusted to make the bits fit into the available space.

The bytewise allocation of data to the secondary means that a given primary codewords and secondary codeword tend to share an integer number of bytes. This is convenient from an implementation point of view, but it can mean that the maximum overlap will tend to be greater, for example 16 bits, than the minimum possible, for example 14 bits. This condition can lead to "killer pattern" situations in which a small number of errors (for example, 11 errors within a particular 16 bit overlap, in which Ts<Tp<11). However, these patterns inherently require multiple bits errors within a single byte. A Reed-Solomon based tertiary is very efficient at fixing such "killer patterns."

Various alternatives exist. For example, in an alternative embodiment of the invention, the allocation of bits to codewords can be as follows. Data is allocated on a bytewise basis to one of Ws Primary codewords at a time, that is, one primary codeword per lane). Once each codeword has (Np div 8) bytes, the next set of Ws codewords are used. Mathematically, the primary codeword to which bit x is allocated can be as expressed in Eq. 10.

$$P(x)=4[x \text{ div}(Np-Ws)]+(x \text{ div } 8) \text{mod } Ws \qquad \text{Eq. 10}$$

Data is allocated on a bitwise basis to the Cs secondary codewords. Cs is a prime number, or at least relatively prime to both Cp and Ws.

$$S(x)=x \text{ mod } Cs \qquad \text{Eq. 11}$$

Data is allocated on a bytewise basis to one of Ct tertiary codewords. Ct is a prime number, or at least relatively prime to Cp, Cs, and Ws. Mathematically, the tertiary codeword to which bit x is allocated can be as expressed in Eq. 12.

$$T(x)=(x \text{ div } 8) \text{mod } Ct \qquad \text{Eq. 12}$$

In yet another embodiment of the invention, the allocation of bits to codewords can be as follows. Data is allocated to each primary codeword until it is full. Thus, in this embodiment, every primary codeword is across all Ws lanes. Data is allocated to the Cs secondary codewords on a round-robin basis.

Tertiary codewords need not be present. If tertiary codewords are present, data can be allocated on a bytewise basis to one of Ct tertiary codewords. Ct should be a prime number, or at least prime relative to Cp, Cs, and Ws. Mathematically, the tertiary codeword to which bit x is allocated can be as expressed in Eq. 13.

$$T(x)=(x \text{ div } 8) \text{mod } Ct \qquad \text{Eq. 13}$$

Figure 7:
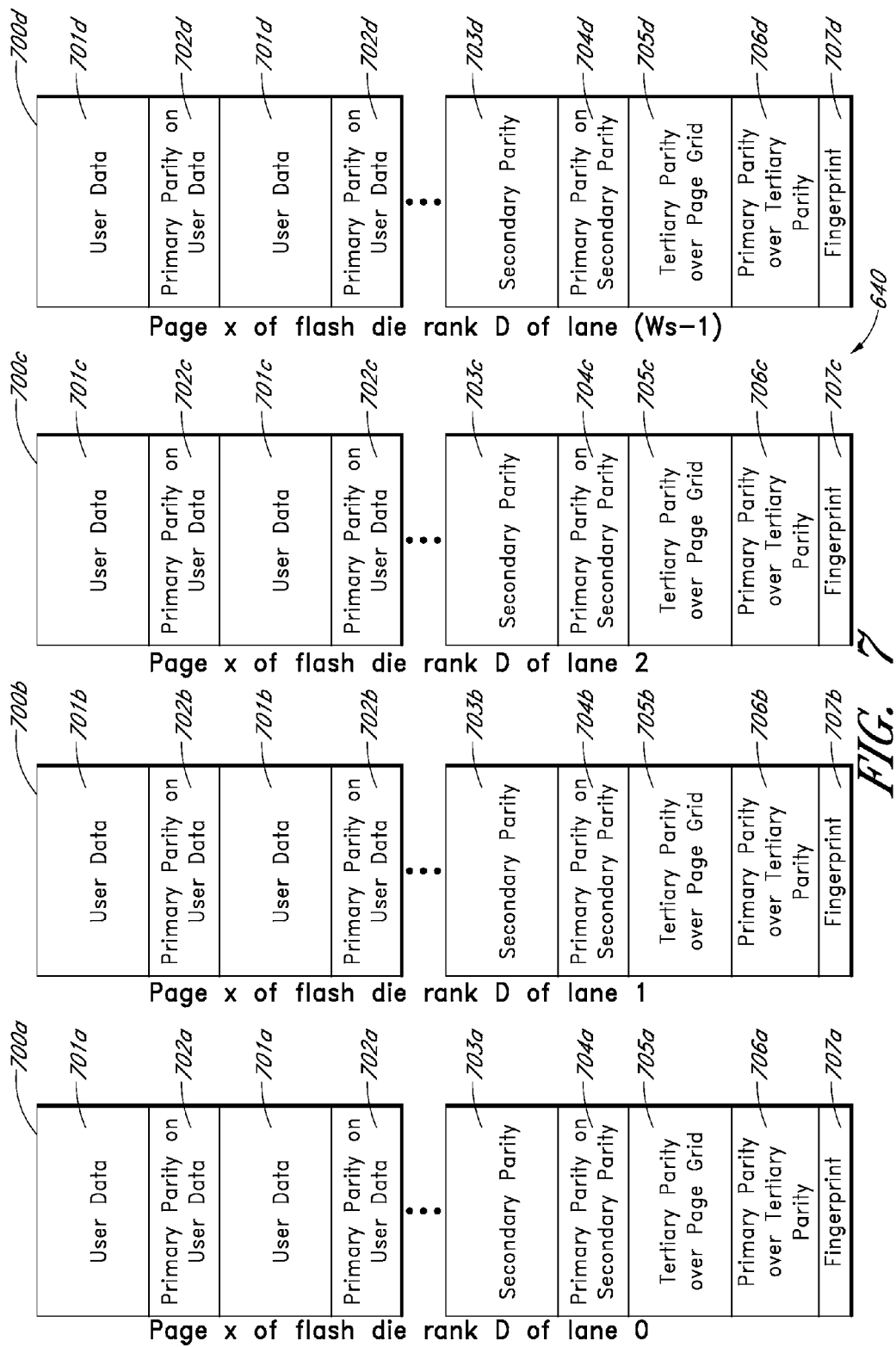
FIG. 7 illustrates an example of a flash page stripe arrangement for the last page stripe of a page grid according to an embodiment of the invention.

FIG. 7 illustrates a structure for the last page stripe 640 (FIG. 6) of the page grid 600. The illustrated last page stripe 640 of the page grid 600 includes four flash pages 700a-700d. However, the stripe width Ws can vary as described earlier in connection with the flash pages 400a-400d of FIG. 5.

The structure of the last page stripe 640 can be similar to the page stripe 550 described earlier in connection with FIG. 5, but has additional tertiary ECC and less user data space. The last page stripe 640 holds user data 701a-701d, primary parity on user data 702a-702d, secondary parity 703a-703d, primary parity on secondary parity (PoSP) 704a-704d, and fingerprints 707a-707d, which are analogous to the user data 401, 501a-501d, primary parity on user data 402, 502a-502d, secondary parity 503a-503d, primary parity on secondary parity (PoSP) 504a-504d, fingerprints 407, 507a-507d respectively, described earlier in connection with FIGS. 4 and 5.

The total user data space is smaller, holding less user information than other page stripes 550 (FIG. 5) 550a, 550b, 550c (FIG. 6) because the last page stripe 640 additionally holds tertiary error correction information for the corresponding page grid. The ECC encoding parameters, such as the number of primary codewords Wp, number of information bits Kp per primary codeword, number of bits Np per primary codeword, number of information bits Ks per secondary parity, number of bits Ns per secondary codeword, number of secondary codewords Cs per page stripe can vary somewhat from the ECC encoding parameters used for the other page stripes 550a, 550b, 550c to allow for efficient packing. An example of sample ECC parameters will be described later in tables following a discussion of FIG. 7. The ECC encoding parameters of this last page stripe 640 are preferably selected so that the error correction capability is at least as good as for the other page stripes.

The last page stripe 640 holds the parity bits of the tertiary codewords, that is, the "tertiary parity" 705a-705d, which are calculated bytewise over the user data 501a-501d, 701a-701d, the primary parity 502a-502d, 702a-702d, the secondary parity 503a-503d, 703a-703d, and the PoSP 504a-504d, 704a-704d portions of all the page stripes 550a, 550b, 550c, 640. Thus, every bit of the user data 501a-501d, 701a-701d is covered by at least one primary codeword, one secondary codeword, and one tertiary codeword. The allocation can be performed such that each tertiary codeword has an approximately equal number of bytes from each page of the page grid 600.

The correction capability Tt of the tertiary parity 705a-705d should be chosen to be high enough to be able to find the values of all the bytes in any one page (if that page is marked as an erasure, that is, marked as unknowns) of the page grid 600, which then permits the rebuilding of a lost page. For example, a page of memory can be lost due to the failure of a row in a flash memory. The correction capability Tt of the tertiary parity 705a-705d should additionally have three-quarters of the correction capability of the secondary parity 503a-503d, 703a-703d on one page stripe 550a, 550b, 550c, 640 for the case of 4 pages or portions of pages per page stripe. This latter requirement is based on the assumption that, if one page of the page grid 600 fails entirely, the secondary parity 503a-503d, 703a-703d for the corresponding page stripe 550a, 550b, 550c, 640 will also be inoperative without correction provided by the tertiary parity 705a-705d. The tertiary parity 705a-705d is itself covered by an appropriately resized primary ECC parity over tertiary parity (PoTP) 706a-706d. Further details of the correction capability Tt of the tertiary parity 705a-705d can be as follows. Generally, the extra correction capability can be Ws−1/WsWg of the secondary parity, wherein Ws is the number of pages in a page stripe, and WsWg is the number of pages in a page grid. In the illustrated example, Ws is 4 and WsWg is 16, such that correction capability Tt of the tertiary parity should further include 3/16 of the correction capability of the secondary error parity such that, in the illustrated example, the correction capability Tt for the tertiary parity should be able to correct for a missing page and 3/16 of the correction capability of the secondary parity. It will be understood that the 3/16 figure will vary depending on the number of pages or portions of pages per page stripe and the number of page stripes per page grid.

In one embodiment, the tertiary ECC has a correction capability equal to (a) half of the maximum number of symbols that each tertiary codeword has on any one page of the page grid, plus( ) at least TTs*(Ws−1)/(Wt*Wg*Ws) symbols, wherein TTs corresponds to the total correction capability of ECC codewords calculated across multiple pages of a page stripe, Ws corresponds to the number of pages in a page stripe, Wt corresponds to the number of tertiary codewords, and Wg corresponds to the number of page stripes in a page grid.

The tertiary code is preferably an erasure code, that is, a code that is tolerant of missing symbols. Such a code has improved decoding capability when certain portions of the codewords are known to be highly errored. The property of being an erasure code can permit the recovery of data even if an entire page of data were to become unreadable as can happen when a die goes bad or when there is a problem with a row in a memory chip. In one embodiment, the tertiary code is a Reed-Solomon (RS) code. In alternative embodiments, the tertiary code can be a Low density parity check (LDPC) code, Tornado code, Online code, Luby transform (LT) code, Raptor code, or the like. Other applicable erasure codes will be readily determined by one of ordinary skill in the art. In one embodiment, the strength of the tertiary code does not vary with the "gearing" of ECC, which will be discussed in greater detail later in connection with FIG. 11. The tertiary code can deal with a total failure, which can happen at any time, whereas the primary and secondary codes are intended to cover wear out, which happens gradually.

It is not necessary to wait for a complete page grid to be available before writing data to flash. Interim state values for the tertiary parity calculation can be held in scratchpad memory after each page stripe, and the calculation resumed on arrival of the next page stripe. In one embodiment of the invention, a plurality of page grids are programmed in an interleaved fashion. Each page stripe is identified by a thread ID, associated with a region of scratchpad RAM and a set of interim tertiary values. As each page stripe arrives, an encoder retrieves any interim tertiary values, initializes the tertiary encoders, processes the page stripe, and then either stores the new interim values back to scratchpad, or writes out the completed tertiary parity, as appropriate.

The illustrated embodiment has 4 pages per page stripe, and 4 page stripes per page grid 600. An example of physical capacities of each is described in connection with Table II, with corresponding ECC parameters in Tables III to VII.

TABLE II

|  | Page | Stripe | Grid |
| --- | --- | --- | --- |
| No. of Pages | 1 | 4 | 16 |
| Capacity in Bytes | 4320 | 17280 | 69120 |

Table III illustrates an example of data allocation for a first gear, second gear, and third gear amount of ECC strength for the primary ECC with reference to page stripe 0 550a, page stripe 1 550b, page stripe 2 550c, and page stripe 3 640 (FIG. 6). As illustrated in the table, increasing ECC strength corresponds to decreasing ratio R. As illustrated in Table III, in the illustrated embodiment, the primary payload of a page stripe is not an integer multiple of 512, 530, 1024, or 2048 bytes, which can be examples of allocation block sizes. However, the primary payload can vary in a very broad range and in alternative embodiments a particular page stripe and ECC strength can combine to generate a payload having a multiple of the allocation block size.

TABLE III

| Page Stripe | First Gear | | Second Gear | | Third Gear | |
|---|---|---|---|---|---|---|
| | 0, 1, or 2 | 3 | 0, 1, or 2 | 3 | 0, 1, or 2 | 3 |
| Primary Payload (536-byte 'Journaling Cells') | 30 | 16 | 27 | 14 | 21 | 11 |
| Primary Payload (Information Bytes) | 16080 | 8576 | 14472 | 7504 | 11256 | 5896 |
| Primary codeword information (bits) (Kp) | 1792 | 1560 | 1816 | 1504 | 808 | 848 |
| Primary parity bits per codeword (Pp) | 110 | 110 | 198 | 198 | 264 | 264 |
| Rp = Kp/Np | 0.942 | 0.934 | 0.902 | 0.884 | 0.754 | 0.763 |
| Correction capability (Tp) | 10 | 10 | 18 | 18 | 24 | 24 |
| Primary codewords per page | 18 | 11 | 16 | 10 | 28 | 14 |
| Primary codewords per page stripe (WP) | 72 | 44 | 64 | 40 | 112 | 56 |
| Fractional Shortening | FStFP by Page | FStFP by Page | FStFP by Page | FStFP by Page | FStFP by Page | FStFP by Page |
| Total primary parity bits per page stripe | 7920 | 4840 | 12672 | 7920 | 29568 | 14784 |

Table IV illustrates an example of data allocation for the secondary ECC.

TABLE IV

| Page Stripe | First Gear | | Second Gear | | Third Gear | |
|---|---|---|---|---|---|---|
| | 0, 1, or 2 | 3 | 0, 1, or 2 | 3 | 0, 1, or 2 | 3 |
| Secondary Payload (Primary Codeword Bytes) | 17072 | 9184 | 16056 | 8496 | 14952 | 7744 |
| Secondary codeword length (bits) (Ns) | 1018 | 498 | 956 | 692 | 990 | 734 |
| Secondary codeword information (bits) (Ks) | 1008 | 488 | 896 | 632 | 880 | 624 |
| Secondary parity bits per codeword (Ps) | 10 | 10 | 60 | 60 | 110 | 110 |
| Rs = Ks/Ns | 0.990 | 0.980 | 0.937 | 0.913 | 0.889 | 0.850 |
| Secondary Correction capability (Ts) | 1 | 1 | 6 | 6 | 11 | 11 |
| Secondary codewords per page stripe (Ws) | 136 | 152 | 144 | 108 | 136 | 100 |
| Fractional Shortening | FStFP by PgStr | FStFP by PgStr | FStFP by PgStr | FStFP by PgStr | FStFP byPgStr | FStFP by PgStr |
| Total secondary parity bits per page stripe | 1360 | 1520 | 8640 | 6480 | 14960 | 11000 |

Table V illustrates an example of data allocation for the primary over secondary parity (PoSP) ECC.

TABLE V

| Page Stripe | First Gear | | Second Gear | | Third Gear | |
|---|---|---|---|---|---|---|
| | 0, 1, or 2 | 3 | 0, 1, or 2 | 3 | 0, 1, or 2 | 3 |
| PoSP Payload (Secondary Parity bytes from 1 stripe) | 172 | 192 | 1080 | 812 | 1872 | 1376 |
| PoSP codeword length (bits) (Np) | 388 | 428 | 1190 | 926 | 1512 | 1640 |

TABLE V-continued

|  | First Gear | | Second Gear | | Third Gear | |
| --- | --- | --- | --- | --- | --- | --- |
| Page Stripe | 0, 1, or 2 | 3 | 0, 1, or 2 | 3 | 0, 1, or 2 | 3 |
| PoSP codeword information (bits) (Kp) | 344 | 384 | 1080 | 816 | 1248 | 1376 |
| PoSP parity bits per codeword (Pp) | 44 | 44 | 110 | 110 | 264 | 264 |
| R = K/N | 0.887 | 0.897 | 0.908 | 0.881 | 0.825 | 0.839 |
| Correction capability (Tp) | 4 | 4 | 10 | 10 | 24 | 24 |
| PoSP codewords per page stripe (Wposp) | 4 | 4 | 8 | 8 | 12 | 8 |
| Fractional Shortening | FStFP by PgStr | FStFP by PgStr | FStFP by PgStr | FStFP by PgStr | FStFP by PgStr | FStFP by PgStr |
| Total PoSP parity bits per page stripe | 138112 | 75160 | 137968 | 75328 | 137760 | 75072 |

Table VI illustrates an example of data allocation for the tertiary ECC.

TABLE VI

|  | First Gear | Second Gear | Third Gear |
| --- | --- | --- | --- |
| Page Stripe | 3 | 3 | 3 |
| Tertiary Payload (Primary CW, Secondary Parity, PoSP Parity Bytes) | 61208 | 61208 | 61208 |
| Tertiary codeword length (Nt) RS (bytes) | 250 | 250 | 250 |
| Tertiary codeword information (bits) (Kt) | 226 | 226 | 226 |
| Tertiary parity bits per codeword (Pt) | 192 | 192 | 192 |
| Rt = Kt/Nt | 0.904 | 0.904 | 0.904 |
| Correction capability (Tt) bytes | 12 | 12 | 12 |
| Tertiary (RS) symbols (bytes) per page per codeword (Wt) | 16 | 16 | 16 |
| Fractional Shortening | FStFP by Grid | FStFP by Grid | FStFP by Grid |

Table VII illustrates an example of data allocation for the PoTP ECC.

TABLE VII

|  | First Gear | Second Gear | Third Gear |
| --- | --- | --- | --- |
| Page Stripe | 3 | 3 | 3 |
| PoTP Payload (Tertiary Parity Bytes) | 6528 | 6528 | 6528 |
| PoTP codeword length in bytes (N) | 197 | 197 | 197 |
| PoTP codeword information in bytes (K) | 164 | 164 | 164 |
| PoTP parity bits per codeword (P) | 264 | 264 | 264 |
| R = K/N | 0.832 | 0.832 | 0.832 |
| Correction capability (T) | 24 | 24 | 24 |
| PoTP codewords per page stripe (Wpotp) | 40 | 40 | 40 |
| Fractional Shortening | FStFP by Page | FStFP by Page | FStFP by Page |
| Total PoTP parity bits per page stripe | 10560 | 10560 | 10560 |

When allocating bits to ECC dimensions, such as those set out in tables III, IV, V, VI, and VII, for a given dimension payload Ix, codeword payload Kx, and number of codewords Wx, the total payload Wx*Kx is typically not an integer multiple of the codeword payload. That is, Kx*Wx−Ix>=0. In this case "Fractional Shortening to Fit Payload" or FStFP, is applied. First, Ix is padded to be an integer number of bytes. Then, a prearranged set of (Kx*Wx−Ix)/8 of the codewords are each shortened by one additional byte. It will be appreciated that a granularity different from one byte can be used. In this context, x can be any of p, s, t, PoSP, or PoTP.

When a read operation from the flash memory is performed by the SSD, it is a function of the ECC decoder, for example, the decoder portion of an ECC encoder/decoder 1310 (FIG. 13), to detect and correct errors that may exist in the data read, and return the corrected data of interest to a journaling engine 1308 (FIG. 13).

Figure 8:
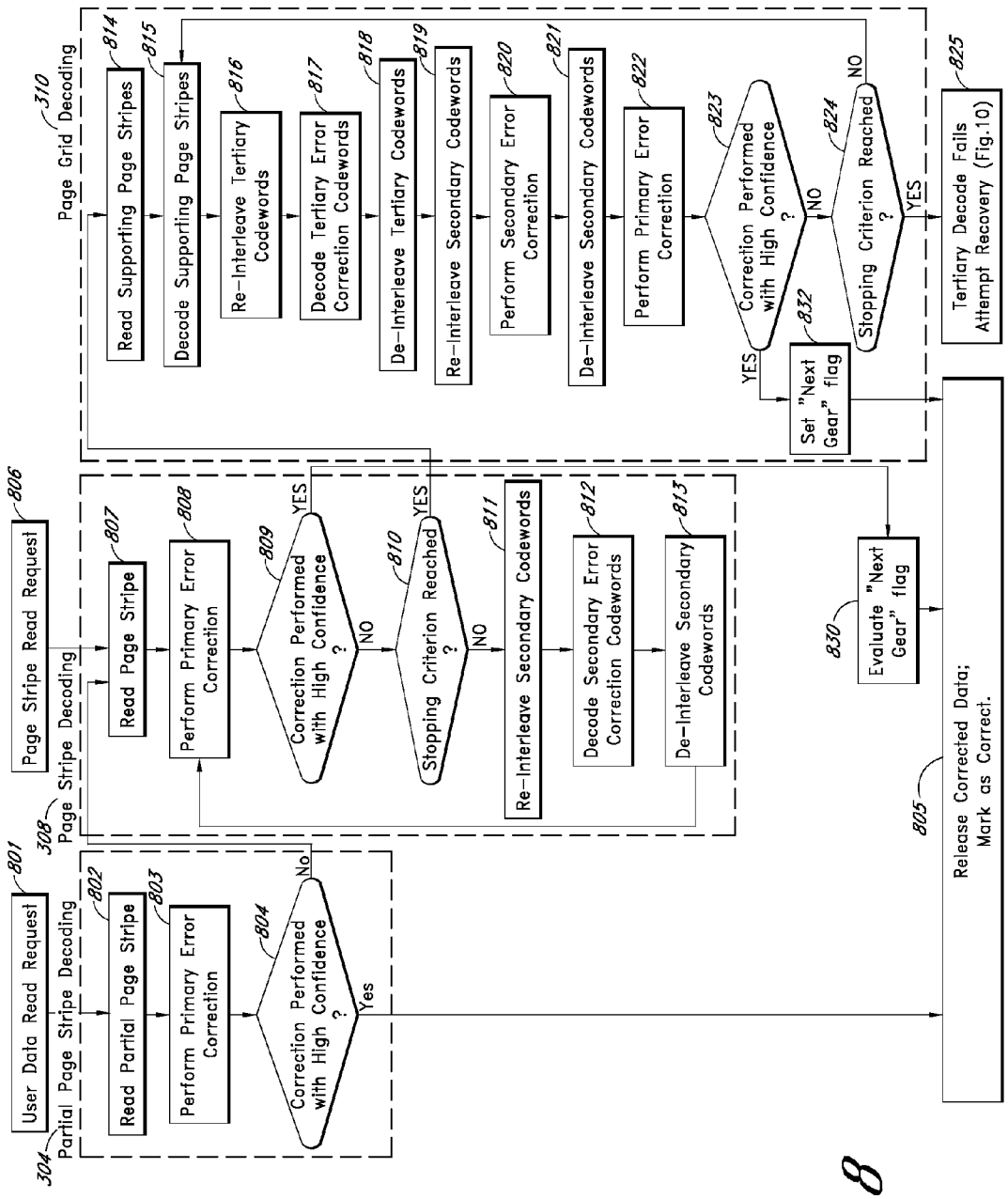
FIG. 8 illustrates an example of a decoding process according to an embodiment of the invention.

FIG. 8 illustrates a procedure that can be used to recover data including user data (information) 401 (FIG. 4), 501a-501d (FIG. 5), 701a-701d (FIG. 7) in the presence of a relatively large bit error rate. The reference characters will be reused from those described earlier in connection with FIGS. 5-7, and it will be understood that these reference characters may refer to where the original data came from and can instead be copied to and processed in scratchpad memory, such as the RAM 1306 (FIG. 13), rather than in flash memory. In addition, in one embodiment, primary error correction can be performed between the reading of information from the flash memory and the temporary storage of the information to the scratchpad memory. Other data can also be recovered as will be explained below. It will be appreciated by the skilled practitioner that the illustrated process can be modified in a variety of ways. For example, in another embodiment, various portions of the illustrated process can be combined, can be rearranged in an alternate sequence, can be removed, or the like. For example, in an alternate embodiment without secondary ECC, or without tertiary ECC, the states and decision blocks associated with the secondary ECC can be eliminated from the process. At the start of the process, it is assumed that data and various primary, secondary, and tertiary ECC has been stored to the corresponding flash page grid 600 as described earlier in connection with FIGS. 4-7.

The illustrated process can begin either at a stage 801 or a stage 806. For the sake of efficiency and minimum latency, one embodiment of the process preferably calculates the minimum set of primary codewords (the "partial page") for recovering the requested data operating under the assumption that secondary and tertiary decoding will not be necessary. Typically, a page will have no errors to relatively few errors that can be corrected via decoding of primary codewords, so this assumption makes for good efficiency and low latency for most situations. To implement this assumption, the process starts at the stage 801 in which the process receives a request for user data. It will be understood that due to journaling activities/flash translation layer activities, that the process may need to translate an address associated with the requested data with an actual address as stored in the flash memory. The process advances from the stage 801 to a stage 802.

In the stage 802, the process reads a partial page stripe, which can be less than a page stripe depending on how much data is requested. The partial page stripe contains the primary codewords corresponding to the requested data. For example, if only one byte of data is requested, then a single page may hold the corresponding user data. In another example, a range of data can be requested, which can take less time to retrieve from the page stripe than reading the entire page stripe. At least one page from the flash memory is read. The process advances from the stage 802 to a stage 803.

In the stage 803, the process performs primary error detection and correction, as necessary, using the primary parity on user data. For example, the primary codewords can be retrieved from a combination of reading the user data 501a-501d, 701a-701d and the primary parity on user data 502a-502d, 702a-702d. It will be understood that if the foregoing refers to reading a partial page stripe of the page stripes 550a, 550b, 550c, 640. For example, the process can use conventional ECC decoding techniques to detect and possibly correct errors in the user data 501a-501d, 702a-702d using the primary parity on user data 502a-502d, 702a-702d, but new forms of ECC decoding that are yet to be developed may also be applicable. Of course, the decoding process should match the encoding process. The process advances from the stage 803 to the decision block 804.

In the decision block 804, the process evaluates whether the data decoded in the stage 803 is reasonably likely to be error-free. In one embodiment, the criterion for establishing that the data was decoded in an error-free manner with high confidence includes the following: (a) every primary codeword containing requested data is correctable; and (b) the number of bits corrected in every primary codeword containing requested data is less than or equal to a parameter Qp (see FIG. 11) for the current gear; and optionally (c) no primary codeword containing requested data contains all-zeroes after correction. A codeword with all zeroes information bits and all zeroes parity is a valid BCH codeword, but it can be produced by a physical error. Thus, in one embodiment, a codeword of all zeroes is initially assumed to be erroneous. Sometimes, the actual user data to be stored will correspond to all zeroes. To differentiate all-zeroes user data from a physical failure, in one embodiment, the incoming user data is passed through a scrambler prior to storage in the flash memory. Scrambling can be implemented by exclusive-ORing (XORing) a pseudo-random sequence in a known, predictable pattern with the incoming data such that long runs of ones or zeroes are avoided. The XORing is performed prior to storing the user data and prior to calculating parity symbols. The original user data can simply be recovered by XORing the same pseudo random sequence and the recovered (corrected) data from the flash memory.

A problem in MLC flash storage is that certain data patterns can cause rapid flash wear out as well as increased error rates on other pages. An example of a troublesome data pattern is all ones on one page, and all zeroes on a "matching" page. In a situation in which many users have data on a flash array, a malicious or unfortunate user could damage the flash array by deliberately storing data with these patterns, thus increasing the risk of data loss for all users of the flash array. There are a number of ways of eliminating this problem. One, known in the art, is to encrypt the data before writing it to the flash. However, the cost, power, and latency impact of encryption and key management is not always desirable. In the absence of encryption, it is known in the art that large data patterns can be removed using a scrambler (for example, XORing the data with the output of a pseudorandom pattern generator). However, if a malicious user is able to guess the scrambler sequence, the malicious user can submit data in the form of the desired malicious pattern XORed with the scrambler sequence, with the result that the malicious pattern is written to flash.

In accordance with one embodiment of the invention, prior to ECC parity calculation, data to be written is XORed with the output of a pseudorandom bit sequence. The initial value (seed) of the pseudorandom bit sequence is determined from information available to the algorithm, but which the end user, including a malicious user, cannot know. In one embodiment of the invention, the seed is generated by taking a digest (hash) of the physical address at which the data is to be stored. In a specific embodiment, the seed is 16 bits, is generated separately once for every 536-byte scrambler or journaling "cell" of data stored by the journaling engine, and can be generated as expressed in Eq. 14.

$$\text{Seed}[15:0] = (\text{block\_address}[7:0]; \text{page\_address}[7:0])$$

$$\text{XOR}(7'b0; \text{chip\_enable}[2:0]; \text{cell\_num}[4:0]); \text{odd\_parity} \qquad \text{Eq. 14}$$

In Eq. 14, ";" denotes bitwise concatenation, "7'b0" indicates seven bits of value 0, "XOR" denotes a bitwise exclusive OR operation, cell_num is the address of the journaling cell of data within a page stripe, and oddparity represents a bit calculated so that there are an odd number of ones in the 16-bit vector. Table VIII illustrates the number of journaling cells per page stripe for each of the 4 page stripes and 3 gears of the illustrated embodiment. The rightmost column of Table VIII contains the total number of journaling cells per page grid.

TABLE VIII

| Page Stripe | 0 | 1 | 2 | 3 | Total (Page Grid) |
| --- | --- | --- | --- | --- | --- |
| First Gear | 30 | 30 | 30 | 16 | 106 |
| Second Gear | 27 | 27 | 27 | 14 | 95 |
| Third Gear | 21 | 21 | 21 | 11 | 74 |

The precise allocation of bits to the seed is not particularly important, so long as the seed is never zero; the seed is different for most pages; the seed is readily calculated with data that is available even after a sudden loss of power; and a user does not have any way of knowing or routinely guessing the entire seed. For example, when the journaling engine 1308 (FIG. 13) is used, the user should not be able to know, for example, the physical page address because of the translation by the journaling engine 1308.

If the correction is performed with high confidence, process proceeds from the decision block 804 to a stage 805 in which the data is provided to the host and is indicated as correct. If the correction is not performed with high confidence, then the process proceeds to the stage 807 in which a page stripe is read from the flash memory to begin decoding of the page stripe. For example, any of the page stripe 550a, the page stripe 550b, the page stripe 550c, or the page stripe 640 can be decoded. In an alternative embodiment, the process can begin in the stage 806 and initiate a read of the page stripe 550a, 550b, 550c, 640 (FIG. 6). When this occurs, the process reads the entire page stripe first, without an initial partial page stripe read. The process advances from the stage 807 to a stage 808.

In the stage 808, each primary codeword in the page stripe is decoded to perform primary error correction for the page stripe. The stage 808 is similar to the stage 803, except that the primary error detection and correction is performed over the page stripe in the stage 808. A page stripe can be of the first type exemplified by the page stripes 550a, 550b, 550c or the second type exemplified by the last page stripe 640. If a page stripe happens to be of the second type exemplified by the last page stripe 640 of the page grid 600, decoding of the primary ECC codewords is performed on the user data 701a-701b with the primary parity on user data 702a-702b, on the secondary parity 703a-703d using the PoSP 704a-704d, and optionally the tertiary parity over page grid 705a-705d with the PoTP 706a-706d. For efficiency, the PoTP 706a-706d need not be decoded in the stage 808 because depending on how the page stripe decoding portion 308 of the process fares, it may not be needed. The PoTP 706a-706d can be used later in the page grid decoding portion 310 of the process.

If a page stripe happens to be of the first type exemplified by the page stripes 550a, 550b, 550c of the page grid 600, then there are no tertiary parity bits so decoding of the primary ECC codewords is performed on the user data 501a-501b with the primary parity on user data 502a-502b and on the secondary parity 503a-503d using the PoSP 504a-504d. The process advances from the stage 808 to a decision block 809.

In the decision block 809, the process determines whether the error correction, if any, was performed with high degree of confidence that the error correction is without error. The criterion used in the decision block 809 to establish the high degree of confidence can include the following: (a) every primary codeword is correctable; and (b) the number of bits corrected in every Primary codeword is Qp or less; and (c) previous secondary decoding was completed without corrections, and with no more than one uncorrectable.

If the correction of the codewords containing requested data has been performed with high confidence, the process proceeds from the decision block 809 to a stage 830 for evaluation of a possible change in gear (strength of ECC) and then to the stage 805 in which the data is provided to the host. See, for example, the decision blocks 1132, 1134, 1136, the set next gear flag stages 1142, 1144, 1146, and the decision blocks 1172, 1174, 1176, which will be described later in connection with FIG. 11. If the codewords have not been decoded with high confidence, then the process proceeds from the decision block 809 to a decision block 810.

In the decision block 810, the process evaluates a stopping criterion and determines if an impasse has been reached. In one embodiment, a stopping criterion is used to halt the iteration of the loop from the stage 808 to the stage 813 if at least one of the following is true: (a) a loop counter has reached a predetermined limit, that is, a maximum iteration limit; or (b) no new corrections were made for the stage 808 in which primary decoding is performed or for the stage 812 in which secondary decoding is performed, or (c) the changes performed in two successive executions of the stage 808 were the same. In one embodiment, the predetermined limit is 12 iterations. Other limits can be used and will be readily determined by one of ordinary skill in the art. If an impasse has been reached, the process proceeds from the decision block 810 to a stage 814 to begin decoding of a page grid. For example, the page grid 600 can be decoded. If no impasse has been reached, the process proceeds from the decision block 810 to a stage 811.

In the stage 811, the corrected, but with low confidence, data (not exclusively user data) is re-interleaved into a set of secondary codewords. The secondary codewords can correspond to, for example, the user data 501a-501d (FIG. 5) and the secondary parity 503a-503d (FIG. 5) or to the user data 701a-701d (FIG. 7) and the secondary parity 703a-703d (FIG. 7). The process advances from the stage 811 to a stage 812.

In the stage 812, error correction is performed on the secondary codewords according to the particular ECC used for encoding. The secondary codewords can include, for example, the user data 501a-501d, 701a-701d and the secondary parity 503a-503d, 703a-703d or the primary parity on user data 502a-502d, 702a-702d and the secondary parity 503a-503d, 703a-703d. For example, the process can utilize the secondary parity 503a-503d, 703a-703d to correct the user data 501a-501d, 701a-701d and the primary parity 502a-502d, 702a-702d. The decoding of the secondary codewords should be performed sequentially after and not in parallel with the stage 808 in which decoding of the primary codewords is performed. For example, in the stage 808, PoSP 504a-504d, 704a-704d is used to detect and correct errors in the secondary parity 503a-503d, 703a-703d. The process advances from the stage 812 to a stage 813.

In the stage 813, the process de-interleaves the secondary codewords and returns the corrected data to the format or order used for decode of the primary ECC. The process returns to the stage 808 to continue iteration of the loop.

If the page stripe stopping criterion of the decision block 810 has been met, the process proceeds to perform error correction on the page grid 600, that is, perform the page grid decoding portion 310 of the process. The various decoding processes can be performed in hardware, software/firmware, or combinations of hardware and software/firmware. The relatively rarity of execution of the page grid decoding portion 310 indicates that it can be practical to implement the partial page stripe decoding portion 304 and the page stripe decoding portion 308 in hardware, and implement the page grid decoding portion 310 in software/firmware. The page grid decoding portion 310 of the process depicted in FIG. 8 proceeds along the assumption that none of the pages of the page grid 600 have failed. A different process for page grid decoding will be described later in connection with FIG. 10 for the decoding of a page grid 600 with a failed page. Returning now to the page grid decoding portion 310 of the process, in the stage 814, the other page stripes or "supporting page stripes" of the page grid are read. The supporting page stripes are the other page stripes from the same page grid 600 such that the supporting page stripes are page stripes from which user data is not specifically requested, but yet contain relevant secondary and/or tertiary ECC. The process advances to a stage 815.

In the stage 815, the supporting page stripes are decoded. In one embodiment, the stage 814 and the stage 815 can be performed iteratively. In the stage 815, each supporting page stripe is preferably individually ECC decoded at the page stripe level similar to the previously described page stripe decoding process described in the stages 807, 808, 811, 812, 813 and the decision blocks 809, 810. One embodiment of decoding a supporting page stripe process will be described later in connection with FIG. 9. The process of FIG. 9 can be repeated until all the supporting page stripes have been decoded. The process advances from the stage 815 to the stage 816.

In the stage 816, the process performs interleaving to rearranges the user data 501a-501d, 701a-701d and tertiary ECC 705a, 705d into tertiary codewords. The process advances from the stage 816 to a stage 817.

In the stage 817, the process performs error correction of the tertiary codewords using the tertiary parity 705a-705d. For example, when encoded according to Reed-Solomon (RS) codes, conventional techniques for decoding RS codes can be used. The process advances from the stage 817 to a stage 818.

In the stage 818, the process returns the corrected block data of the tertiary codewords to the native format of the page grid 600 or order of the user data 501a-501d, 701a-701d, primary parity on user data 502a-502d, secondary parity 503a-503d, PoSP 504a-504d by de-interleaving the tertiary codewords and stores them in scratchpad memory. Of course, the original page structure need not be precisely reproduced to recover the data, but it is convenient to explain and implement the process is this manner. The process advances from the stage 818 to a stage 819.

In the stage 819, the process interleaves the recovered secondary parity 503a-503d into a format convenient for secondary decoding. The convenient format can be to arrange the secondary parity 503a-503d with other data into secondary codewords. The PoSP 504a-504d, 704a-704d can also be used later during the stage 822 to detect and/or correct errors in the secondary parity 503a-503d, 703a-703d. The process advances from the stage 819 to a stage 820.

In the stage 820, the process performs error correction of the secondary codewords using the secondary parity 503a-503d, 703a-703d. The result of the decoding of the secondary codewords yields corrected data for the user data 501a-501d, 701a-701d and primary parity on user data 502a-502d, 702a-702d. The process advances from the stage 820 to a stage 821.

In the stage 821, the corrected data is de-interleaved to return it to the native format of the user data 501a-501d, 701a-701d and primary parity on user data 502a-502d, 702a-702d. The process advances from the stage 821 to a stage 822.

In the stage 822, the process performs error correction using the primary codewords, that is, using the data of the user data 501a-501d, 701a-701d and the primary parity on user data 502a-502d, 702a-702d. It should be noted that the codewords do not have to be specifically formed but can be constructed as needed based on, for example, pointers to scratchpad memory locations. The process advances from the stage 822 to a decision block 823.

In the decision block 823, the process determines whether or not the results of the error correction in the stage 817, the stage 820, and the stage 822 were completed with a relatively high degree of confidence. The criterion used in the decision block 823 to establish the high degree of confidence includes the following queries, which taken together are sufficient to exit the decision block 823 with high confidence: (a) every primary codeword is correctable; and (b) the number of bits corrected in every Primary codewords is Qp or less; and (c) previous secondary decoding was completed without corrections, and with no more than one uncorrectable, and (d) previous tertiary decoding was completed without uncorrectable codewords being detected. In some cases, such as for very high values of Qp, it may be acceptable to release the data without (c) or (d) being true.

If the process determines that a high confidence of a correct decoding operation has been achieved, then the process proceeds from the decision block 823 to a stage 832 to set the next gear flag (see the next gear flag indication 1142, 1144, 1146, FIG. 11) and then to the stage 805 to release the requested data. In an alternative embodiment, the stage 832 to set the next ear flag is unconditionally performed when the page grid decoding portion 310 of the process is invoked. If the error correction has not been performed with high confidence, then the process proceeds from the decision block 823 to a decision block 824.

In the decision block 824, the process evaluates a stopping criterion and determines if an impasse has been reached. In one embodiment, a stopping criterion is used to halt the iteration of the loop from the stage 816 to the stage 822 if at least one of the following is true: (a) a loop counter has reached a predetermined limit, that is, a maximum iteration limit; (b) no new corrections were made for any of the stages 817, 820, 822 in which tertiary, secondary, or primary decoding is performed; or (c) two successive iterations of stage 822 were identical. In one embodiment, the predetermined limit is 12 iterations. Other limits can be used and will be readily determined by one of ordinary skill in the art. If an impasse has been reached, the process proceeds from the decision block 824 to a stage 825 to attempt page failure recovery. One embodiment of the stage 825 will be described in greater detail later in connection with FIG. 10. If no impasse has been reached, the process returns from the decision block 824 to the stage 816 to proceed with another iteration of tertiary decoding.

Figure 9:
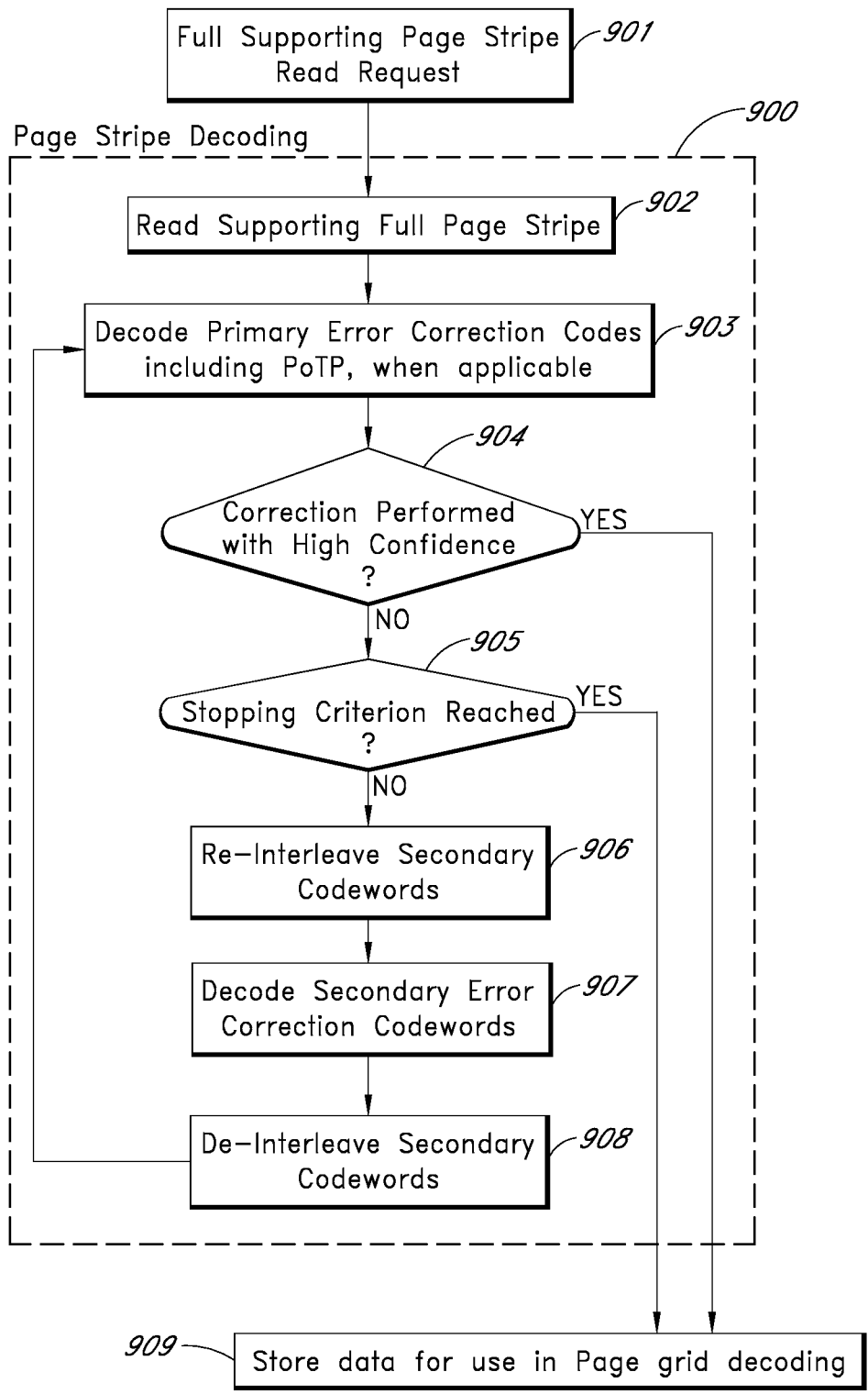
FIG. 9 illustrates an example of decoding a supporting page stripe according to an embodiment of the invention.

FIG. 9 illustrates an example of decoding a supporting page stripe according to an embodiment of the invention. FIG. 9 shows greater detail of the stage 815 described earlier in connection with FIG. 8. The supporting page stripes of a page grid 600 are the page stripes of the page grid 600 that do not contain the data requested in the stage 801 or in the stage 806. However, the supporting page stripes are of the page grid 600 that does contain the data requested in the stage 801 or in the stage 806. The process 900 is similar to that of the page stripe decoding process represented by a dashed block 308 (FIG. 8), except that the data is not released as it would be in the stage 805 (FIG. 8). Instead, the data can be temporarily stored in the scratchpad memory for later use by the stage 816 (FIG. 8).

In the stage 902, each of the supporting page stripes in the page grid 600 is read from the flash memory in a manner similar to that of the stage 807 (FIG. 8). In the stage 903, primary error correction is performed similar to that of the stage 808 (FIG. 8). For the last page stripe, the stage 903 also includes decoding of the primary codewords that cover the tertiary parity bits 705a-705d. In the decision block 904, the criteria used to determine if the page stripe decoding has been successful or not can be the same as that used in the decision block 809 (FIG. 8). In the decision block 905, the criterion used to determine if further decode is futile or not can be the same as that used in the decision block 810 (FIG. 8). If not futile, then the data is re-interleaved in the stage 906 into a set of secondary codewords in a manner similar to that performed in the stage 811 (FIG. 8). Error correction is performed on the secondary codewords according in the stage 907 in a manner similar to that of the stage 812 (FIG. 8). After error correction, in a stage 908, the process de-interleaves the data to the format used for primary decode in a manner similar to that of the stage 813 (FIG. 8). The process flow returns from the stage 908 to the stage 903.

When the decode operation is determined to have been successful in the decision block 904 or futile in the decision block 905, then the data for the page stripe is stored in the stage 909 for page grid decoding.

The page stripe decoding process 900 can be repeated for the remaining supporting page stripes of the page grid. When the process has reached the stage 909 for all supporting page stripes, then the stage 815 (FIG. 8) is complete, and the decoded page stripes are passed to the stage 816 as described earlier in connection with FIG. 8.

If iterative decoding including primary, secondary, and tertiary decoding have failed, it is possible that the reason for the failure is the total failure of a flash page within the grid. This failure may be the result of the total failure of a flash die, or of part of a die (such as a plane, block, or page), or simply a very high BER on one page. In one embodiment, the pages of a page grid 600 are organized such that the page grid 600 contains only one page from a given die, so that even if a die failure occurs, the die failure affects only one page on each page grid 600.

FIG. 10 illustrates an example of a process for attempting a page failure recovery. It will be appreciated by the skilled practitioner that the illustrated process can be modified in a variety of ways. For example, in another embodiment, various portions of the illustrated process can be combined, can be rearranged in an alternate sequence, can be removed, or the like. The process is illustrated using primary, secondary, and tertiary error correction. As discussed earlier, primary error correction provides error correction for a page 400, secondary error correction provides error correction for a page stripe 550, 640, and tertiary error correction provides error correction for a page grid 600. Since the failure of a page can be a relatively rare event as compared to the correction of errors within pages or page stripes, it is practical to implement the tertiary decoding in firmware/software with instructions executed by a processor, or in a block of hardware shared by several decoders.

While illustrated in the context of an SSD controller using primary, secondary, and tertiary error correction, the principles and advantages described herein are also applicable to systems using fewer error correction levels or even more error correction levels. For example, in an alternative embodiment, the secondary error correction and page stripe arrangement are not utilized and rather, the tertiary error correction is used with the primary error correction and the states in the dashed box 1030 are not used and can thus be considered optional. In such an alternative configuration, the page grid will then contain a collection of pages or integer fractions of pages rather than a collection of page stripes. In another alternative arrangement, tertiary parity bits can be distributed among the pages of a page grid in a manner similar to that of the last page stripe 640 (FIG. 7).

Returning now to the process depicted in FIG. 10, at the start of the process, it is assumed that, data has been stored to the flash memory and that the process described earlier in connection with FIG. 8 has not resulted in recovered data and has ended in the stage 825. Since the process of FIG. 8 has failed to recover data, the possibility is relatively high that there is a failed page in the page grid 600. The failed page will usually be the page for which data is being requested, but can also be another page of the page grid that is needed to complete error correction decoding for the requested page. When a failed page of the page grid 600 can be identified, the error correction capability for the page grid can be dramatically improved. As discussed earlier in connection with the stages 216-220 of FIG. 2, in one embodiment, a Reed-Solomon (RS) code is used for the tertiary error correction. A RS code is both an error correction code and an erasure code.

When correcting errors with RS codes and certain other codes, there is a difference in the ability of the RS ECC decoder to correct errors when the location of the errors is known. For example, an RS ECC decoder can typically correct twice as many erasures than it can correct errors of unknown location because there is information in the location of the errors. As discussed earlier in connection with FIG. 2, in one example in which the tertiary symbol size Mt is 8 bits or one byte, tertiary codeword size Nt is 250 bytes, block data size Kt is 226 Bytes, and each tertiary codeword can correct up to 12 symbol errors, up to 24 erasures, or some mix thereof such that the number of erasures plus twice the number of symbol errors is equal to 24. Thus, for example, when blindly correcting errors such as in the page grid decoding portion 310 of the process of FIG. 8, the RS ECC decoder is correcting errors of unknown location because the RS ECC decoder does not know which symbols need correction. However, if portions of the data to be corrected can be identified or marked as unknowns or erasures, the RS ECC decoder can then correct more errors than previously done in the page grid decoding portion 310 of the process of FIG. 8, thereby recovering a failed page. While illustrated in connection with RS codes, the above-described principle applies to other erasure codes as well, such as to LDPC codes. Additionally, it should be noted that an RS ECC is applicable to symbols and not to individual bits. Typically, each symbol of an RS ECC is a byte (8 bits) of data, but the symbols can be other than bytes. In addition, the process can temporarily store data in scratchpad memory, such as in the RAM 1306 (FIG. 13) and can further rearrange the data as needed. In one embodiment, the process copies data from the page grid 600 (FIG. 6) to the RAM 1306 and performs the page recovery processing described in connection with FIG. 10 using the contents copied over to the RAM 1306.

The process of FIG. 10 starts in a stage 1001. As described earlier in connection with the fingerprints 407 of FIG. 4, the fingerprints 507a-507d, 707a-707d stored for each page can be determined from the physical address of the flash location of that page. For example, a hash code based on the physical address can be used for the fingerprints. The physical address of the page will be known to the SSD controller. Accordingly, the correct or expected values for the fingerprints 507a-507d, 707a-707d is known or is at least determinable prior to data retrieval. In the stage 1001, the process compares the retrieved value for the fingerprints 507a-507d, 707a-707d on each page to its original value. In one embodiment, the page of the page grid 600 having the retrieved fingerprint with the largest magnitude difference from the expected value is identified as the failed page, so long as that difference is greater than a predetermined threshold, such as 5 bits. If this fingerprint comparison is unable to determine a unique failed page, then in one embodiment, the page with the most primary codeword failures can be identified as the failed page. The comparison of primary codeword failures can also be used as a tiebreaker if the fingerprint differences are equal.

The method is intended to detect many different kinds of failure. For example, an address line can fail, which can result in data from the wrong address being returned. Other forms of failure might return fixed byte patterns (such as all-ones), totally random data, or simply a very high bit error rate. Also, note that the page identified as having failed does not have to be the particular page of the page grid 600 from which data is requested. Alternate forms of identifying a bad page can also be applicable. For example, in another embodiment, a brute force procedure is used and the corresponding data from various pages of the page grid 600 are successively erased for error correction. However, the brute force technique would typically be quite time consuming to execute. The process advances from the stage 1001 to a stage 1016a.

In the stage 1016a, the tertiary codewords with the erasures can be re-interleaved substantially as described earlier in connection with the stage 816 (FIG. 8). The process advances from the stage 1016a to a stage 1002.

In the stage 1002, the process marks as an erasure or as an unknown, the symbols of the tertiary codewords that are based at least partly on the failed page. In the illustrated embodiment, each symbol is a byte of data, but other symbol sizes can be used. In the illustrated embodiment, the tertiary codewords are interleaved so that the contents of each page are evenly distributed among the tertiary codewords of a grid. The SSD controller will be aware of the particular pattern used for interleaving bits for the various codewords. With knowledge of the pattern, the SSD controller determines which of the symbols making up the tertiary codewords are based on data stored in the failed page. These identified symbols are then marked as unknowns or erasures by the SSD controller for decoding such that for a given tertiary codeword, each symbol, for example, in one embodiment, each byte of a Reed-Solomon ECC defined over Galois Field (GF) ($2^8$ or $2^8$), coming from the failed page is marked as an erasure for the RS ECC decoder. This marking as an erasure can correspond to an instruction to the RS ECC decoder identifying the erased symbols. It should be noted that erasure in this context does not refer to the erasure of a block of flash memory. The process advances from the stage 1002 to a stage 1017.

In the stage 1017, the process performs tertiary error correction on each tertiary codeword, treating each "erasure" or unknown byte as an assumed error location to perform mixed error and erasure decoding; otherwise 1017 is substantially as described earlier in connection with the stage 817 (FIG. 8). The process advances from the stage 1017 to a stage 1018 in which the process de-interleaves the tertiary codewords to return the now corrected block data to the native format of the page grid 600 substantially as described earlier in connection with the stage 818 (FIG. 8). The result of the performance of the stages 1016a, 1017, 1018 can differ from that of the stages 816, 817, 818 because the data being corrected is different due to the erasure of the symbols of the failed page performed in the stage 1002. The process advances from the stage 1018 to a stage 1019.

In the stages 1019, 1020, 1021, the process performs page stripe decoding for the page grid with the secondary error correction substantially as described earlier in connection with the stages 819, 820, 821 of FIG. 8. If the outcome of the stage 1017 was improved compared with the stage 817, then the secondary decoding can be expected to perform better than in the process of FIG. 8. The process advances from the stage 1021 to a stage 1022. In the stage 1022, the process performs primary error correction substantially as described earlier in connection with the stage 822 of FIG. 8. The process advances from the stage 1022 to a decision block 1023.

In the decision block 1023, the process evaluates the results of the primary, secondary, and tertiary decoding operations. If the release criteria for the decision block 823 are met, or if all of the following are true: (a) the maximum number of iterations has been reached, such as 12 iterations, (b) the primary decoding has no uncorrectable errors, and (c) the tertiary decoding has no uncorrectable errors. If release criteria are met, the decoding process is complete, and the process proceeds from the decision block 1023 to a stage 1033 in which the data is released.

If the correction has not been performed with high confidence and data should not be released, then the process proceeds from the decision block 1023 to a decision block 1024 to evaluate a stopping criterion. In one embodiment, the stopping criterion is the same as for the decision block 824. If the stopping criterion is not satisfied, another iteration of the loop is initiated, with the process proceeds from the decision block 1024 to the stage 1016b to perform tertiary error correction without taking erasures into account. With additional symbols corrected from secondary and primary error correction, a subsequent tertiary error correction can be more successful than an initial or an earlier pass. In the stage 1016b, the at least partially corrected tertiary codewords can be re-interleaved substantially as described earlier in connection with the stage 816 (FIG. 8).

The process proceeds from the decision block 1024 to an optional decision block 1032, which determines whether or not the stopping criterion of the decision block 1024 had been satisfied for the first time or the second time for the page grid. If the stopping criterion had been reached for only the first time, the symbols of the failed page are considered to be unknown a second time and the process optionally returns from the decision block 1032 to the stage 1016a to execute a second time. Iteration counters are also set back to zero except for the stopping criterion of the decision block 1024. The reason for performing the optional second execution, which appears to perform an apparently identical process, is that the primary and secondary correction steps may have cleaned up random errors to a sufficient extent that a second erasure pass can fix the remaining problems. The second pass also tends to eliminate problems arising from Tertiary false-corrections occurring during the first execution of 1002 and 1017.

If, on the other hand, the stopping criterion has been satisfied for a second time, then the decoding operation has been a failure and the process proceeds from the decision block 1032 to a stage 1034 in which a read response indicating an uncorrectable block is returned to the host. Further attempts to repeat can be attempted, but the number of attempts should be limited to avoid an infinite loop.

Flash page failures can take many forms. The data may be returned in the form of all-zeroes or all-ones. The data can be totally random. The data may also, due to an address decoder failure, be data from the wrong page.

In at least two of these cases (all-zeroes and data from the wrong page) the primary codewords are likely to indicate that the data is correctable. A rule of the decision block 804 forbidding quick release of an all-zeroes codeword is intended to avoid mistaking an all-zeroes page due to a flash failure for a correct page. An all-zeroes codeword can have an all zeroes checksum such that failure of the page can be difficult to detect. The likelihood of a genuine all-zeroes codeword can be minimized through the use of a scrambler as discussed earlier in connection with the decision block 804 of FIG. 8.

Adaptive ECC

Figure 11:
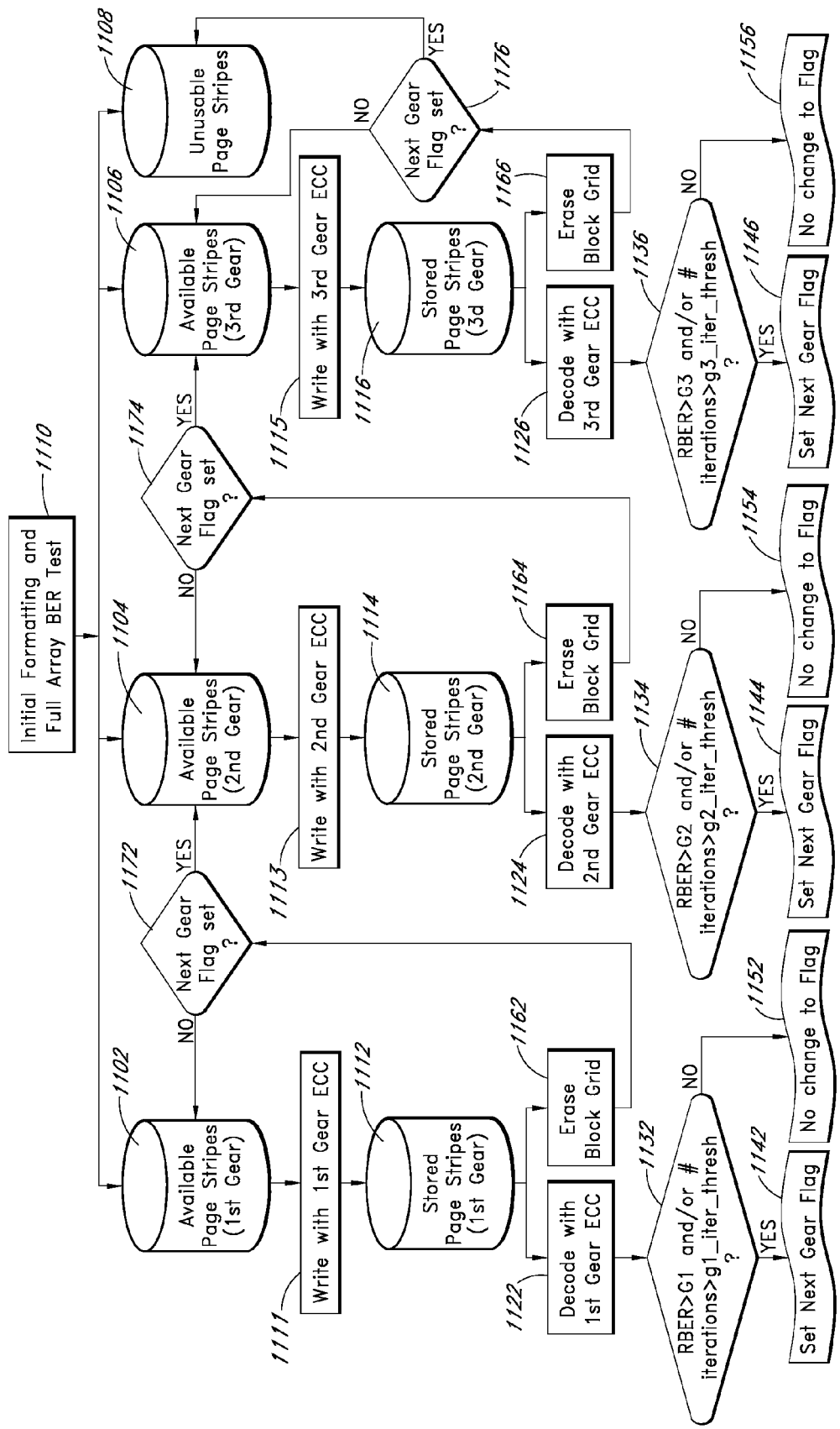
FIG. 11 illustrates an example of a flash page ECC gear progression.

FIG. 11 illustrates an example of flash page ECC gear progression. An ECC gear is selected upon initialization and upon use. FIG. 11 illustrates gear progression for both scenarios, which can be considered two separate processes. The processes can be performed by the SSD controller 1300 (FIG. 13). It will be appreciated by the skilled practitioner that the illustrated process can be modified in a variety of ways. For example, in another embodiment, various portions of the illustrated process can be combined, can be rearranged in an alternate sequence, can be removed, or the like. In the illustrated example, three levels (gears) of ECC capability are used. In the illustrated embodiment, each gear or strength level has a different ratio R of information bits K to total bits N. In alternative embodiments, two levels are used or more than three levels are used. A set of criteria associated with the gear can be used to select the next gear or to retire a page, a page stripe, or a page grid. Advantageously, the retiring of a page, a page stripe, or a page grid can correspond to a relatively small amount of memory that is retired at a time and can be used to retire, for example, upper pages earlier than lower pages, rather than entire blocks of pages. In one embodiment, the next gear is selected if more than gx_thresh=Gx*stripe_size bits were corrected during a decode of a page stripe, or if more than a predetermined number gx_iter_thresh iterations of primary error correction and secondary error correction were required for a successful decode at the page stripe decoding portion 308 of the process. In one embodiment, stripe_size=4320*8*4=138240 bits, G1 is 1.3E-3, and thus g1_thresh=180 bits; g1_iter_thresh=3.

In an alternate embodiment, the gear progression can include a change of an ECC type to increase the ECC strength instead of or in addition to a change in the ratio R. For example, ECC type can include, but are not limited to: Hamming codes, BCH codes, Reed-Solomon codes, LDPC codes, Hadamard codes, Expander codes, Golay codes, and Reed-Muller codes. For example, the type of ECC can be changed from a Hamming code to a BCH code to implement a gear change. The change in type can also be accompanied by a change in ratio R. Preferably, when a next ECC technique is selected for a gear change, whether implemented by having a lower ratio R and/or a change in type of type, the next ECC technique uses the least overhead, for example, the least number of parity bits of the ECC techniques having a corrective capacity within the RBER observed for the page stripe.

In addition, extra safety margin can be provided by generation of a safety factor that covers expected variations in RBER. The memory testing techniques can be imperfect and the memory cells themselves are be subject to variability; furthermore error rates can increase if data is retained in the flash for a long period. For example, at the production level, the characteristics of the flash memory cells can be tested to see how much the RBER varies among the page stripes and among a sample of SSDs with memory cells of the same type. The observed RBER can be compared against historical RBER including, for example, the worst-case RBER Bworst ever observed on that page or group of pages. An "excursion factor Ex" can be calculated based on a cumulative probability density function analysis of the comparison data to compensate for the variability. Ex is chosen such that the probability of observing an RBER>Bworst is less than aUBER. The excursion factor Ex is then multiplied by a "retention factor" RETx sufficient to account for increased BER over the desired retention period, to get the safety factor SFx. The safety factor is always greater than or equal to 1. The safety factor is used to determine the operational RBER limits for each gear. For example, operational RBER limits G1, G2, G3, for three gears can be selected by dividing the theoretical ECC RBER (ECC_CAP) at which UBER<1E-16 is achieved in each gear by the safety factor. Thus Gx≤ECC_CAPx/SFx=ECC_CAPx/(Ex*RETx), wherein Gx is one of G1, G2, or G3. A safety factor is typically calculated during system test and can be programmed into the SSD controller 1300 or into other non-volatile memory or can, for example, be programmed into the threshold limits. The safety factor SFx, the excursion factor Ex, and the retention factor RETx, can vary in a very broad range based on the flash used and the operational conditions the SSD is required to withstand. Non-limiting examples of values for the safety factor SFx include about 2.5, a range of 2 to 3, and a range of 1.5 to 4 for a page grid, an excursion factor Ex range of about 4-8 for a page, a range of about 2 to 3 for a page stripe, a range of about 1.4-1.8 for a page grid, and a retention factor RETx range of about 1.2 to 2.2. Other values are applicable and will be readily determined by one of ordinary skill in the art. The value Gx may be chosen smaller than ECC_CAPx/SFx for other reasons, such as to ensure a sufficiently high probability of quick-release.

Another way of describing the use of the safety factor is that the gear should be selected based on an estimate of the future RBER that will exist when the region of flash is decoded. The safety factor accounts for the uncertainties inherent in that estimate, including retention time, variability of the flash medium, and inaccuracies in measurement.

The process can maintain one or more tables that maintain the selected gears of the page stripes. The table(s) can be stored in DRAM or scratchpad memory. The table(s) or bins can alternatively be stored in other memory, such as within the flash array itself, or other flash memory within or external to a chip embodying the SSD controller 1300 (FIG. 13). The processing of assigning page stripes or other groupings or one or more pages to a particular amount of ECC gearing can be referred to as "binning." In one embodiment, a first table 1102 maintains a list of page stripes that are available, that is, are erased, and have pages and page stripes associated with the first gear of ECC. The list can store a reference to the applicable page stripes, such as, but not limited to, upper address bits of the page stripe. A second table 1104 maintains a list of page stripes that are available and associated with a second gear of ECC. A third table 1106 maintains a list of page stripes that are available and associated with a third gear of ECC. A fourth table 1108 maintains a list of unusable or bad page stripes.

The payload capacity of a page stripe can be large enough to hold multiple allocation blocks. As discussed previously, in the illustrated embodiment, the payload capacity of a page stripe depends on the gear level and the type of page stripe. In one embodiment, the process temporarily holds, such as in scratchpad RAM 1306, until there is enough data to fill the page stripe to be programmed or "current" page stripe, and then the process programs the current page stripe with the particular gear level as indicated by the stages 1111, 1113, 1115. In addition, an allocation block can also be programmed into portions of two different page stripes, such as, a first subset of the allocation block can be programmed at the end of one page stripe and a second subset of the allocation block can be programmed to the beginning of another page stripe. Much of the time, however, the entire allocation block can be programmed into a single page stripe. It should be noted that a subset can include the whole. The mapping of particular allocation blocks to page stripes is handled by the journaling engine 1308, which will be discussed later in connection with FIG. 12.

A fifth table 1112 maintains a list of page stripes holding data and are associated with the first gear. A sixth table 1114 maintains a list of page stripes holding data and are associated with the second gear. A seventh table 1116 maintains a list of page stripes holding data and are associated with the third gear. In an alternative embodiment, the data of the tables 1102, 1104, 1106, 1108, 1112, 1114, 1116 can be merged into fewer tables. In the illustrated embodiment, since a page stripe and the pages of the page stripe change gears at the same time, a separate table to track the gear of a page is not needed. However, in alternate embodiments with different gears for pages and their corresponding page stripe, additional tables can be used.

While the primary, secondary, and tertiary ECC features described earlier in connection with FIGS. 3-10 can be used with a non-varying strength of error correction, preferably, the SSD controller can vary the ECC strength to accommodate different quality levels of underlying flash memory, to compensate for wearing out from erase cycles over time, to compensate for the difference in RBER based on page index, and the like. The gears for the four page stripes of a grid do not need to be the same. In one embodiment, a process performed by the SSD controller allocates to each page stripe a particular gear (ECC strength) that will, with relatively high certainty (for example, no more than one failure in 1E16 reads), correct all errors that should arise during that program/erase cycle. In the illustrated embodiment, a page stripe can have 1 of 3 ECC levels for its primary and secondary ECC, but the tertiary ECC level is always maintained the same, to ease implementation of cases in which the four page stripes of a page grid have different gears or ECC levels. In an alternative embodiment, the tertiary ECC level or gear can be determined by the page stripe of the page grid with the highest gear. In the illustrated embodiment, the ECCs gears are changed on a page stripe basis, such that the secondary ECC and the primary ECC strengths are changed at the same time. However, in alternative embodiments, a stripe can be just one page, or gears assigning different ECC strengths to individual pages within a stripe can be defined. In the terminology used in the following, first gear denotes the smallest amount of ECC strength (highest ratio R), second gear denotes an intermediate amount of ECC strength, and third gear denotes the largest amount of ECC strength. Of course, the number of gears can vary in a very broad range and can generally be 2 or more.

In a stage 1110, the process initializes or formats the array, that is, all the memory devices of the SSD. The initialization is typically executed during production test when the flash memory cells are fresh, but can also be executed by an end user to return the SSD controller 1300 (FIG. 13) to its factory configuration after the flash memory cells have experienced wear. When the flash array is initialized, a memory test is performed such that test data is written to the page stripes of the flash array, and then read back. For example, an example of a memory test is a pattern resulting from scrambling all zeroes using a synchronous scrambler or the output of a pseudo random bit sequence (PRBS) 31 generator. However, any of a variety of test patterns can be used as will be recognized by one of ordinary skill in the art, and the scrambler can be disabled as appropriate for the memory test. After the memory test is performed, the particular raw bit error rate (RBER) or associated error metric should be known. In the illustrated embodiment, the RBER is determined and maintained at a page stripe level, but in alternative embodiments in which page stripes are not present, the RBER can be maintained at the page grid level.

An appropriate amount of strength of ECC for a page stripe is selected based on the RBER of the page stripe. The RBER of each page stripe is compared against thresholds chosen for each gear. Page stripes with an RBER less than or equal to the 1st gear threshold G1 are assigned the first gear ECC strength and listed in the first table 1102. Page stripes with an RBER greater than the first gear threshold G1 and less than or equal to the second gear threshold G2 are assigned to the 2nd Gear ECC strength and listed in the second table 1104. Page stripes with an RBER greater than the second gear threshold G2 and less than or equal to the third gear threshold G3 are assigned to 3rd Gear ECC strength and listed in the third table 1106. Page stripes with an RBER greater than the threshold G3 are considered unusable and listed in the fourth table 1108. The gear setting for each page stripe can be maintained by the journaling engine 1308 (FIG. 13) in memory, such as in DRAM. If this information is lost, the gear ratio can be deduced by attempting a decode operation with each gear, in sequence, starting with the highest gear, until a correct decode is achieved.

Each gear has a different ratio R, and with a fixed physical page sizes, thus corresponds to varying amounts of user data that can be stored per physical page. Ordinarily, a change in page size cannot be tolerated by the host because the host expects to transfer data to and from a data storage device in fixed-size storage blocks. However, by utilizing the journaling engine 1308, the host is not aware of the variation in the amount of information data that can be stored in the underlying physical pages as the characteristics of the physical pages are abstracted away by the journaling engine 1308 or flash translation layer. When the journaling engine 1308 is writing data, it selects a page stripe from its pool of empty flash regions as indicated in the tables 1102, 1104, 1106 and looks up the gear setting for that page stripe, which can be associated implicitly per table 1102, 1104, 1106, or stored separately in a table in nonvolatile memory. Based on the gear setting, the journaling engine 1308 instructs the ECC encoder to encode according to the current gear, passes an amount of data that fits in the information portion of the page stripe to write data 1122, 1124, 1126. The journaling engine 1308 can also remove a reference to the selected page stripe from the tables 1102, 1104, 1106 listing availability and place a reference to the page stripe into the appropriate one of the tables 1112, 1114, 1116. The reference can be, but is not limited to, upper address bits (most significant bits). When the number of user sectors or allocation blocks that fit in a page stripe is not an integer, the journaling engine handles splitting the user sector among two page stripes. The tables 1102,1104,1106, 1112, 1114, 1116 need not literally exist; it is usually more convenient to store information related to page stripes in a way that can be indexed by fill status, physical address and/or age, and to store the gear setting as a field in an entry corresponding to that page stripe.

In one example of a flash translation layer (FTL) implementation, the FTL or equivalent maintains two lists. One of these lists, analogous to the first table 1102, is for in-service flash regions that can be guaranteed correctable by ECC and another list, analogous to the fourth table 1108, is for retired regions. An overprovisioning factor u can be expressed as u=(fc−dc)/fc, wherein fc is the payload capacity of in-service flash regions, and dc is the drive capacity made available to the user. In the presence of random writes, a write amplification factor wa=user_bytes_written/flash_bytes_written is proportional to $1/(2u-u^2)$. As regions of the flash memory are retired, fc is reduced by the capacity of the regions retired. This in turn causes overprovisioning u to fall, which causes the write amplification factor wa to rise. The rise in wa impacts the drive's write throughput capacity, and increases the rate of wear. As a result, it is advantageous to take an SSD out of service after wa reaches a critical level. In one embodiment, the maximum wa permissible is 4.

Advantageously, one embodiment of the invention maintains a plurality of lists 1102, 1104, 1106 of flash regions associated with different gears as well as the list 1108 of retired regions. In one embodiment, these flash regions correspond to page stripes. When a region of flash is moved from one gear to the next, only a fraction of its former capacity is lost. In one embodiment, the transition from 1st gear to 2nd gear reduces the region's capacity by 10%, the 2nd gear to 3rd gear transition reduces it by a further 20%, and the 3rd gear to retired transition reduces it by the remaining 70%. When this method is employed, the decrease in fc due to increasing flash RBER is greatly slowed, which in turn delays the decline of overprovisioning u, and decreases the increase in write amplification wa. The result is a degree of life extension (as measured in total user bytes written) far in excess of a system that simply uses a high-strength ECC equivalent to 3rd gear throughout the life of the system. This aspect of the invention can only be achieved by a flexible-rate ECC engine working in tandem with a flexible-payload-size journaling engine.

Whenever a read occurs, the ECC encoder/decoder 1310 performs ECC decoding 1122, 1124, 1126 to perform error detection and correction as needed as previously described. As it does so, the ECC encoder/decoder 1310 can count how many corrections, if any, it makes. This count can be a good approximation of the number of errors and related to a bit error rate (BER) actually existing in the page stripe. The ECC encoder/decoder 1310 compares this amount to the threshold for the current gear. In the decision blocks 1132, 1134, 1136, if the number of corrected bits for a page stripe read exceeds the gx_thresh for the current gear, or if the number of primary/secondary iterations exceeds g_iter_thesh, the ECC encoder/decoder 1310 informs the journaling engine 1308 that the page stripe should be assigned a higher gear, such as the next higher gear, the next time the page stripe is programmed. The journaling engine 1308 initially stores this set next gear flag indication 1142, 1144, 1146 for later use. If the condition for the decision blocks 1132, 1134, 1136 is not met, there is no change made to the next gear flag 1152, 1154, 1156.

A flash block is the smallest physical unit that is erasable in flash memory. In an embodiment of the invention, the journaling engine 1308 will consider the smallest erasable unit to be one or more block grids (a set of flash blocks containing only complete page grids). For example, if grids are constructed of 16 pages, one from each of 16 dies, then a block grid would be 16 blocks, one from each of 16 dies, containing those page grids. When the journaling engine 1308 erases 1162, 1164, 1166 a block grid of flash, the journaling engine 1308 reviews the flags for the corresponding pages of that block in the decision blocks 1172, 1174, 1176. Any page stripes which have the BER flag set are assigned the next higher gear by listing in the appropriate table 1104, 1106, or, in the case of a page stripe already assigned to the third gear, are marked as unusable or listed in the fourth table 1108. Page stripes without the next gear flag set remain in the present gear and are listed in the appropriate table 1102, 1104, 1106. Preferably, the decision blocks 1132, 1134, 1136 and the decision blocks 1172, 1174, 1176 are executed each time they are encountered during execution of the process of FIG. 11. However, the execution of the decision blocks can be skipped, for example, executed every other pass, every fourth pass, or the like. This can be useful when the process is implemented in firmware and processor resources are low.

In an alternative embodiment, the SSD controller 1300 does not use a test pattern generator during initialization but counts corrected errors instead to determine the RBER. Rather than using a test pattern and tabulating errors by comparing the written data and the read data for the memory test, the SSD controller 1300 can instead use virtually any data, such as all zeroes or all ones, which are then scrambled by the scrambler, then encoded at the maximum strength or highest gear ECC, such as third gear, programs the encoded data, reads the encoded data back, and then decodes the retrieve data as the memory test. The maximum strength ECC should be used since it should have the maximum error counting ability. During decoding, the ECC encoder/decoder 1310 counts and correct the errors encountered, if any. The count of the errors is then used to "bin" the page stripe in the appropriate one of the tables 1102, 1104, 1106, 1108 a based on the thresholds discussed earlier in connection with the decision blocks 1132, 1134, 1136.

Figure 12:
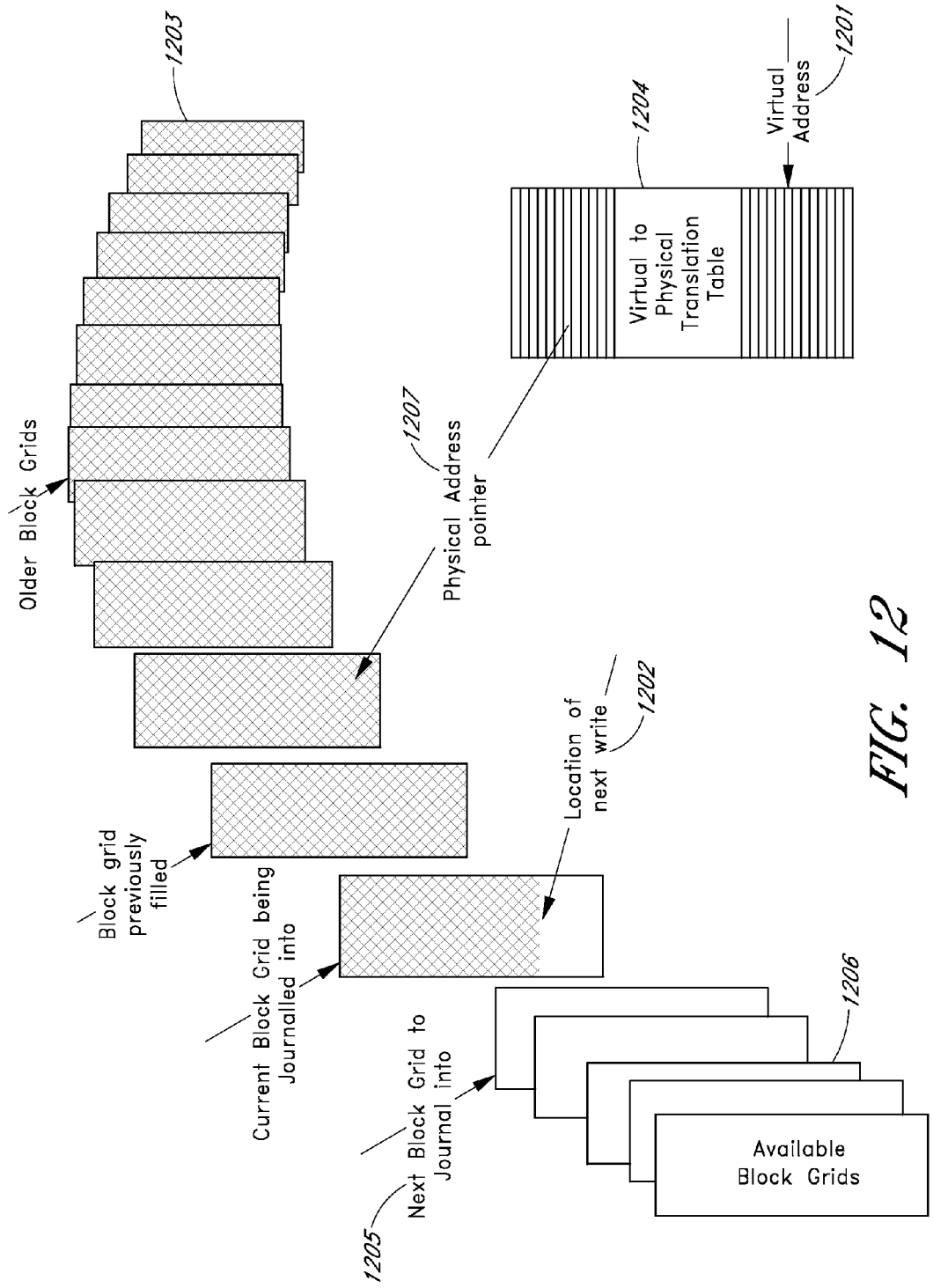
FIG. 12 illustrates the operation of a virtual/physical translation table, which is used by the journaling engine of FIG. 13.

FIG. 12 illustrates the operation of the virtual/physical translation table, which is used by the journaling engine 1308 of FIG. 13, which will be described in greater detail later.

Whenever a host wishes to write data to a storage array, the host supplies the data in a fixed-size allocation block along with a virtual address 1201 that identifies that piece of data to the host. The journaling engine 1308 finds an empty region for a write location 1202 to the storage array, and issues commands for the data to be written to that area. The journaling engine 1308 updates the virtual to physical translation table 1204 with the physical address or addresses 1207 corresponding to the virtual address 1201. If the virtual address was previously mapped to a physical address in a full block 1203, that physical address is marked as "invalid." The pointer to the next valid write location 1202 is advanced. When the pointer reaches the end of the current block grid, the pointer is advanced to the next block grid 1205. The journaling engine 1308 maintains a supply of available blocks 1206 by erasing and reclaiming blocks as will be described in greater detail later in connection with FIG. 16.

Figure 14:
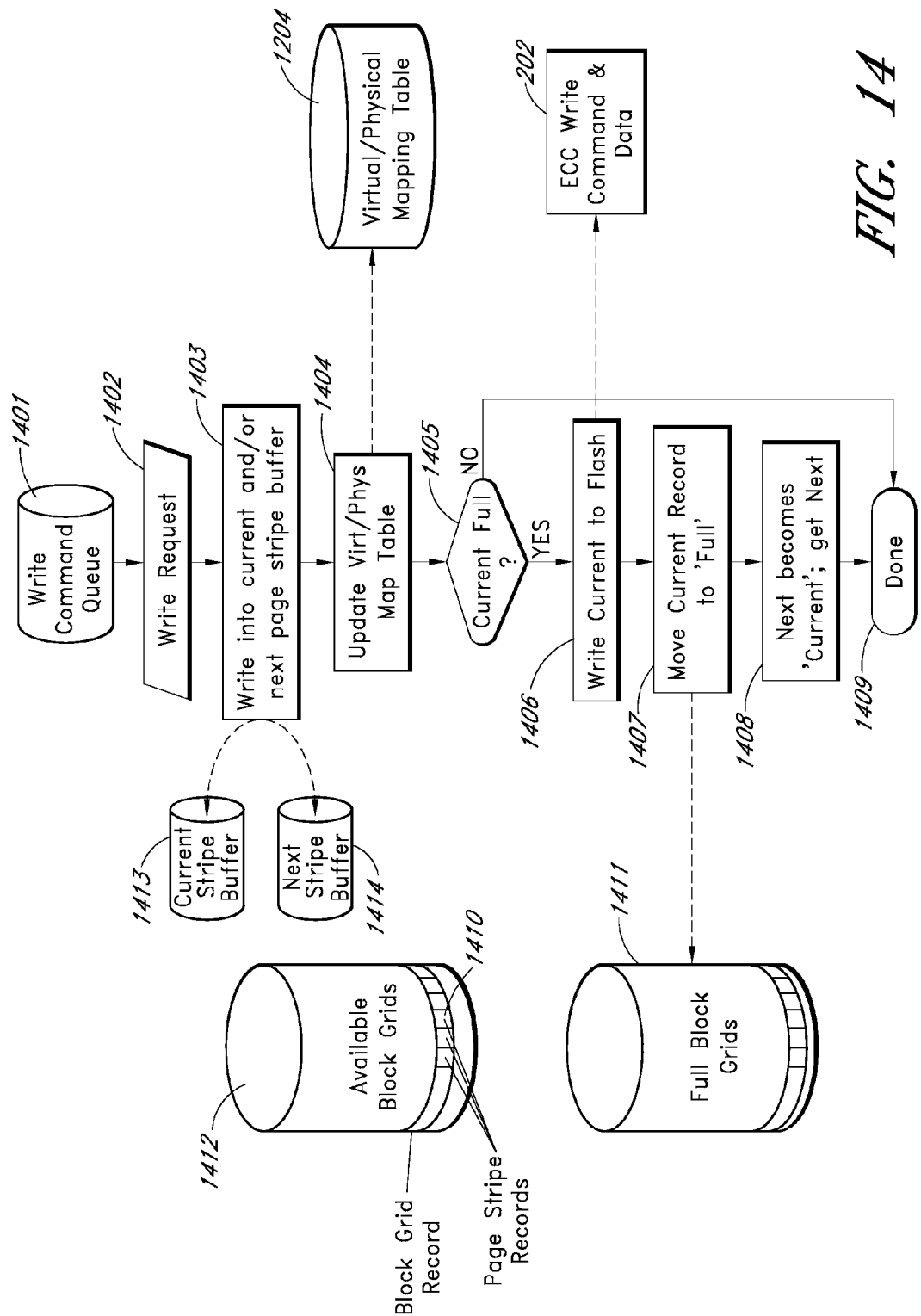
FIG. 14 illustrates a process that a journaling engine can perform to execute write requests.

FIG. 14 illustrates a process that the journaling engine 1308 can perform to execute write requests. Whenever a host or other process wishes to write data to a storage array, it supplies the data in a fixed-size allocation block along with a virtual address or logical address 1201 that identifies that piece of data, such as a block stripe, which is made up of the blocks that correspond to a page stripe, to that host. These writes are added to a write command queue 1401. The journaling engine takes write requests 1402 from the write command queue 1401. The journaling engine 1308 maintains a current page stripe buffer 1413 it is journaling into, as well as a next page stripe buffer 1414. The payload capacity of each depends on the gear, which is specified in the page stripe record 1415. Typically, the payload capacity of a page stripe will be much larger than the size of an allocation block, so that several allocation blocks can be written into a page stripe buffer. At the stage 1403, the journaling engine temporarily stores the allocation block in the current page stripe buffer 1413, which can be implemented in volatile memory, such as RAM. If the allocation block runs over the end of the page stripe payload, the remaining portion can be assigned to the next available page stripe and temporarily stored in the next available page stripe buffer 1414. The journaling engine records the physical location or locations of the data in the virtual (logical) to physical translation table 1204. If the current page stripe is considered to be full 1405, then in a stage 1406 the journaling engine issues a command 202 to the ECC to encode and write the current page stripe to the flash array. It will be understood that the payload portion of a current page stripe can be considered to be full when it is less than full. For example, if the payload portion of current page stripe is nearly full, such as within a few bytes of being full, the performance of the memory will be improved by not splitting a next allocation block across two different page stripes. In addition, when journaling cells are used, it can be desirable not to split a journaling cell across multiple page stripes. Accordingly, there can be a remaining portion of a page stripe that goes unused when it is considered to be full. In a stage 1407, the process moves the record of the current page stripe into the list of full page stripes within the list of full block grids 1411. In a stage 1408, the next page stripe buffer 1414 becomes the current page stripe buffer 1413, and a new next page stripe 1414 is chosen from the list of available block grids 1412. Once the stage 1409 is reached, the write request is complete.

During writes, the journaling engine 1308 also checks in the stage 1404 to see if there is existing data in the storage array corresponding to the virtual address being overwritten by the operation. If so, it marks the physical address for the previous data as "invalid," as flash cannot be overwritten.

Figure 15:
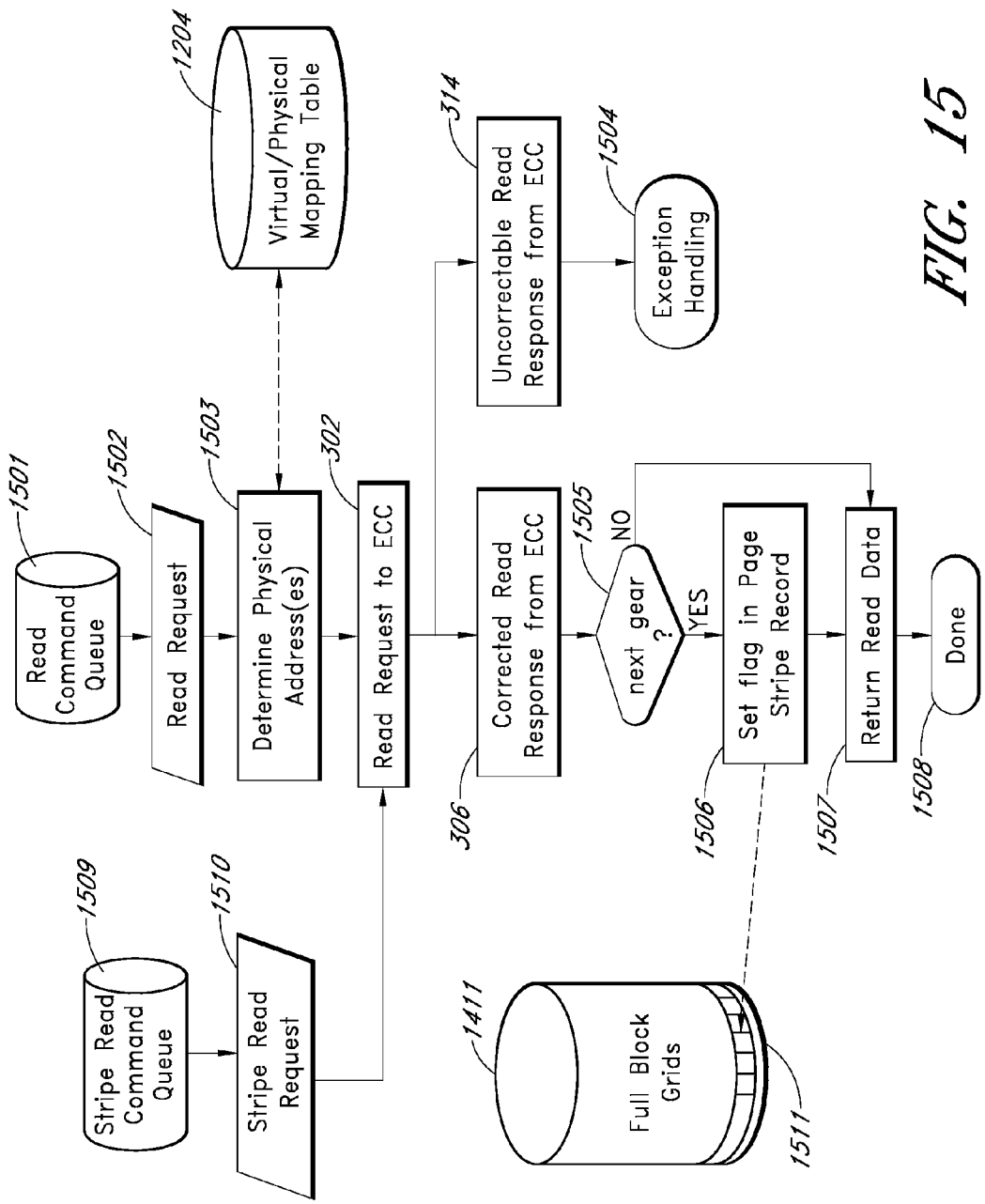
FIG. 15 illustrates a process that a journaling engine can perform to execute read requests.

FIG. 15 illustrates a process that the journaling engine 1308 can perform to execute read requests. Whenever data stored in a flash array is to be read, the host or requesting process supplies the virtual address 1201 for the data it wishes to retrieve. The request enters a read command queue 1501. For each read request 1502 drawn from the queue, in a stage 1503, the journaling engine looks up the corresponding physical address in the logical to physical translation table 1204, and issues commands 302 (FIG. 3) to the ECC encoder/decoder 1310 for the data at the physical address to be read. The output of the read procedure in FIG. 3 is either a corrected read response 306 or an uncorrectable 314. An uncorrectable is a serious failure, and requires exception handling 1504 that is beyond the scope of this disclosure. If a corrected read response 306 is returned, then if the criteria for choosing a higher gear 1505 were met, then a flag is set in the page stripe record 1511 in the list of full page stripes within the list of full page stripes 1411. In a stage 1507, the requested data is returned to the requesting process.

Alternatively, a process can request the read of an entire page stripe, rather than an allocation block. In this case the request enters a queue 1509. Stripe read requests 1510 already have the physical address identified, and proceed immediately to a read request 302.

In one embodiment, the reading of an allocation block (a partial page stripe) may be small enough that random variation in the measured bit error rate is undesirably large, resulting in an excessive level of "false positives" indicating gear changes at stage 1505, when such gear changes are not required. In this embodiment, BER readings of partial page reads can be ignored, or very high thresholds applied such that the false positive rate is sufficiently low, for example 1E-6. In one embodiment, when a block grid is to be erased, every page stripe is read back whether or not the page stripe contains valid data, and the statistics of the entire page stripe be used in determining whether a different gear needs to be selected.

In accordance with another embodiment of the invention, the gear setting of each page stripe within a page grid is forced to be identical, such that the gear setting is based on the performance of the worst page stripe of a page grid.

Figure 16:
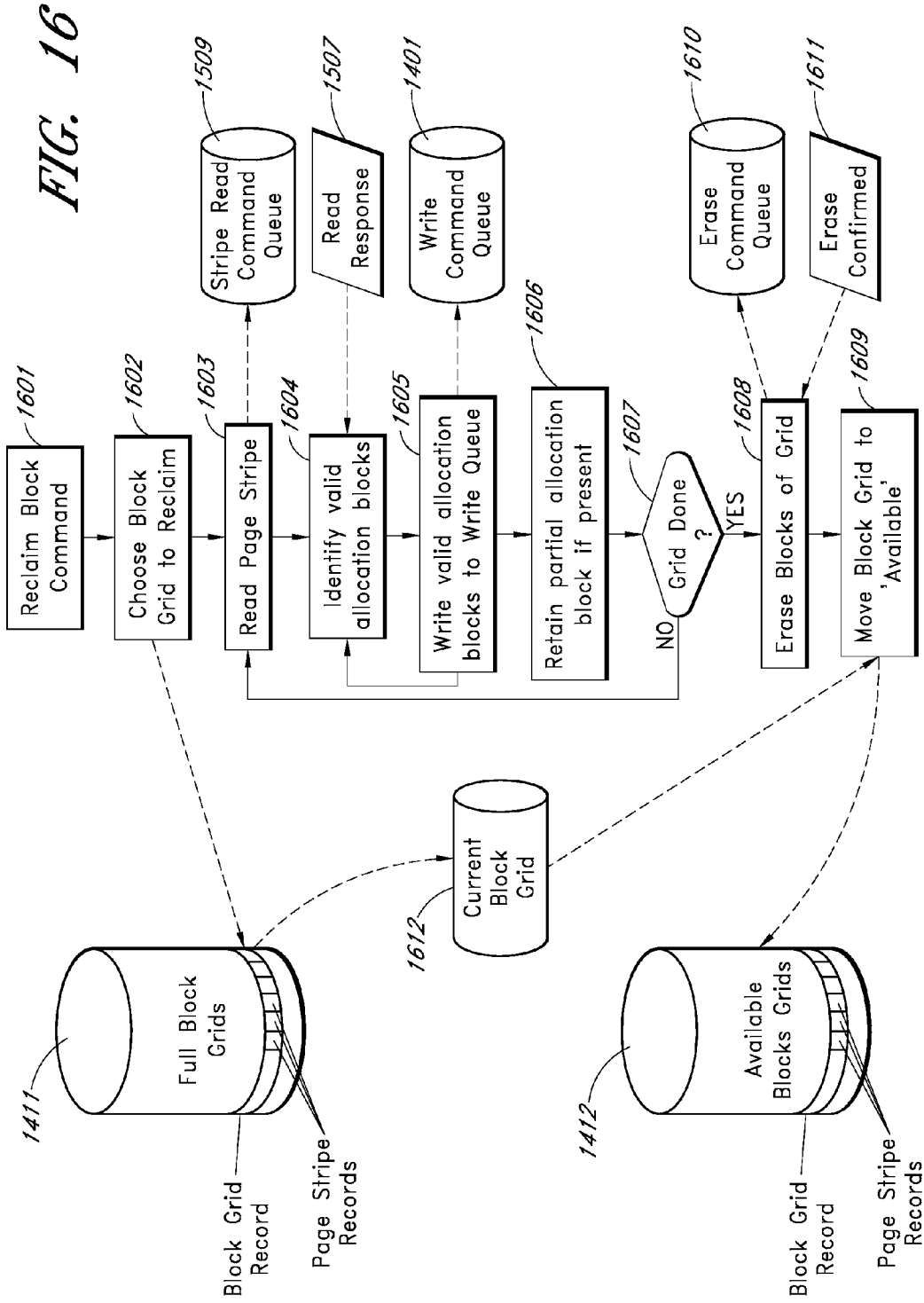
FIG. 16 describes a process that a journaling engine can perform to reclaim regions of flash, making them available for writing In this description, reference is made to the drawings in which like reference numerals indicate identical or functionally similar elements.

FIG. 16 illustrates a process that the journaling engine can perform to reclaim regions of flash, making them available for writing. Reclamation commands 1601 can be part of garbage collection, scrubbing, and the process performed to maintain the list of available block grids 1412, 1206. In a stage 1602, the journaling engine chooses a block grid to reclaim 1612 from a list 1411 of full block grids. In one embodiment, the block grid chosen for reclamation can be the least recently erased block grid. A page stripe of the block grid is read in a stage 1603 by issuing commands to a stripe read command queue 1509. When the corresponding read response 1507 comes back, the valid allocation blocks stored in the stripe are extracted 1604 and written 1605 back to a flash array via the write command queue 1401. Valid allocation blocks that run over into the next page stripe may be only partially present. Such partial valid allocation blocks are retained in a stage 1606, and are returned to the stage 1604 to be added to the beginning of the next page stripe. A stage 1607 evaluates whether all the page stripes in the block grid have been processed. If not, the process returns to the stage 1603 to handle a subsequent page stripe. If so, then in a stage 1608, commands are generated to an erase command queue 1610 to erase the blocks of the block grid. After the erase commands are confirmed 1611, the current block grid 1612 and its page stripes are moved to the list of available block grids 1412.

FIG. 13 illustrates an example of a block diagram for a solid-state drive controller 1300 according to an embodiment of the invention. It will be understood that the various blocks or circuits of the SSD controller 1300 can be rearranged, combined, and/or further divided into smaller blocks. In addition, the SSD controller 1300 can be integrated into a single integrated circuit or can be embodied by multiple integrated circuits. The illustrated SSD controller 1300 includes a storage communications interface 1302, a flash management processor 1304, a random access memory (RAM) 1306, the journaling engine 1308, the ECC encoder/decoder 1310, a flash stripe controller 1312, flash protocol controllers 1314, and flash memory devices 1316a-1316d. The SSD controller 1300 is outside of the flash memory devices 1316 and is not the same as the controllers within the flash memory devices 1316a-1316d. In one embodiment, there are at least 16 different flash memory devices 1316a-1316d in the storage array.

The storage communications interface 1302 handles communication with a host, such as with an input/output circuit of a server. The storage communications interface 1302 can conform to any of a variety of protocols, such as small computer system interface (SCSI), PCI-Express, serial ATA (SATA), external SATA (eSATA), universal serial bus (USB), IEEE-1394 (FireWire), or the like. In one embodiment, the SSD controller communicates with the host at a minimum of 50,000 allocation blocks per second. The flash management processor 1304 can perform firmware functions, translation layer functions, maintains the association between pages and the gear used, initiates initialization bit error rate commands, and the like. The RAM 1306, which can be either SRAM or DRAM, can be used to temporarily hold, that is, cache, data. Other components of the SSD can use the RAM 1306 as needed for scratchpad memory. For example, a page, page stripe, or page grid can be read into the RAM 1306, and the interleaving/de-interleaving and error correction decoding operations can performed on the data transferred to the RAM 1306. The RAM 1306 is typically volatile memory and should accordingly be used only for temporary storage. The journaling engine 1308 performs the journaling or flash translation layer activities. The ECC encoder/decoder 1310 performs encoding and decoding of information data and ECC parity. The flash stripe controller 1312 provides services, takes a slice of data that has been encoded and distributes it among the n lanes and returns an acknowledgement when done. In the illustrated embodiment, 4 lanes 1318a-1318d are shown.

When performing a read, the flash stripe controller 1312 retrieves the corresponding data and reassembles a page of data. Typically, the data buses for the flash memory devices 1316a-1316d are arranged in lanes, such as lanes of 8 bits wide each. For example, these flash memory devices can correspond to flash memory chips or to packaged flash memory devices. Flash protocol controllers 1314 can provide registers for read and/or write caching, can provide address information, can provide timing signals, read and write signals, and the like. In the illustrated embodiment, a controller from the flash protocol controllers 1314 is instantiated for each bus.

In one embodiment, the SSD controller 1300 is implemented in an integrated circuit, such as by an application specific integrated circuit (ASIC), a field programmable gate array (FPGA), which can include firmware or software instructions stored in a tangible, non-transitory computer-readable medium executed by a processor, or in a block of hardware shared by several decoders. In particular, portions that are not expected to be used frequently, such as tertiary parity recovery, may advantageously be implemented in firmware or software, or in a block of hardware shared by several decoders. In addition, it should be noted that the disclosed techniques are applicable to use "in the field," such as in a server, and accordingly differ from techniques used by an engineer during a design phase or during manufacturing and test. Further, it should be noted that an integrated circuit for the SSD controller 1300 is separate from the flash memory devices 1316a-1316d.

Overview of a Decoding Process

The following is an overview of a decoding process according to one embodiment of the invention.

Partial Page Read Response
1. Perform Primary Decode on received codewords
   a. Decode and perform corrections
2. For each Primary codeword, check whether it can be quick-released.
   a. A codeword may be quick-released if:
      i. The codeword is correctable, and
      ii. The number of bits corrected for that codeword is less than or equal to Qp for the current gear, and
      iii. The codeword is not all-zeroes after correction.
   b. If all codewords are quick-released:
      i. Report a successful partial read response
   c. If not all codewords are quick-released
      i. Report that the read is being reissued
      ii. Reissue a page stripe read.
3. Report Result Page Stripe Read Response
1. Perform Primary and PoSP Decode on received codewords
   a. Decode and perform corrections
   b. Write into Secondary codeword storage
   c. Do not Release until Fingerprint has been compared. In practice, this currently means no release during the first pass.
2. Check for Page Kill. (before, during, or after step 1 as convenient)
   a. Compare Fingerprint for each page against Expected Fingerprints.
   b. If any Fingerprint has more than Fingerprint_Tolerance (default=5) errors, end with decode_status=failed.
      i. If Tertiary is disabled, Fingerprint_Tolerance should be set to maximum, effectively disabling this check.
3. Iterate
   a. Secondary Decode
   b. Primary and PoSP Decode
      i. A codeword may be released if:
         1. The secondary passed with zero corrections, and
         2. The codeword is correctable, and
         3. The number of bits corrected for that codeword is less than or equal to Qp for the current gear
   c. If all secondary codewords decoded correctly with zero errors, and all Primary codewords were released
      i. End iteration with Decode_status=successful
   d. (Optional, controlled by flash_initialization_mode bit) If, after primary decode, at least two pages were either all-ones or all-zeroes (including PoSP/PoTP), then end iteration with Decode status=erased_page. Do not proceed to Tertiary.
   e. (Optional) If there were uncorrectables (not including PoSP or PoTP), but no corrections in Primary or Secondary, we are stuck.
      i. End iteration with decode_status=failed
   f. (Optional) If all primary (not including PoSP) codewords correct with zero errors, and there are no Secondary corrections, but up to one secondary uncorrectable is seen
      i. End iteration with decode_status=successful
   g. If max_iterations is reached,
      i. If all Primary codewords (not including PoSP or PoTP) passed, end with decode_Status=successful
      ii. End iteration with decode_status=failed.
4. Report Result
   a. If Decode=successful, return a success
      i. Set next_gear if
         1. The total # of bits corrected exceeds stripe_corr_thresh for the current page, or
         2. stripe_iteration_thresh (default=3) or more iterations were required.
   b. If Decode=erased_page then return Uncorrectable, ideally with an erased_page flag set. Do not proceed to teritiary.
   c. If Decode=failed, or Fingerprint Tolerance exceeded, reissue page grid. Completion message=reissue.

Page Grid Read Response
1. Perform Page Stripe Decode on each Page, with the following modifications:
   a. Do not reissue (we already did)
   b. For Last Page Stripe, PoTP should be performed on each Primary pass.
   c. Store the # of Fingerprint errors for each page (to find the largest one later)
2. Perform Tertiary Iteration
   a. Tertiary Decode (no erasures)
   b. Secondary Decode
   c. Primary/PoSP/PoTP Decode
      i. A codeword may be released if:
         1. The Tertiary had no uncorrectables, and
         2. The release conditions for Page Stripe were satisfied.
   d. If no uncorrectable codewords in Tertiary and all Primary codewords (not including PoSP or PoTP) were released
      i. Move to Report Phase with Decode=Success
   e. Optional; added to match RTL): If the Secondary or Primary in (b,c) made changes to the page stripe of interest
      i. Secondary decode on stripe of interest
      ii. Primary decode on stripe of interest
      iii. If bit changes made and NOT max_iterations reached, return to (i).
   f. If all secondary codewords decoded successfully without corrections, and all Primary codewords (ignoring PoTP) decoded without corrections,
      i. Move to Report Phase with Decode=Success
   g. (Optional) If there were uncorrectables in T, S, or P (not including PoSP or PoTP), but no corrections in T, S, or P, we are stuck.
      i. End iteration with decode_status=failed
   h. If max_iterations is reached
      i. If no uncorrectable codewords in Tertiary or Primary codewords (not including PoSP or PoTP), end with decode_status=Success
      ii. End iteration with decode_status=failed.
   i. Return to top of "Perform Tertiary Iteration"
3. Erase the killed Page
   a. If the process has arrived at this point, then the Tertiary iterations have failed. Zero or one erasures have been done.

b. Select a page to erase
  i. If at least one page has more than Fingerprint_Tolerance errors in its fingerprint, then the one with the most errors in the fingerprint should be erased
  ii. If no page has more than Fingerprint Tolerance, or in case of a tie, then the page with the highest number of Primary Uncorrectables, based on the most recent Primary decode of that page, should be erased
    1. Primary Uncorrectables include Pri, PoTP, and (optionally, at the convenience of the RTL) PoSP.
    2. For this purpose (only) primary uncorrectables includes primary codewords that were all-zero after correction.
  iii. In case of a tie, the one with the lowest index can be arbitrarily picked.
  iv. Implementation note: The RTL can arbitrarily choose the one that arrived back first.
c. If Erasures_done<2
  i. Increment Erasures_done
  ii. Erase the page with the most fingerprint errors
  iii. Go back to top of "perform tertiary iteration"
d. Else end with status=failed.
4. Report Result
a. If Decode=successful, return a success and transfer requested data.
b. If Decode=failed, report permanent failure, with a page kill flag if appropriate, to FSC.
c. Set next_gear flag
  i. If in this state, primary/secondary decoding has failed, so the next_gear flag should be set on the original page stripe.

Extensions and Variations

The choice of page stripes being four lanes wide is a balanced and convenient choice. However, page stripes of other widths for example, as narrow as one page or as wide as 16 pages, are also applicable. Arranging the flash pages on four parallel lanes provides good latency for partial reads, and efficient sharing of the flash interface. However, the principles and advantages described herein are still applicable if the page stripe is distributed over many dice on the same lane, on a random selection of four lanes within a large multi-lane access system, or any combination thereof.

Reading a minimum amount from the flash memory necessary to decode the user-requested part of the page stripe, and doing a follow-up read of the entire stripe when required is one approach. Another approach that also works is to transfer the entire page stripe during the initial read, starting with that initial minimal set, but continuing on to read the remainder rest of the page stripe, and wrapping around to the beginning of the stripe, and continuing on until the entire stripe is available. In parallel, the initial ECC decode operation is performed. If the quick-release ECC is successful, the transfer of the remaining bytes of the stripe can be aborted. If the quick-release is not successful, then the decoder waits until the rest of the stripe is available, and completes the decode operation.

The principles and advantages disclosed herein are applicable to flash drives that emulate hard disk drives. Various forms of flash drives include, but are not limited to: solid-state drives (whether SCSI, SATA, or PCI attached), solid-state caching or tiering devices, enterprise flash drives, hybrid drives (hybrids of hard disk drives and flash drives), flash memory cards, flash memory sticks, thumb drives, backup drives, or the like. For example, various aspects can be incorporated into a solid-state drive controller chip. Alternatively, various aspects can be incorporated with the host, such as, by being incorporated into the same motherboard with other components of the host. A flash translation layer permits a flash drive to emulate a hard disk drive by transferring data to and from the host in allocation blocks. The host can use any of many different file systems, such as, but not limited to: New Technology File System (NTFS), File Allocation Table (FAT), FAT32, High Performance File System (HPFS), Ext2, Ext3, Ext4, Hierarchical File System (HFS), HFS Plus (HFS+), or the like. The host or host computer can be, for example, but not limited to, an enterprise server, a web server, a mobile base station, a host bus adapter, an IP router, a home server, a file server, a workstation, a data logger, a digital video recorder, a smart TV, a media center, a jukebox, a smart phone, a mobile phone, a personal digital assistant, a personal computer, a laptop computer, a tablet computer, a video gaming console, an interactive kiosk, a digital camera, a digital video camera, a digital music player, an ebook reader, or the like.

Various embodiments have been described above. Although described with reference to these specific embodiments, the descriptions are intended to be illustrative and are not intended to be limiting. Various modifications and applications may occur to those skilled in the art.

APPENDIX A

Incorporation by Reference of Commonly Owned Applications

The following patent applications, commonly owned and filed on the same day as the present application, are hereby incorporated herein in their entirety by reference thereto:

| Title | application No. |
| --- | --- |
| SYSTEMS AND METHODS FOR ADAPTIVELY SELECTING ERROR CORRECTION CODING SCHEMES IN A FLASH DRIVE | 13/477,600 |
| SYSTEMS AND METHODS FOR INITIALIZING REGIONS OF A FLASH DRIVE HAVING DIVERSE ERROR CORRECTION CODING (ECC) SCHEMES | 13/477,633 |
| SYSTEMS AND METHODS FOR ADAPTIVELY SELECTING AMONG DIFFERENT ERROR CORRECTION CODING SCHEMES IN A FLASH DRIVE | 13/477,629 |
| SYSTEMS AND METHODS FOR REDUNDANTLY STORING ERROR CORRECTION CODES IN A FLASH DRIVE | 13/477,598 |
| SYSTEMS AND METHODS FOR LOW LATENCY, HIGH RELIABILITY ERROR CORRECTION IN A FLASH DRIVE | 13/477,595 |
| SYSTEMS AND METHODS FOR TRANSPARENTLY VARYING ERROR CORRECTION CODE STRENGTH IN A FLASH DRIVE | 13/477,568 |
| SYSTEMS AND METHODS FOR RECLAIMING FLASH BLOCKS OF A FLASH DRIVE | 13/477,845 |
| SYSTEMS AND METHODS FOR REDUNDANTLY STORING DATA IN A FLASH DRIVE SUCH THAT A FAILED PAGE CAN BE TOLERATED | 13/477,635 |

| Title | application No. |
|---|---|
| SYSTEMS AND METHODS FOR RECOVERING DATA FROM FAILED PORTIONS OF A FLASH DRIVE | 13/477,601 |

What is claimed is:

1. A method of reading data from an array of flash memory devices, the method comprising:
 receiving a request for data stored in the flash array, the requested data being identified by a virtual address;
 looking up the following, which are associated with the virtual address:
  a physical address or addresses of one or more page stripes;
  a starting location for the data within the first page stripe of the one or more page stripes of the flash array; and
  one or more gear settings for the one or more page stripes, wherein the gear settings are indicative of a strength of error correction assigned to a page stripe of the one or more page stripes;
 requesting one or more portions of the payload of the one or more page stripes associated with the virtual address, and providing the one or more gear settings of the one or more page stripes along with the request;
 receiving, from an ECC decoder, corrected retrieved portions of the one or more page stripes, and an indication of whether each portion was successfully corrected; and
 if all portions of the requested data were successfully corrected by the ECC decoder, reassembling the corrected portions into the requested data and returning the same;
 wherein the method is performed by an integrated circuit.

2. The method of claim 1, further comprising:
 receiving an indication from the ECC decoder as to whether or not correction for the corrected retrieved data from the flash array has met criteria indicating that a different gear should be selected for the one or more page stripes; and
 storing the indication so that when the one or more page stripes are erased and made available for writing, a different gear and corresponding different payload size is used;
 wherein the indication is reset after the gear setting has been changed.

3. The method of claim 1, wherein the one or more portions of the payload comprises a first portion from a first page stripe and a second portion from a second page stripe.

4. An apparatus comprising:
 a first circuit configured to receive a request for data stored in a flash array, the requested data being identified by a virtual address;
 a second circuit configured to look up the following, which are associated with the virtual address:
  a physical address or addresses of one or more page stripes;
  a starting location for the data within the first page stripe of the one or more page stripes of the flash array; and
  one or more gear settings for the one or more page stripes, wherein the gear settings are indicative of a strength of error correction assigned to a page stripe of the one or more page stripes;
 the second circuit further configured to request one or more portions of the payload of the one or more page stripes associated with the virtual address, and providing the one or more gear settings of the one or more page stripes along with the request;
 the second circuit further configured to receive, from an ECC decoder, corrected retrieved portions of the one or more page stripes, and an indication of whether each portion was successfully corrected; and
 if all portions of the requested data were successfully corrected by the ECC decoder, the second circuit is further configured to reassemble the corrected portions into the requested data and return the same.

5. The apparatus of claim 4, wherein the second circuit is further configured to:
 receive an indication from the ECC decoder as to whether or not correction for the corrected retrieved data from the flash array has met criteria indicating that a different gear should be selected for the one or more page stripes; and
 store the indication so that when the one or more page stripes are erased and made available for writing, a different gear and corresponding different payload size is used;
 wherein the second circuit is further configured to reset the indication after the gear setting has been changed.

6. The apparatus of claim 4, wherein the one or more portions of the payload comprises a first portion from a first page stripe and a second portion from a second page stripe.

7. An apparatus for reading data from an array of flash memory devices, the apparatus comprising:
 a means for receiving a request for data stored in a flash array, the requested data being identified by a virtual address;
 a means for looking up the following, which are associated with the virtual address:
  a physical address or addresses of one or more page stripes;
  a starting location for the data within the first page stripe of the one or more page stripes of the flash array; and
  one or more gear settings for the one or more page stripes, wherein the gear settings are indicative of a strength of error correction assigned to a page stripe of the one or more page stripes;
 a means for requesting one or more portions of the payload of the one or more page stripes associated with the virtual address;
 a means for providing the one or more gear settings of the one or more page stripes along with the request;
 a means for receiving, from an ECC decoder, corrected retrieved portions of the one or more page stripes, and an indication of whether each portion was successfully corrected; and
 a means for reassembling;
 wherein if all portions of the requested data were successfully corrected by the ECC decoder, the reassembling means further reassembling the corrected portions into the requested data and returning the same.

8. The apparatus of claim 7, further comprising:
 a means for receiving an indication from the ECC decoder as to whether or not correction for the corrected retrieved data from the flash array has met criteria indicating that a different gear should be selected for the one or more page stripes;
 a means for storing the indication so that when the one or more page stripes are erased and made available for writing, a different gear and corresponding different payload size is used; and a means for resetting the indication after the gear setting has been changed.

9. The apparatus of claim 7, wherein the one or more portions of the payload comprises a first portion from a first page stripe and a second portion from a second page stripe.

* * * * *